(12) United States Patent
Takiguchi et al.

(10) Patent No.: US 11,394,174 B2
(45) Date of Patent: Jul. 19, 2022

(54) SEMICONDUCTOR LIGHT-EMITTING ELEMENT AND METHOD FOR DESIGNING PHASE MODULATION LAYER

(71) Applicant: HAMAMATSU PHOTONICS K.K., Hamamatsu (JP)

(72) Inventors: Yuu Takiguchi, Hamamatsu (JP); Kazuyoshi Hirose, Hamamatsu (JP); Yoshitaka Kurosaka, Hamamatsu (JP); Takahiro Sugiyama, Hamamatsu (JP); Yoshiro Nomoto, Hamamatsu (JP); Soh Uenoyama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 380 days.

(21) Appl. No.: 16/699,803

(22) Filed: Dec. 2, 2019

(65) Prior Publication Data
US 2020/0106240 A1    Apr. 2, 2020

Related U.S. Application Data

(63) Continuation-in-part of application No. PCT/JP2018/020211, filed on May 25, 2018.

(30) Foreign Application Priority Data

Jun. 2, 2017   (JP) .............................. JP2017-110203

(51) Int. Cl.
*H01S 5/183*    (2006.01)
*H01S 5/042*    (2006.01)
(Continued)

(52) U.S. Cl.
CPC .............. *H01S 5/183* (2013.01); *G06F 17/14* (2013.01); *H01S 5/0421* (2013.01);
(Continued)

(58) Field of Classification Search
CPC .... H01S 5/183; H01S 5/0421; H01S 5/04253; H01S 5/04254; H01S 5/04256; G06F 17/14
See application file for complete search history.

(56) References Cited

U.S. PATENT DOCUMENTS

2010/0103969 A1    4/2010   Aalto
2013/0343415 A1   12/2013   Hori et al.
(Continued)

FOREIGN PATENT DOCUMENTS

CN    106233107 A    12/2016
JP    2005-037453 A   2/2005
(Continued)

OTHER PUBLICATIONS

Machine Translation of WO2016148075 (Year: 2016).*
(Continued)

*Primary Examiner* — Yuanda Zhang
(74) *Attorney, Agent, or Firm* — Faegre Drinker Biddle & Reath LLP

(57) ABSTRACT

The present embodiment relates to a semiconductor light-emitting element or the like including a structure for suppressing deterioration in the quality of an optical image caused by an electrode blocking a part of light outputted from a phase modulation layer. The semiconductor light-emitting element includes a phase modulation layer having a basic layer and a plurality of modified refractive index regions, and the phase modulation layer includes a first region at least partially overlapping the electrode along a lamination direction and a second region other than the first region. Among the plurality of modified refractive index regions, only one or more modified refractive index regions in the second region are disposed so as to contribute to formation of an optical image.

12 Claims, 38 Drawing Sheets

(51) Int. Cl.
  *G06F 17/14* (2006.01)
  *H01S 5/343* (2006.01)
(52) U.S. Cl.
  CPC ...... *H01S 5/04253* (2019.08); *H01S 5/04254* (2019.08); *H01S 5/04256* (2019.08); *H01S 5/343* (2013.01)

(56) References Cited

U.S. PATENT DOCUMENTS

2016/0020580 A1* 1/2016 Takiguchi .................. H01S 5/11
  372/44.011
2016/0036201 A1 2/2016 Takiguchi et al.

FOREIGN PATENT DOCUMENTS

| JP | 2006-156901 A | 6/2006 |
| JP | 2008-070186 A | 3/2008 |
| JP | 2014-236127 A | 12/2014 |
| WO | WO-2014/136955 A1 | 9/2014 |
| WO | WO-2014/136962 A1 | 9/2014 |
| WO | WO-2015/163149 A1 | 10/2015 |
| WO | WO-2016/031966 A1 | 3/2016 |
| WO | WO-2016/148075 A1 | 9/2016 |

OTHER PUBLICATIONS

Kurosaka, Yoshitaka et al., "Phase-modulating lasers toward on-chip integration," Scientific Reports, Jul. 26, 2016, vol. 6, 30138, pp. 1-7.
Kurosaka, Yoshitaka et al., "Effects of non-lasing band in two-dimensional photonic-crystal lasers clarified using omnidirectional band structure," Optics Express, Sep. 2012, vol. 20, No. 19, p. 21773-p. 21783.
Lee, Wai Hon, "Sampled Fourier Transform Hologram Generated by Computer," Applied Optics, Mar. 1970, vol. 9, No. 3, pp. 639-644.
International Preliminary Report on Patentability dated Dec. 12, 2019 for PCT/JP2018/020211.

\* cited by examiner

*Fig.10A*

| A2 | A1 |
|---|---|
| A3 | A4 |

ORIGINAL IMAGE

*Fig.10B*

| A4<br>A2 ROTATION | A3<br>A1 ROTATION |
|---|---|
| A1<br>A3 ROTATION | A2<br>A4 ROTATION |

OBTAINED BEAM PATTERN

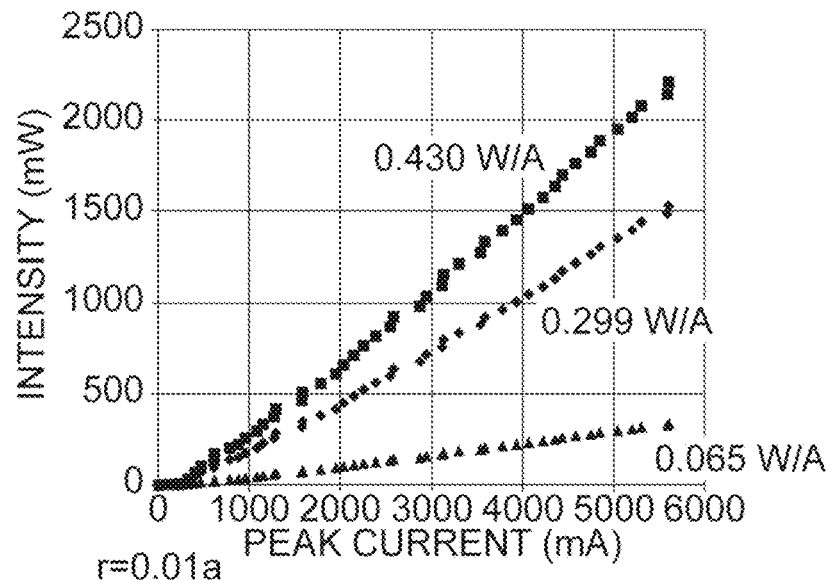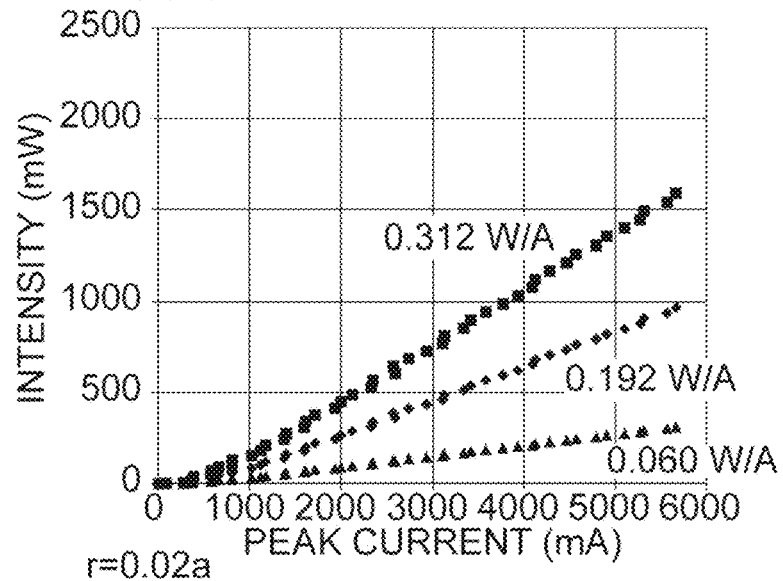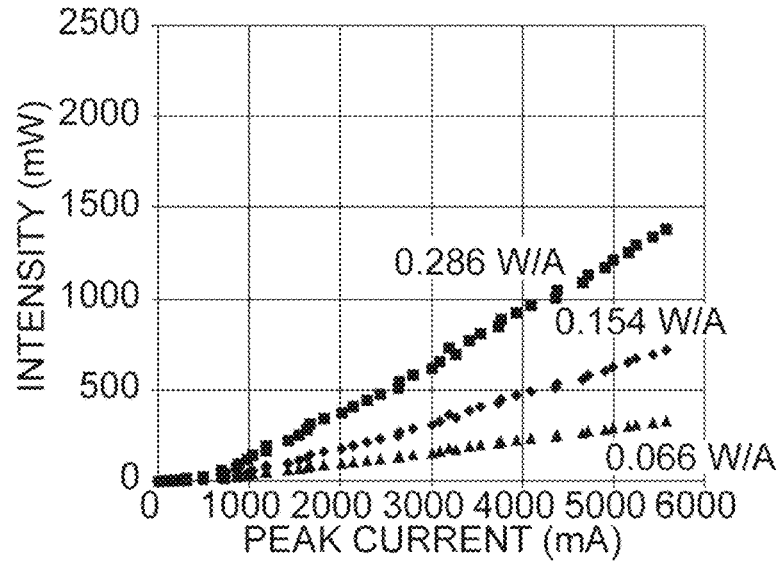

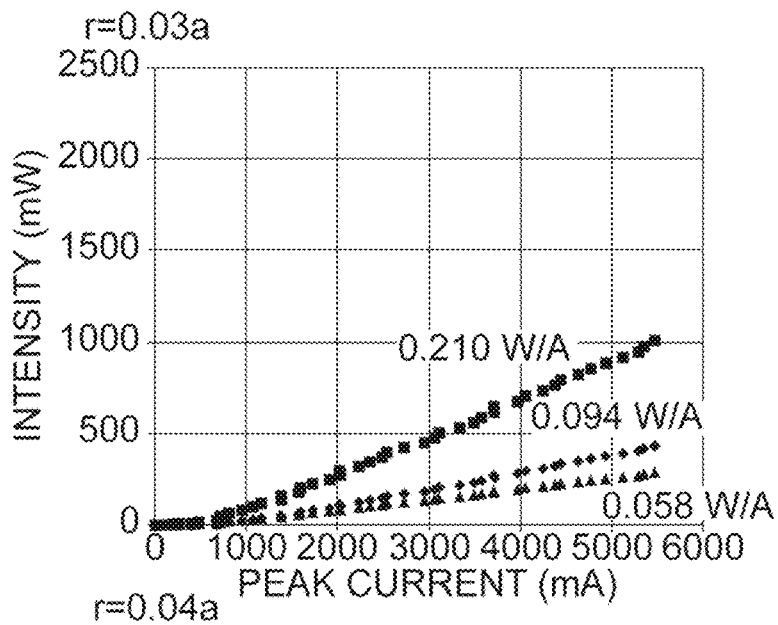
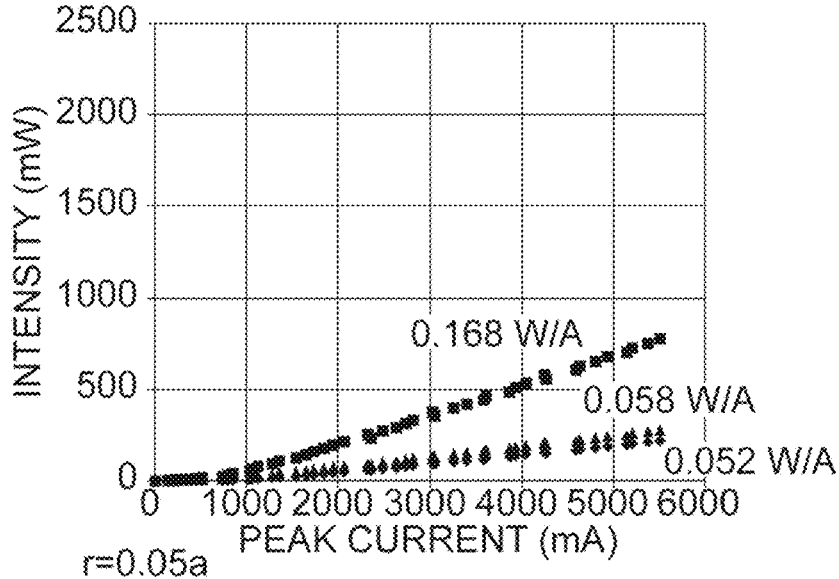
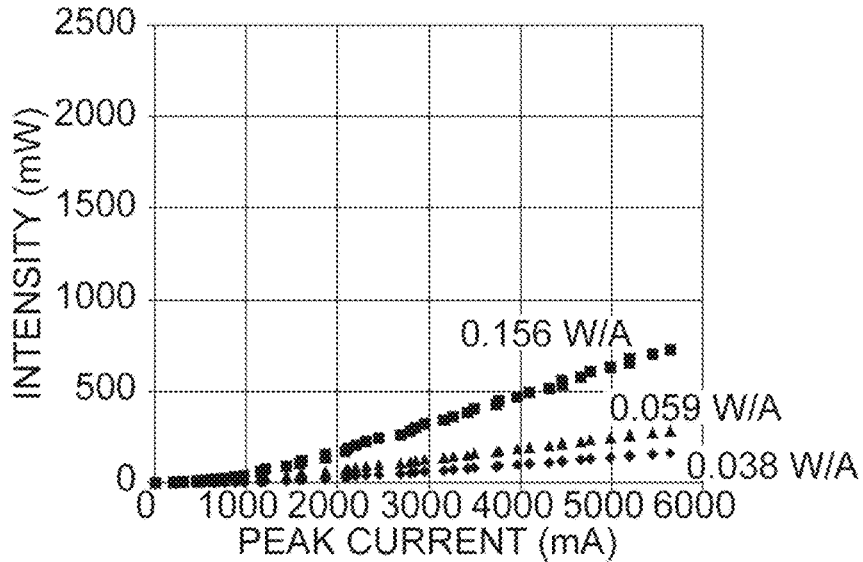

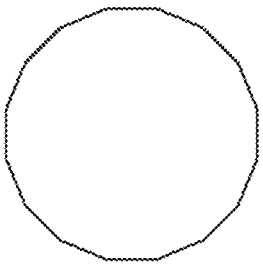
Fig. 18A  Fig. 18B
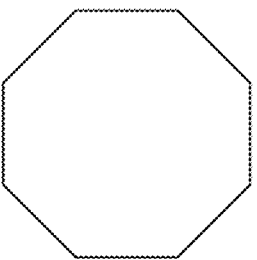
Fig. 18C
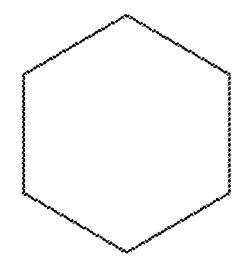
Fig. 18D  Fig. 18E
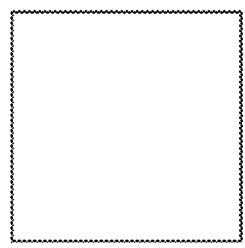
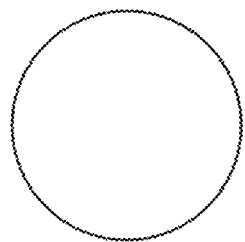
Fig. 18F
Fig. 18G
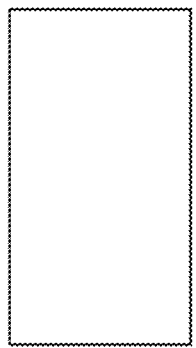

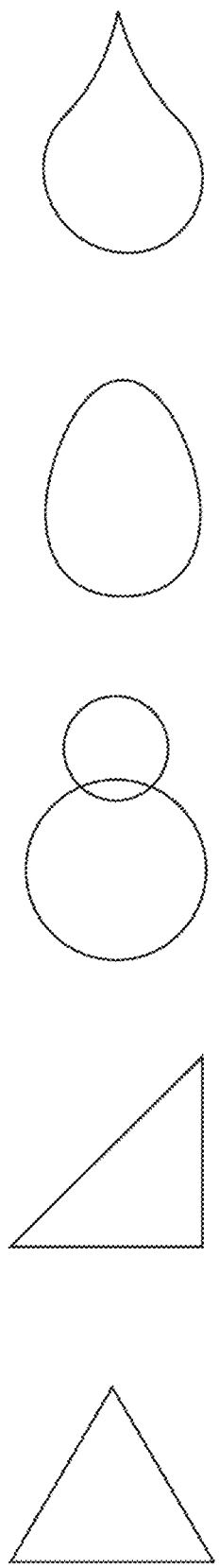
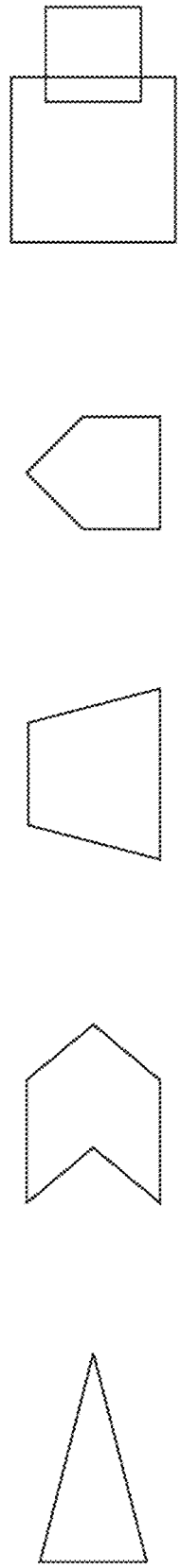
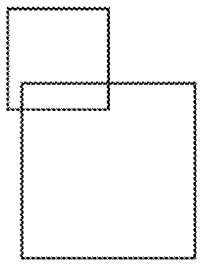
Fig.19A, Fig.19B, Fig.19C, Fig.19D, Fig.19E, Fig.19F, Fig.19G, Fig.19H, Fig.19I, Fig.19J, Fig.19K

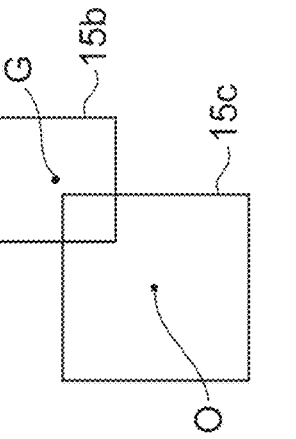
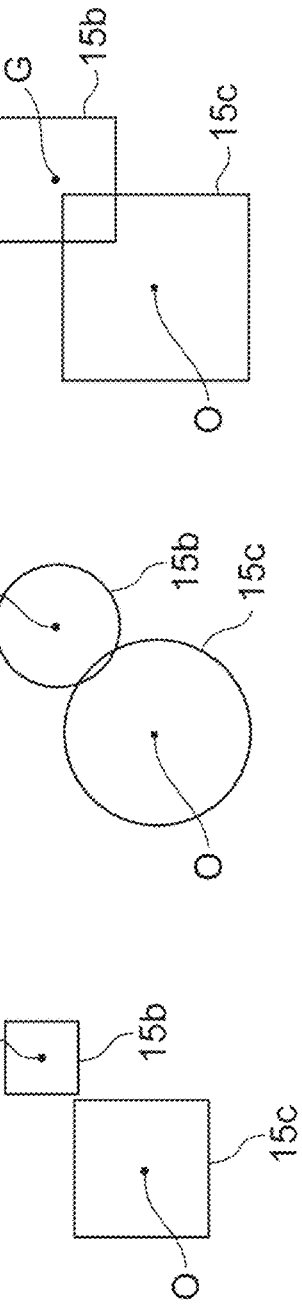
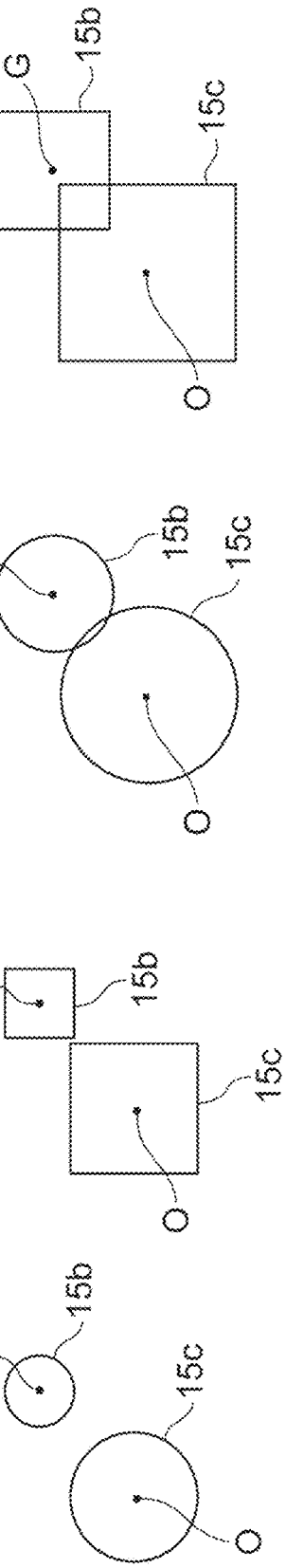
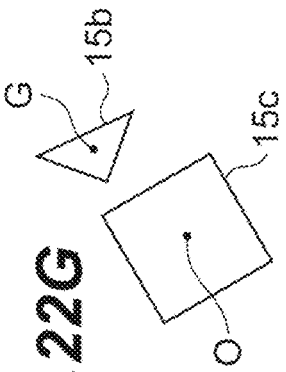
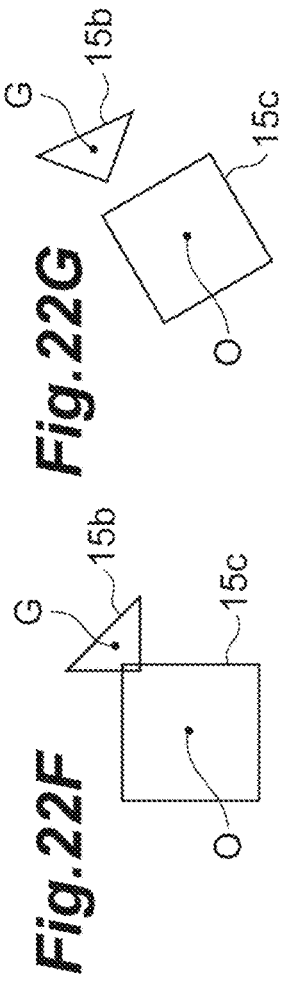
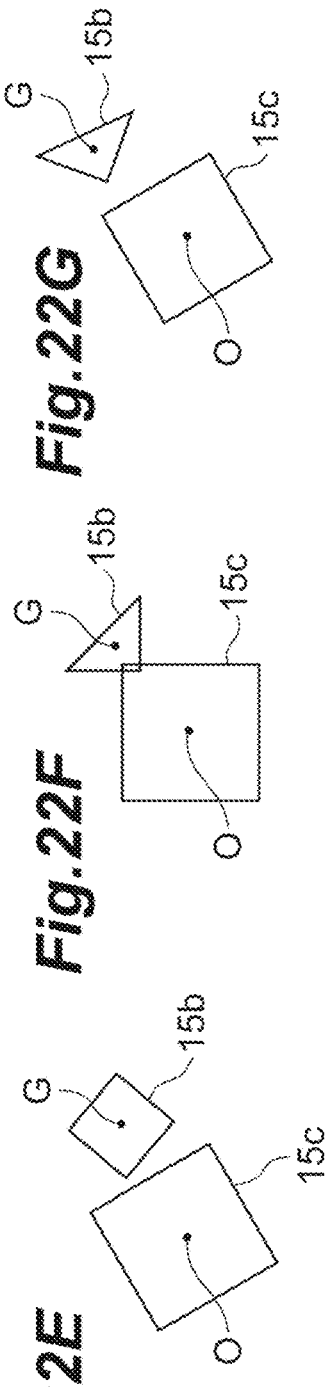
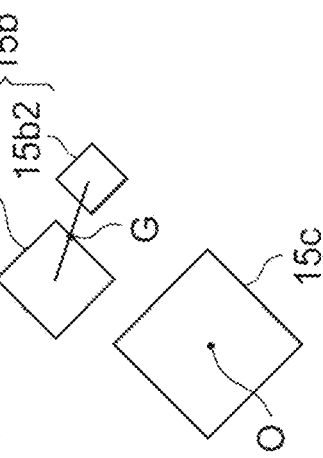
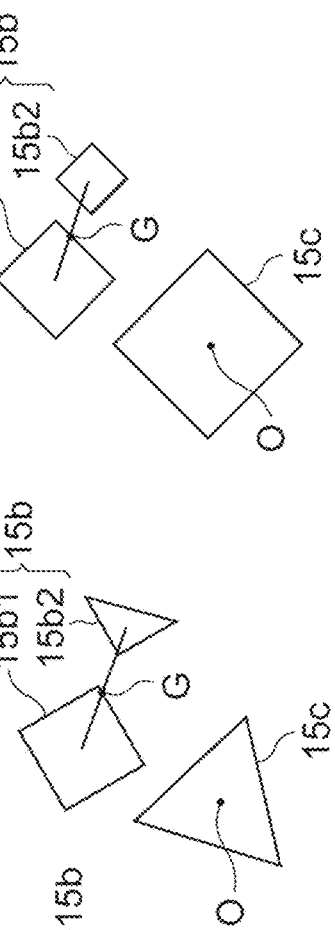
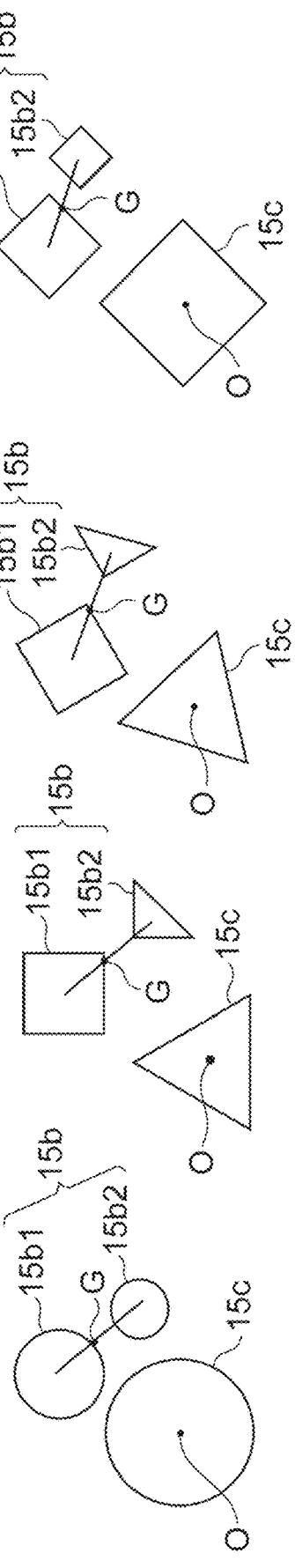

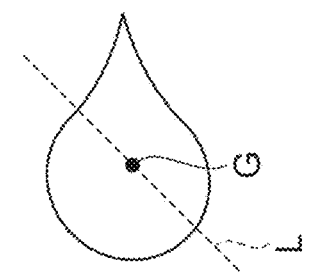
Fig.28A
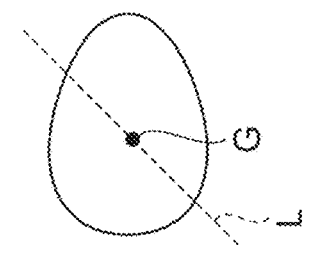
Fig.28B
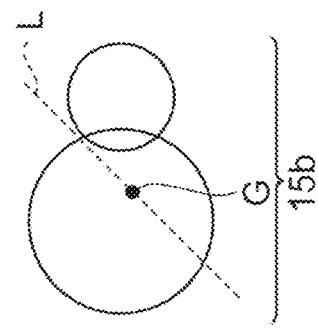
Fig.28C
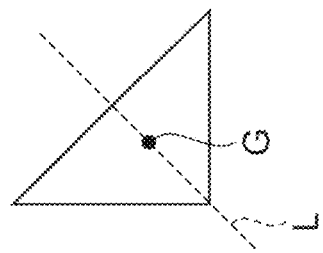
Fig.28D
Fig.28E
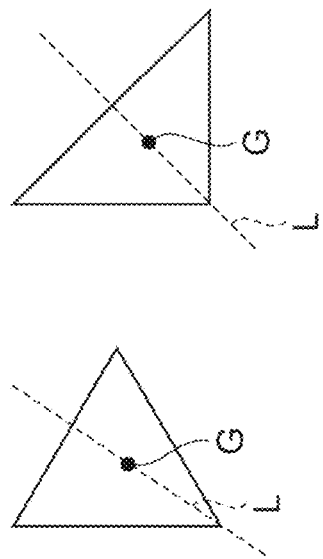
Fig.28F
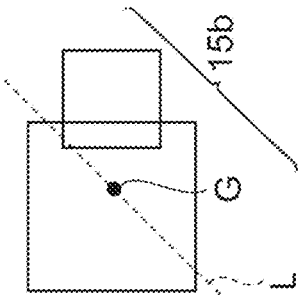
Fig.28G
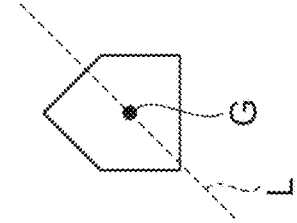
Fig.28H
Fig.28I
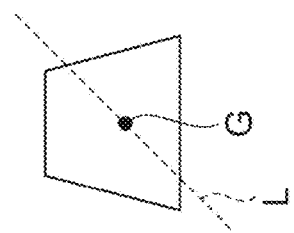
Fig.28J
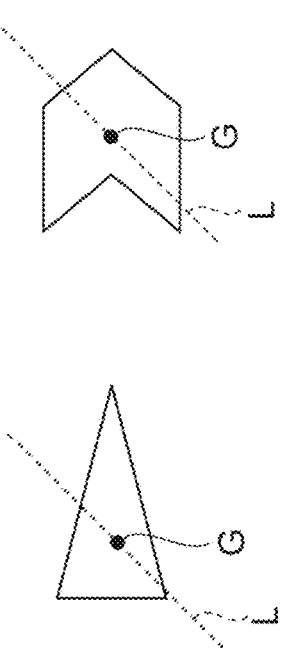
Fig.28K
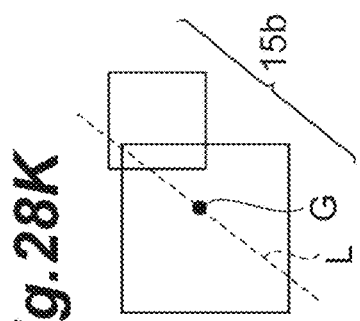

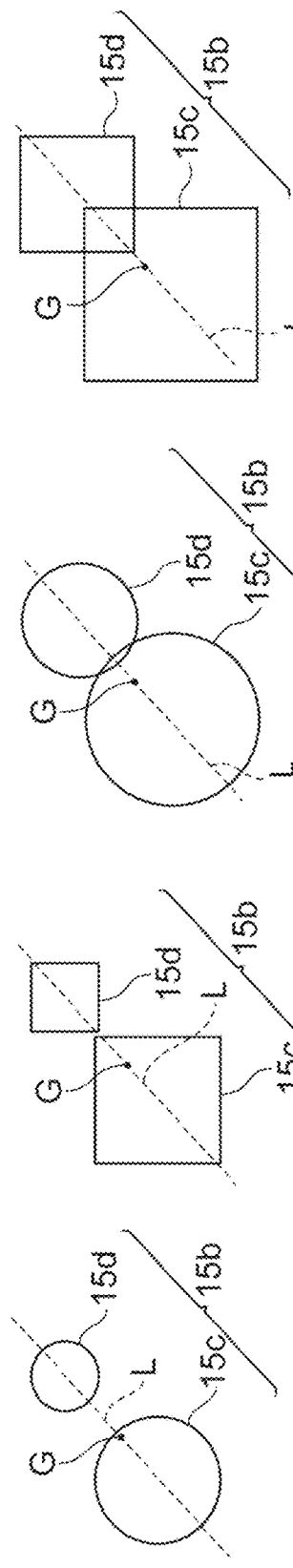

ND METHOD FOR DESIGNING
SEMICONDUCTOR LIGHT-EMITTING ELEMENT AND METHOD FOR DESIGNING PHASE MODULATION LAYER

CROSS-REFERENCE TO RELATED APPLICATIONS

This application is a Continuation-In-Part application of PCT/JP2018/020211 claiming the benefit of priority of the Japanese Patent Application No. 2017-110203 filed on Jun. 2, 2017, the entire contents of which are incorporated herein by reference.

TECHNICAL FIELD

The present invention relates to a semiconductor light-emitting element and a method for designing a phase modulation layer configuring a part of the semiconductor light-emitting element.

BACKGROUND ART

A semiconductor light-emitting element described in Patent Document 1 includes an active layer, a pair of cladding layers sandwiching the active layer, and a phase modulation layer optically coupled to the active layer. The phase modulation layer includes a basic layer having a predetermined refractive index and a plurality of modified refractive index regions having refractive indexes different from the refractive index of the basic layer. In a state where a square lattice is set on a setting surface of the phase modulation layer perpendicular to a lamination direction (it may be a surface to which a part of each of the plurality of modified refractive index regions is exposed), a position of a gravity center of each of the modified refractive index regions is arranged away from a corresponding lattice point of the square lattice, and a vector from the corresponding lattice point toward the gravity center has a rotation angle according to a predetermined beam pattern around the lattice point.

Also, a semiconductor light-emitting element described in Patent Document 2 includes an active layer, a pair of cladding layers sandwiching the active layer, and a phase modulation layer optically coupled to the active layer. The phase modulation layer includes a basic layer having a predetermined refractive index and a plurality of modified refractive index regions having refractive indexes different from the refractive index of the basic layer. In a state where a square lattice is set on a setting surface of the phase modulation layer perpendicular to a lamination direction, a position of a gravity center of each of the modified refractive index regions (main holes) is arranged so as to be matched with a corresponding lattice point of the square lattice. Further, an auxiliary modified refractive index region (sub-hole) is provided around each modified refractive index region, and light of a predetermined beam pattern is output.

CITATION LIST

Patent Literature

Patent Document 1: WO 2016/148075
Patent Document 2: WO 2014/136962

Non Patent Literature

Non Patent Document 1: Y. Kurosaka et al., "Effects of non-lasing band in two-dimensional photonic-crystal lasers clarified using omnidirectional band structure", Opt. Express 20, 21773-21783 (2012)

SUMMARY OF INVENTION

Technical Problem

As a result of examining the conventional semiconductor light-emitting element, the inventors have found the following problems.

That is, as described above, conventionally, semiconductor light-emitting elements that output an arbitrary optical image by controlling a phase spectrum and an intensity spectrum of light outputted from a plurality of light-emitting points arranged two-dimensionally have been studied. As one of structures of such a semiconductor light-emitting element, there is a structure in which a lower cladding layer, an active layer, and an upper cladding layer are sequentially laminated on a semiconductor substrate, and a phase modulation layer is provided between the lower cladding layer and the active layer or between the active layer and the upper cladding layer. The phase modulation layer has a basic layer having a predetermined refractive index and a plurality of modified refractive index regions having refractive indexes different from the refractive index of the basic layer. In a state where a virtual square lattice is set on a setting surface perpendicular to a thickness direction (lamination direction of the phase modulation layer, a position of a gravity center of each of the modified refractive index regions is shifted from a lattice point position of the virtual square lattice according to an optical image. The semiconductor light-emitting element is called a static-integrable phase modulating (S-iPM) laser, and outputs an optical image of an arbitrary shape in a direction tilted with respect to a direction perpendicular to a main surface of the semiconductor substrate (a normal direction of the main surface).

In the semiconductor light-emitting element described above, the position of the gravity center of each of the modified refractive index regions is calculated using a repetitive operation or the like based on a desired optical image. However, a part of the region of the phase modulation layer overlaps an electrode existing in a light output direction (in the case of a back surface output type, an electrode provided on a back surface of the semiconductor substrate, and in the case of a surface output type, an electrode provided on the upper cladding layer). A light component outputted from the region overlapping the electrode when viewed along the light output direction as described above is shielded by the electrode. Since the shielded light component cannot be outputted to the outside of the semiconductor light-emitting element, it cannot contribute to the formation of the optical image. Therefore, in the obtained optical image, information regarding the region is lost, and the quality of the optical image is deteriorated.

The present invention has been made to solve the above-described problems, and an object thereof is to provide a semiconductor light-emitting element and a method for designing a phase modulation layer capable of suppressing deterioration in the quality of an optical image caused by an electrode blocking a part of light outputted from the phase modulation layer.

Solution to Problem

A semiconductor light-emitting element according to the present embodiment is a semiconductor light-emitting element that includes a semiconductor substrate having a main surface and a back surface facing the main surface and outputs an optical image in a direction tilted with respect to a normal direction of the main surface. The optical image is outputted from the main surface side or the back surface side of the semiconductor substrate. Further, in order to solve the above-described problems, the semiconductor light-emitting element includes an active layer provided on the main surface of the semiconductor substrate, a cladding layer provided on the active layer, a contact layer provided on the cladding layer, a phase modulation layer, and an electrode. The phase modulation layer is provided between the semiconductor substrate and the active layer or between the active layer and the cladding layer. Further, in a configuration in which the optical image is outputted from the main surface side of the semiconductor substrate, the electrode is provided on the contact layer so that the optical image is outputted to the outside of the semiconductor light-emitting element from the side where the contact layer is located with respect to the active layer. On the other hand, in a configuration in which the optical image is outputted from the back surface side of the semiconductor substrate, the electrode is provided on the back surface of the semiconductor substrate so that the optical image is outputted to the outside of the semiconductor light-emitting element from the side where the back surface of the semiconductor substrate is located with respect to the active layer.

The phase modulation layer has a basic layer having a predetermined refractive index and a plurality of modified refractive index regions having refractive indexes different from the refractive index of the basic layer. Further, the phase modulation layer includes a first region, and a second region different from the first region, the first region having at least a portion overlapping the electrode when the phase modulation layer is viewed from the side of the electrode along the normal direction. The second region may include a plurality of region elements separated by the first region.

Further, in a state where a virtual square lattice is set on a design surface of the phase modulation layer perpendicular to the normal direction, each of one or more modified refractive index regions in the second region among the plurality of modified refractive index regions is disposed in the second region so that a gravity center thereof is separated from a corresponding lattice point of the virtual square lattice by a predetermined distance and a vector from the corresponding lattice point toward the gravity center has a rotation angle according to the optical image around the corresponding lattice point. With this configuration, the optical image is completed as a single beam pattern configured by only a light component having passed through the electrode from the second region. That is, the second region includes one or more regions for completing the optical image as the single beam pattern.

Advantageous Effects of Invention

According to a semiconductor light-emitting element and a method for designing a phase modulation layer according to the present embodiment, it is possible to suppress deterioration in the quality of an optical image caused by an electrode blocking a part of light outputted from the phase modulation layer.

BRIEF DESCRIPTION OF DRAWINGS

FIGS. 10A and 10B are diagrams illustrating points of attention when the arrangement of the modified refractive index regions is determined on the basis of a rotation angle distribution obtained from a Fourier transform result of an optical image.

FIGS. 14A to 14C are graphs showing a result of examining a relation between a peak current and an output light intensity while changing a distance between the gravity center of the modified refractive index region and the lattice point.

FIGS. 15A to 15C are graphs showing a result of examining a relation between a peak current and an output light intensity while changing a distance between the gravity center of the modified refractive index region and the lattice point.

FIGS. 18A to 18G are diagrams showing an example of a mirror-image symmetric shape as an example (rotation method) of a planar shape of the modified refractive index region.

FIGS. 19A to 19K are diagrams showing an example of a shape having no rotation symmetry of 180° as another example (rotation method) of the planar shape of the modified refractive index region.

FIGS. 22A to 22K are diagrams showing an example of a relative relation between elements as still another example (rotation method) of the planar shape of the modified refractive index region.

FIGS. 28A to 28K are diagrams showing another example (on-axis shift method) of the planar shape of the modified refractive index region.

FIGS. 29A to 29K are diagrams showing still another example (on-axis shift method) of the planar shape of the modified refractive index region.

DESCRIPTION OF EMBODIMENTS

Description of Embodiments of Present Invention

Figure 1:
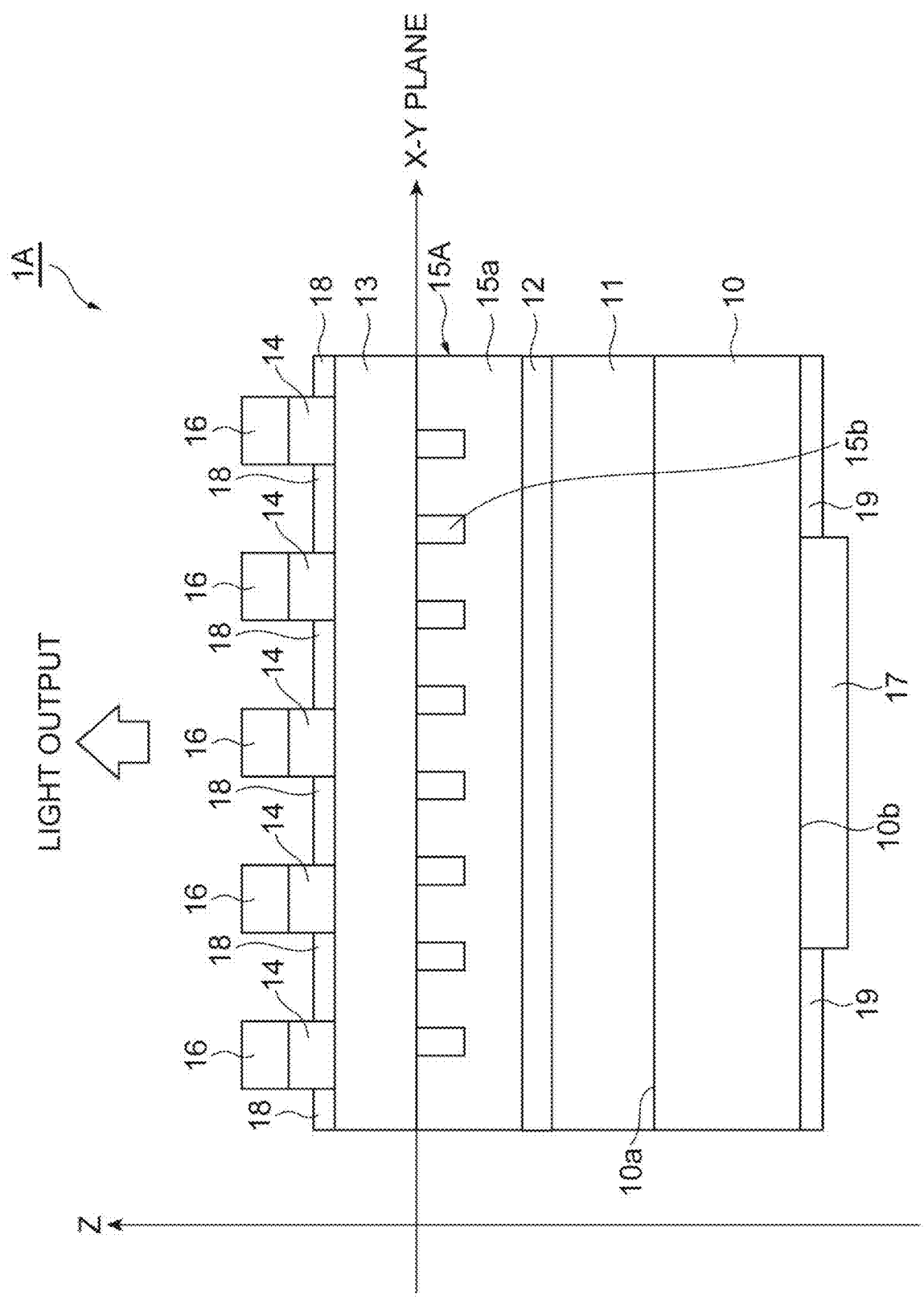
FIG. 1 is a diagram showing a configuration of a laser element as a semiconductor light-emitting element according to a first embodiment of the present invention.

First, contents of embodiments of the present invention will be individually enumerated and described.

(1) A semiconductor light-emitting element according to the present embodiment is a semiconductor light-emitting element that includes a semiconductor substrate having a main surface and a back surface facing the main surface and outputs an optical image in a direction tilted with respect to a normal direction of the main surface. The optical image is outputted from the main surface side or the back surface side of the semiconductor substrate. Particularly, as an aspect of the present embodiment, in order to solve the above-described problems, the semiconductor light-emitting element includes an active layer provided on the main surface of the semiconductor substrate, a cladding layer provided on the active layer, a contact layer provided on the cladding layer, a phase modulation layer, and an electrode. The phase modulation layer is provided between the semiconductor substrate and the active layer or between the active layer and the cladding layer. Further, in a configuration in which the optical image is outputted from the main surface side of the semiconductor substrate, the electrode is provided on the contact layer so that the optical image is outputted to the outside of the semiconductor light-emitting element from the side where the contact layer is located with respect to the active layer. On the other hand, in a configuration in which the optical image is outputted from the back surface side of the semiconductor substrate, the electrode is provided on the back surface of the semiconductor substrate so that the optical image is outputted to the outside of the semiconductor light-emitting element from the side where the back surface of the semiconductor substrate is located with respect to the active layer.

The phase modulation layer has a basic layer having a predetermined refractive index and a plurality of modified refractive index regions having refractive indexes different from the refractive index of the basic layer. Further, the phase modulation layer includes a first region, and a second region different from the first region, the first region having at least a portion overlapping the electrode when the phase modulation layer is viewed from the side of the electrode along the normal direction.

Further, in a state where a virtual square lattice is set on a design surface of the phase modulation layer perpendicular to the normal direction, each of one or more modified refractive index regions in the second region among the plurality of modified refractive index regions is disposed in the second region so that a gravity center thereof is separated from a corresponding lattice point of the virtual square lattice by a predetermined distance and a vector from the corresponding lattice point toward the gravity center has a rotation angle according to the optical image around the corresponding lattice point. With this configuration, the optical image is completed as a single beam pattern configured by only a light component having passed through the electrode from the second region. That is, the second region includes one or more regions for completing the optical image as the single beam pattern. Specifically, a planar shape of the second region on the design surface may be a shape that includes continuous first and second portions disposed so as to sandwich a part of the first region. Further, the planar shape of the second region may include a plurality of portions separated by the first region.

In the semiconductor light-emitting element of any one of the surface output type and the back surface output type described above, each of the modified refractive index regions (excluding the modified refractive index regions in the first region) in the second region of the phase modulation layer is disposed so that a vector from the corresponding lattice point of the virtual square lattice toward the gravity center has a rotation angle according to the optical image around the corresponding lattice point. Further, the optical image is completed by only the light component outputted from the second region of the phase modulation layer. As a result, without using the light component outputted from the first region of the phase modulation layer shielded by the electrode and using only the light component outputted from the second region not shielded by the electrode, the optical image is completed. Therefore, according to the semiconductor light-emitting elements of the surface output type and the back surface output type described above, it is possible to effectively suppress deterioration in the quality of the optical image caused by the electrode blocking a part of light outputted from the phase modulation layer. Further, when the optical image is outputted from the side of the contact layer with respect to the active layer as in the semiconductor light-emitting element of the surface output type, light absorption in the semiconductor substrate is reduced, and light output efficiency of the semiconductor light-emitting element is increased. Such a configuration is particularly effective for the case of outputting an optical image of an infrared region.

The optical image being completed by only the light component outputted from the second region of the phase modulation layer means that a desired optical image is obtained by only the modified refractive index regions included in the second region without using the modified refractive index regions included in the first region. In other words, the arrangement of the modified refractive index regions included in the first region is not reflected in the desired optical image obtained from the semiconductor light-emitting element. In other words, an optical image formed in a state where the electrode is provided and an optical image formed in a state where the electrode is not provided (in a state where a current is supplied by a mechanism other than the electrode) are matched with each other.

(2) As an aspect of the present embodiment, each of one or more modified refractive index regions in the first region among the plurality of modified refractive index regions is preferably disposed in the first region so that a gravity center thereof is located on a corresponding lattice point of the virtual square lattice or is separated from the corresponding lattice point by a predetermined distance and a vector from the corresponding lattice point toward the gravity center has a rotation angle unrelated to the formation of the optical image around the corresponding lattice point. Since the light outputted from the first region is shielded by the electrode, the gravity center of each of one or more modified refractive index regions in the first region may be arranged in an arbitrary manner. However, according to the arrangement satisfying the above-described condition, the phase modulation layer can be easily formed. Further, according to the knowledge of the present inventors, a current required for laser oscillation (oscillation threshold current) can be decreased when the gravity center of each of the plurality of modified refractive index regions is closer to the corresponding lattice point of the virtual square lattice. Therefore, the gravity center of each of the modified refractive index regions in the first region is arranged on the corresponding lattice point of the virtual square lattice, so that the oscillation threshold current can be effectively reduced.

(3) As an aspect of the present embodiment, a planar shape (shape defined on a plane perpendicular to the normal direction of the main surface of the semiconductor substrate) of the electrode is preferably any one of a lattice shape, a stripe shape, a concentric shape, a radial shape, and a comb shape. When the electrode has any one of these planar shapes, a part of the electrode can be disposed in the vicinity of a center portion of a light output surface. Thereby, the current can be sufficiently supplied to the vicinity of the center portion of the active layer, and an area of the light output surface can be increased. Particularly, in the case of the semiconductor light-emitting element of the surface output type, the current can be sufficiently supplied to the vicinity of the center portion of the active layer without increasing the thickness of the cladding layer.

(4) As an aspect of the present embodiment, a width of the first region defined along a reference direction perpendicular to the normal direction of the main surface of the semiconductor substrate is preferably larger than a width of the electrode defined along the reference direction. That is, a total area of the first region defined by a plane parallel to the design surface of the phase modulation layer may be larger than a total area of the electrode. By a minimum width of the first region larger than a minimum width of the electrode, even when an electrode formation position is slightly shifted from a design position, a state where the electrode shields the second region is avoided, and deterioration in the quality of the optical image can be suppressed.

(5) A method for designing a phase modulation layer according to the present embodiment is a method for designing the phase modulation layer configuring a part of the semiconductor light-emitting element with the above structure. As an aspect of the present embodiment, after setting a constraint condition and an initial condition, a position of the gravity center of each of one or more modified refractive index regions in the second region is determined under the constraint condition and the initial condition. That is, the constraint condition is defined by the gravity center of each of one or more modified refractive index regions in the first region among the plurality of modified refractive index regions being arranged on the corresponding lattice point of the virtual square lattice or a location separated from the lattice point by the predetermined distance and the vector from the corresponding lattice point toward the gravity center having a constant rotation angle around the corresponding lattice point. Further, a complex amplitude distribution on a screen at infinity of the optical image to be output is set as the initial condition.

In the method designing a phase modulation layer, under the constraint condition and the initial condition, a position of the gravity center of each of one or more modified refractive index regions in the second region is determined by repeating an inverse Fourier transform step and a Fourier transform step. In the inverse Fourier transform step, information of a complex amplitude distribution obtained by inverse Fourier transform from the screen at infinity to the design surface is replaced with information of a complex amplitude distribution for Fourier transform from the design surface to the screen at infinity. On the other hand, in the Fourier transform step, the information of the complex amplitude distribution obtained by the Fourier transform is replaced with the information of the complex amplitude distribution for the inverse Fourier transform. As described above, by performing the repetitive operation while constraining the position of the gravity center of each of the plurality of modified refractive index regions in the first region, the arrangement of the gravity center of each of the modified refractive index regions that can complete the optical image by only the second region can be easily calculated.

(6) As an aspect of the present embodiment, the complex amplitude distribution on the screen at infinity set as the initial condition includes an amplitude distribution and a phase distribution, and at least one of the amplitude distribution and the phase distribution is preferably set randomly.

As a first precondition, in an XYZ orthogonal coordinate system defined by a Z axis matched with the normal direction of the main surface of the semiconductor substrate and an X-Y plane including an X axis and a Y axis matched with one surface of the phase modulation layer including the plurality of modified refractive index regions and orthogonal to each other, a virtual square lattice including M1 (an integer of 1 or more)×N1 (an integer of 1 or more) unit constituent regions R each having a square shape is set on the X-Y plane. At this time, an arrangement pattern of the plurality of modified refractive index regions is defined so that a gravity center G of the modified refractive index region located in a unit constituent region R(x, y) on the X-Y plane specified by a coordinate component x (an integer of from 1 to M1) in an X-axis direction and a coordinate component y (an integer of from 1 to N1) in a Y-axis direction is separated from a lattice point O(x, y) to be a center of the unit constituent region R(x, y) by a distance r and a vector from the lattice point O(x, y) toward the gravity center G is oriented in a specific direction.

Figure 38:
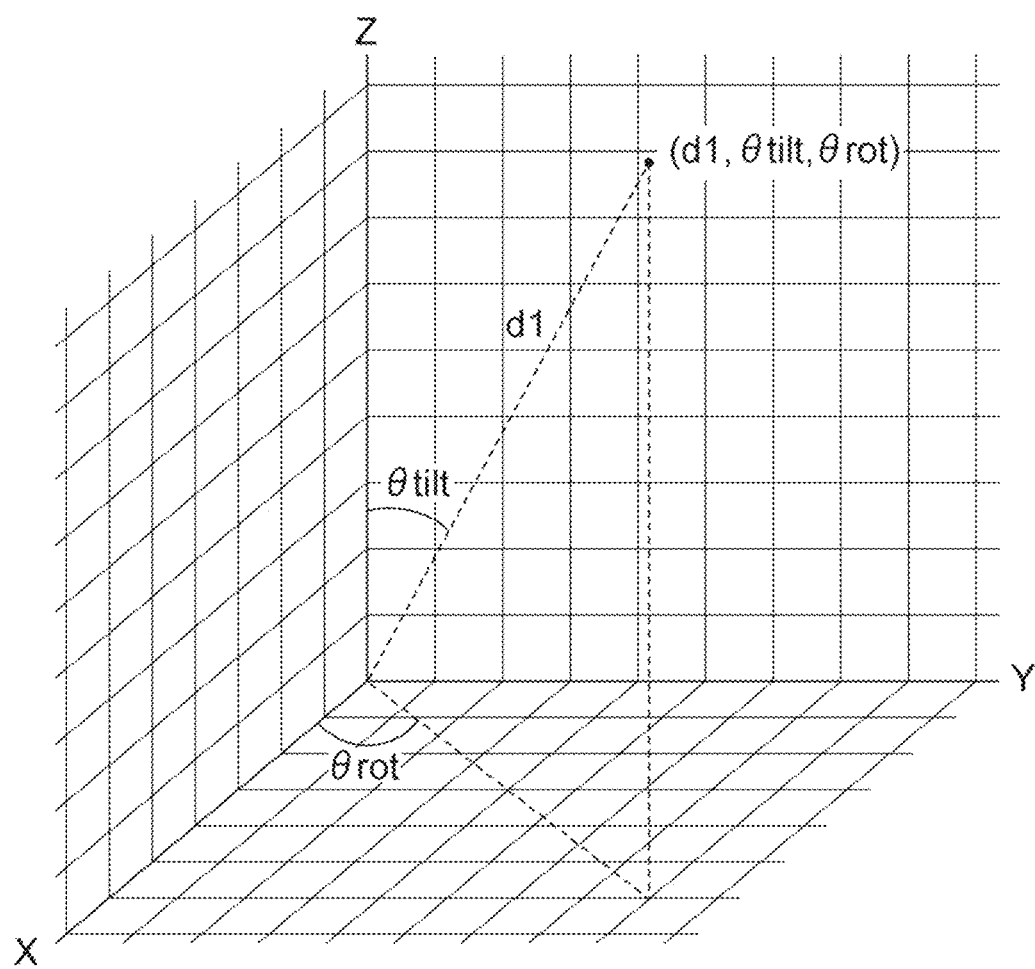
FIG. 38 is a diagram illustrating coordinate conversion from the spherical coordinates (d1, $\theta_{tilt}$, $\theta_{rot}$) to the coordinates (x,y,z) in an XYZ orthogonal coordinate system.

Further, as a second precondition, the coordinates (x,y,z) in the XYZ orthogonal coordinate system satisfy relations represented by the following formulas (1) to (3), with respect to the spherical coordinates (d1, $\theta_{tilt}$, $\theta_{rot}$) defined by a radial length d1, a tilt angle $\theta_{tilt}$ from the Z axis, and a rotation angle $\theta_{rot}$ from the X axis specified on the X-Y plane, as shown in FIG. 38. FIG. 38 is a diagram illustrating coordinate conversion from the spherical coordinates (d1, $\theta_{tilt}$, $\theta_{rot}$) to the coordinates (x,y,z) in the XYZ orthogonal coordinate system, in which a design optical image on a predetermined plane (target beam projection region) set in the XYZ orthogonal coordinate system to be a real space is represented by the coordinates (x,y,z). When the output beam pattern corresponding to the optical image outputted from the semiconductor light-emitting element is a set of bright spots oriented in a direction defined by the angles $\theta_{tilt}$ and $\theta_{rot}$, the angles $\theta_{tilt}$ and $\theta_{rot}$ are converted into a coordinate value $k_x$ on a Kx axis corresponding to the X axis, which is a normalized wave number defined by the following formula (4), and a coordinate value $k_y$ on a Ky axis that corresponds to the Y axis and is orthogonal to the Kx axis, which is a normalized wave number defined by the following formula (5). The normalized wave number means a wave number normalized with a wave number corresponding to a lattice interval of the virtual square lattice as 1.0. At this time, in a wave number space defined by the Kx axis and the Ky axis, a specific wave number range including the output beam pattern corresponding to the optical image includes M2 (an integer of 1 or more)×N2 (an integer of 1 or more) image regions FR each having a square shape. The integer M2 does not need to be matched with the integer M1. Similarly, the integer N2 does not need to be matched with the integer N1. Further, the formulas (4) and (5) are disclosed in the above Non Patent Document 1, for example.

$$x = d1\sin\theta_{tilt}\cos\theta_{rot} \quad (1)$$

$$y = d1\sin\theta_{tilt}\sin\theta_{rot} \quad (2)$$

$$z = d1\cos\theta_{tilt} \quad (3)$$

-continued $$k_x = \frac{a}{\lambda}\sin\theta_{tilt}\cos\theta_{rot} \quad (4)$$

$$k_y = \frac{a}{\lambda}\sin\theta_{tilt}\sin\theta_{rot} \quad (5)$$

a: a lattice constant of the virtual square lattice
λ: an oscillation wavelength As a third precondition, a complex amplitude F(x, y) obtained by performing two-dimensional inverse Fourier transform of each of the image regions FR ($k_x$, $k_y$) specified by a coordinate component $k_x$ (an integer of from 0 to M2−1) in the Kx-axis direction and a coordinate component $k_y$ (an integer of from 0 to N2−1) in the Ky-axis direction in the wave number space into the unit constituent region R(x, y) on the X-Y plane specified by a coordinate component x (an integer of from 1 to M1) in the X-axis direction and a coordinate component y (an integer of from 1 to N1) in the Y-axis direction is given by the following formula (6) with j as an imaginary unit. Further, when an amplitude term is set as A(x, y) and a phase term is set as P(x, y), the complex amplitude F(x, y) is defined by the following formula (7). Further, as a fourth precondition, the unit constituent region R(x, y) is defined by an s axis and a t axis that are parallel to the X axis and the Y axis, respectively, and are orthogonal to each other at the lattice point O(x, y) to be the center of the unit constituent region R(x, y).

$$F(x, y) = \sum_{k_x=0}^{M2-1}\sum_{k_y=0}^{N2-1} FR(k_x, k_y)\exp\left[j2\pi\left(\frac{k_x}{M2}x + \frac{k_y}{N2}y\right)\right] \quad (6)$$

$$F(x, y) = A(x, y) \times \exp[jP(x, y)] \quad (7)$$

Under the above first to fourth preconditions, the arrangement pattern of the modified refractive index regions in the phase modulation layer is determined by a rotation method or an on-axis shift method. Specifically, in determining the arrangement pattern by the rotation method, the modified refractive index region is disposed in the unit constituent region R(x, y) so that an angle φ(x, y) formed by a line segment connecting the lattice point O(x, y) and the gravity center G of the corresponding modified refractive index region and the s axis satisfies a relation of φ(x,y)=C×P(x,y)+B C: proportional constant, for example, 180°/π
B: arbitrary constant, for example, 0.

In the semiconductor light-emitting element having the structure described above, in the phase modulation layer, the distance r between the center (lattice point) of each unit constituent region configuring the virtual square lattice and the gravity center G of the corresponding modified refractive index region preferably has a constant value over the entire phase modulation layer (it is not excluded that the distance r is partially different). Thereby, when the phase distribution (distribution of the phase term P(x, y) in the complex amplitude F(x, y) allocated to the unit constituent region R(x, y)) in the entire phase modulation layer is equally distributed from 0 to 2π (rad), the gravity center of the modified refractive index region is matched with the lattice point of the unit constituent region R in the square lattice on average. Therefore, since a two-dimensional distribution Bragg diffraction effect in the phase modulation layer approaches a two-dimensional distribution Bragg diffraction effect when the modified refractive index region is disposed on each lattice point of the square lattice, a standing wave can be easily formed, and a reduction in the threshold current for oscillation can be expected.

(10) On the other hand, in determining the arrangement pattern by the on-axis shift method, under the above first to fourth preconditions, the gravity center G of the corresponding modified refractive index region is arranged on a straight line passing through the lattice point O(x, y) and tilted from the s axis, in the unit constituent region R(x, y). At this time, the modified refractive index region is disposed in the unit constituent region R(x, y) so that a line segment length r(x, y) from the lattice point O(x, y) to the gravity center G of the corresponding modified refractive index region satisfies a relation of $$r(x,y) = C \times (P(x,y) - P_0)$$

C: proportional constant $P_0$: arbitrary constant, for example, 0. Even when the arrangement pattern of the modified refractive index regions in the phase modulation layer is determined by the on-axis shift method, the same effect as that in the rotation method described above is achieved.

Each aspect enumerated in the "description of embodiments of present invention" can be applied to all of the remaining aspects or all combinations of the remaining aspects.

Details of Embodiments of Present Invention

Hereinafter, specific structures of a semiconductor light-emitting element and a method for designing a phase modulation layer according to the present embodiment will be described in detail with reference to the accompanying drawings. It should be noted that the present invention are not limited to these examples, but are indicated by claims and it is intended to include all changes in meanings and ranges equivalent to the claims. Further, in the description of the drawings, the same elements will be denoted by the same reference numerals and redundant explanations will be omitted.

First Embodiment

Figure 2:
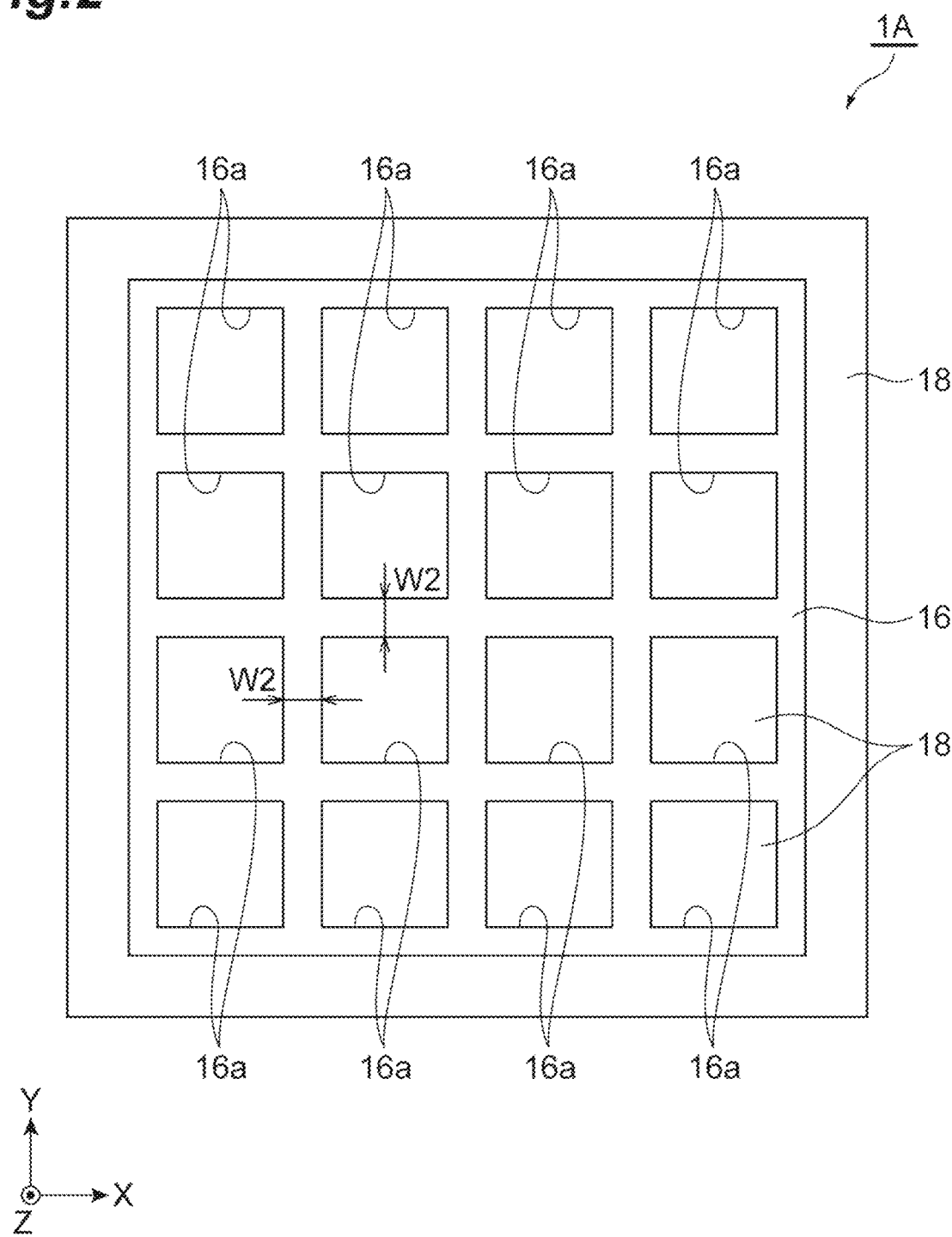
FIG. 2 is a plan view of the laser element when viewed along a light output direction.

FIG. 1 is a diagram showing a configuration of a laser element 1A as a semiconductor light-emitting element according to a first embodiment. Further, FIG. 2 is a plan view of the laser element 1A when viewed along a light output direction. An XYZ orthogonal coordinate system in which a thickness direction (lamination direction) of the laser element 1A is a Z axis is defined. The laser element 1A is a laser light source that forms a standing wave along an X-Y plane and outputs a phase-controlled plane wave along a Z-axis direction. In the laser element 1A, an optical image with a two-dimensional arbitrary shape including a normal direction of a main surface 10a of a semiconductor substrate 10 and a direction tilted with respect to the normal direction is emitted from a surface of the side of an upper cladding layer 13.

As shown in FIG. 1, a laser element 1A includes a lower cladding layer 11 provided on a semiconductor substrate 10, an active layer 12 provided on the lower cladding layer 11, an upper cladding layer 13 provided on the active layer 12, and a contact layer 14 provided on the upper cladding layer 13. The semiconductor substrate 10 and the layers 11 to 14 are configured by a compound semiconductor such as a GaAs-based semiconductor, an InP-based semiconductor, or a nitride-based semiconductor, for example. An energy band gap of the lower cladding layer 11 and an energy band gap of the upper cladding layer 13 are larger than an energy band gap of the active layer 12.

The laser element 1A further includes a phase modulation layer 15A provided between the active layer 12 and the upper cladding layer 13. If necessary, a light guide layer may be provided between the active layer 12 and the upper cladding layer 13 and/or between the active layer 12 and the lower cladding layer 11. When the light guide layer is provided between the active layer 12 and the upper cladding layer 13, the phase modulation layer 15A is provided between the upper cladding layer 13 and the light guide layer. Further, a design surface of the phase modulation layer 15A is assumed to be matched with the X-Y plane.

Figure 3:
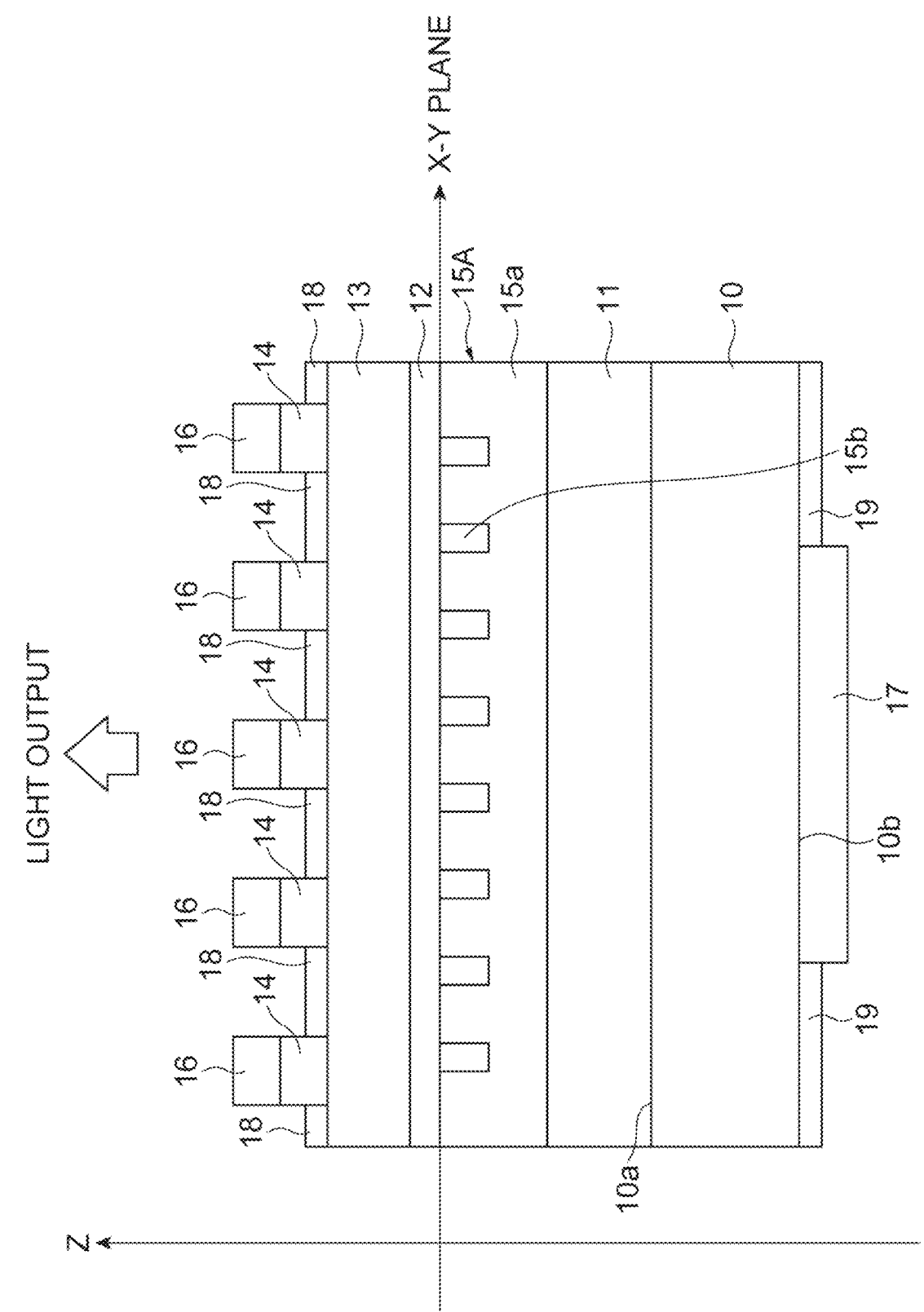
FIG. 3 is a diagram showing the case where a phase modulation layer is provided between a lower cladding layer and an active layer.

As shown in FIG. 3, the phase modulation layer 15A may be provided between the lower cladding layer 11 and the active layer 12. Further, when the light guide layer is provided between the active layer 12 and the lower cladding layer 11, the phase modulation layer 15A is provided between the lower cladding layer 11 and the light guide layer.

A relation between refractive indexes of the semiconductor substrate 10 and each semiconductor layer provided on the semiconductor substrate 10 is as follows. That is, the refractive index of each of the lower cladding layer 11 and the upper cladding layer 13 is smaller than the refractive index of each of the semiconductor substrate 10, the active layer 12, and the contact layer 14. Further, in the present embodiment, the refractive index of the upper cladding layer 13 is equal to or smaller than the refractive index of the lower cladding layer 11. The refractive index of the phase modulation layer 15A may be larger or smaller than the refractive index of the lower cladding layer 11 (or the upper cladding layer 13).

The phase modulation layer 15A is configured to include a basic layer 15a made of a first refractive index medium and a plurality of modified refractive index regions 15b made of a second refractive index medium having a refractive index different from a refractive index of the first refractive index medium and existing in the basic layer 15a. The plurality of modified refractive index regions 15b include a substantially periodic structure. When an effective refractive index of the phase modulation layer 15A is set as n, a wavelength $\lambda_0$ (=a×n, where a is a lattice interval) selected by the phase modulation layer 15A is included in an emission wavelength range of the active layer 12. The phase modulation layer (diffraction grating layer) 15A can select the wavelength $\lambda_0$ of the emission wavelengths of the active layer 12 and output it to the outside.

The laser element 1A further includes an electrode 16 provided on the contact layer 14 and an electrode 17 provided on a back surface 10b of the semiconductor substrate 10. The electrode 16 is in ohmic contact with the contact layer 14, and the electrode 17 is in ohmic contact with the semiconductor substrate 10. As shown in FIG. 2, the electrode 16 has a planar shape such as a lattice shape (for example, a square lattice shape), and has a plurality of openings 16a arranged two-dimensionally in parallel to the X-Y plane. In FIG. 2, a total of 16 openings 16a arranged in 4 rows and 4 columns are exemplified. However, the number and arrangement of openings 16a are arbitrary. The planar shape of each opening 16a is a quadrangle such as a square, for example. An inner diameter (length of one side) of each opening 16a is, for example, 5 μm to 100 μm. A part of the electrode 16 is provided in the vicinity of a center portion of the laser element 1A as viewed from the light output direction.

FIG. 1 is referred to again. The contact layer 14 according to the present embodiment has the same planar shape as that of the electrode 16. That is, the planar shape of the contact layer 14 as viewed from the light output direction becomes the same lattice shape as the electrode 16. The light outputted from the laser element 1A passes through the opening of the contact layer 14 and the opening 16a of the electrode 16. The light passes through the opening of the contact layer 14, so that light absorption in the contact layer 14 is avoided, and light output efficiency is increased. However, when the light absorption in the contact layer 14 can be allowed, the contact layer 14 may cover the entire surface on the upper cladding layer 13 without having the opening. Further, the light passes through the opening 16a of the electrode 16, so that the light can be suitably outputted from the side of the surface of the laser element 1A (the side of the contact layer 14 with respect to the active layer 12), without being blocked by the electrode 16.

The surface of the upper cladding layer 13 exposed from the opening of the contact layer 14 (or the surface of the contact layer 14 when the opening of the contact layer 14 is not provided) is covered with an antireflection film 18. The antireflection film 18 may also be provided outside the contact layer 14. Further, a portion other than the electrode 17 on the back surface 10b of the semiconductor substrate 10 is covered with a protective film 19.

When a driving current is supplied between the electrode 16 and the electrode 17, recombination of electrons and holes occurs in the active layer 12, and light emission occurs in the active layer 12. The electrons and holes contributing to the light emission and the generated light are efficiently confined between the lower cladding layer 11 and the upper cladding layer 13.

A part of the light generated in the active layer 12 is also incident on an inner portion of the phase modulation layer 15A and oscillates in a predetermined mode according to a lattice structure of the inner portion of the phase modulation layer 15A. A laser beam outputted from the phase modulation layer 15A is outputted from the upper cladding layer 13 to the outside through the opening of the contact layer 14 and the opening 16a of the electrode 16. At this time, zero-order light of the laser beam is output in a direction perpendicular to the main surface 10a. On the other hand, signal light of the laser beam is output in a two-dimensional arbitrary direction including the direction perpendicular to the main surface 10a (a normal direction of the main surface 10a) and a direction tilted with respect to the normal direction. The signal light forms a desired optical image, and the zero-order light is not used in present embodiment.

As an example, the semiconductor substrate 10 may be a GaAs substrate, the lower cladding layer 11 may be an AlGaAs layer, the active layer 12 may have a multiple quantum well structure (barrier layer: AlGaAs/well layer: InGaAs), the basic layer 15a of the phase modulation layer 15A may be GaAs, the modified refractive index region 15b may be a hole, the upper cladding layer 13 may be an AlGaAs layer, and the contact layer 14 may be a GaAs layer. Further, as another example, the semiconductor substrate 10 may be an InP substrate, the lower cladding layer 11 may be an InP layer, the active layer 12 may have a multiple quantum well structure (barrier layer: GaInAsP/well layer: GaInAsP), the basic layer 15a of the phase modulation layer 15A may be GaInAsP, the modified refractive index region 15b may be a hole, the upper cladding layer 13 may be an InP layer, and the contact layer 14 may be a GaInAsP layer. Further, as still another example, the semiconductor substrate 10 may be a GaN substrate, the lower cladding layer 11 may be an AlGaN layer, the active layer 12 may have a multiple quantum well structure (barrier layer: InGaN/well layer: InGaN), the basic layer 15a of the phase modulation layer 15A may be GaN, the modified refractive index region 15b may be a hole, the upper cladding layer 13 may be an AlGaN layer, and the contact layer 14 may be a GaN layer.

The same conductivity type as that of the semiconductor substrate 10 is given to lower cladding layer 11, and a conductivity type opposite to that of the semiconductor substrate 10 is given to the upper cladding layer 13 and the contact layer 14. In one example, the semiconductor substrate 10 and the lower cladding layer 11 are of an n-type, and the upper cladding layer 13 and the contact layer 14 are of a p-type. When the phase modulation layer 15A is provided between the active layer 12 and the lower cladding layer 11, the phase modulation layer 15A has the same conductivity type as that of the semiconductor substrate 10, and when the phase modulation layer 15A is provided between the active layer 12 and the upper cladding layer 13, the phase modulation layer 15A has the conductivity type opposite to that of the semiconductor substrate 10. An impurity concentration is, for example, $1 \times 10^{17}$ to $1 \times 10^{21}$/cm$^3$.

Further, in the above-described structure, the modified refractive index region 15b is the hole. However, the modified refractive index region 15b may be formed by embedding a semiconductor having a refractive index different from that of the basic layer 15a in the hole. In that case, for example, after forming the hole of the basic layer 15a by etching, the semiconductor may be embedded in the hole using a metal organic vapor phase epitaxial method, a sputtering method, or an epitaxial method. Further, after the semiconductor is embedded in the hole of the basic layer 15a to form the modified refractive index region 15b, the same semiconductor as that of the modified refractive index region 15b may be further deposited thereon. When the modified refractive index region 15b is the hole, gas such as argon, nitrogen, and hydrogen, or air may be sealed in the hole.

The antireflection film 18 is made of, for example, a dielectric single layer film such as silicon nitride (for example, SiN) or silicon oxide (for example, SiO$_2$), or a dielectric multilayer film. As the dielectric multilayer film, for example, a film obtained by laminating two or more kinds of dielectric layers selected from the dielectric layer group consisting of titanium oxide (TiO$_2$), silicon dioxide (SiO$_2$), silicon monoxide (SiO), niobium oxide (Nb$_2$O$_5$), tantalum pentoxide (Ta$_2$O$_5$), magnesium fluoride (MgF$_2$), titanium oxide (TiO$_2$), aluminum oxide (Al$_2$O$_3$), cerium oxide (CeO$_2$), indium oxide (In$_2$O$_3$), and zirconium oxide (ZrO$_2$) is applicable. For example, a film having a thickness of λ/4 is laminated with an optical film thickness for light having the wavelength λ. Further, the protective film 19 is, for example, an insulating film such as silicon nitride (for example, SiN) or silicon oxide (for example, SiO$_2$).

Figure 4:
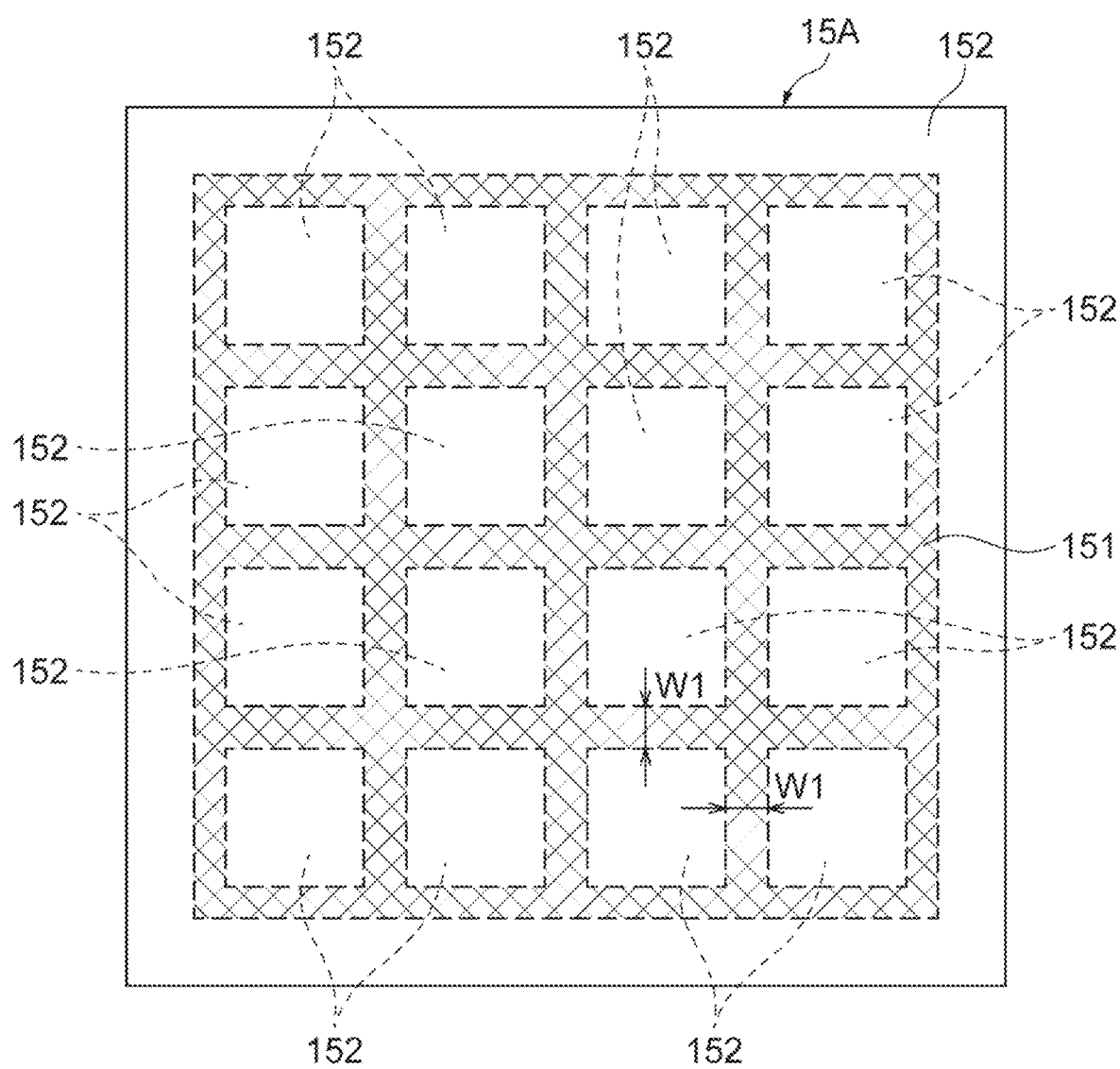
FIG. 4 is a plan view of the phase modulation layer.

FIG. 4 is a plan view of the phase modulation layer 15A. The phase modulation layer 15A includes a first region 151 and a second region 152. The first region 151 is a region that overlaps the electrode 16 as viewed along a thickness direction (that is, a Z-axis direction) of the phase modulation layer 15A. The second region 152 is a region different from the first region 151. For example, when the electrode 16 has a lattice-like planar shape as shown in FIG. 2, the first region 151 also has a lattice-like planar shape. In this case, the second region 152 includes a plurality of region elements that overlap the opening 16a of the electrode 16. The planar shape of the first region 151 and the position in the X-Y plane may be matched with the planar shape of the electrode 16 and the position in the X-Y plane, or may not completely matched. For example, a line width W1 of the first region 151 (the width of the first region 151 defined along a reference direction perpendicular to the thickness direction of the phase modulation layer 15A) may be larger than a line width W2 of the electrode 16 (the width of the electrode 16 along the reference direction), or may be smaller than the line width W2 (the line widths do not necessarily have to be matched).

Figure 5:
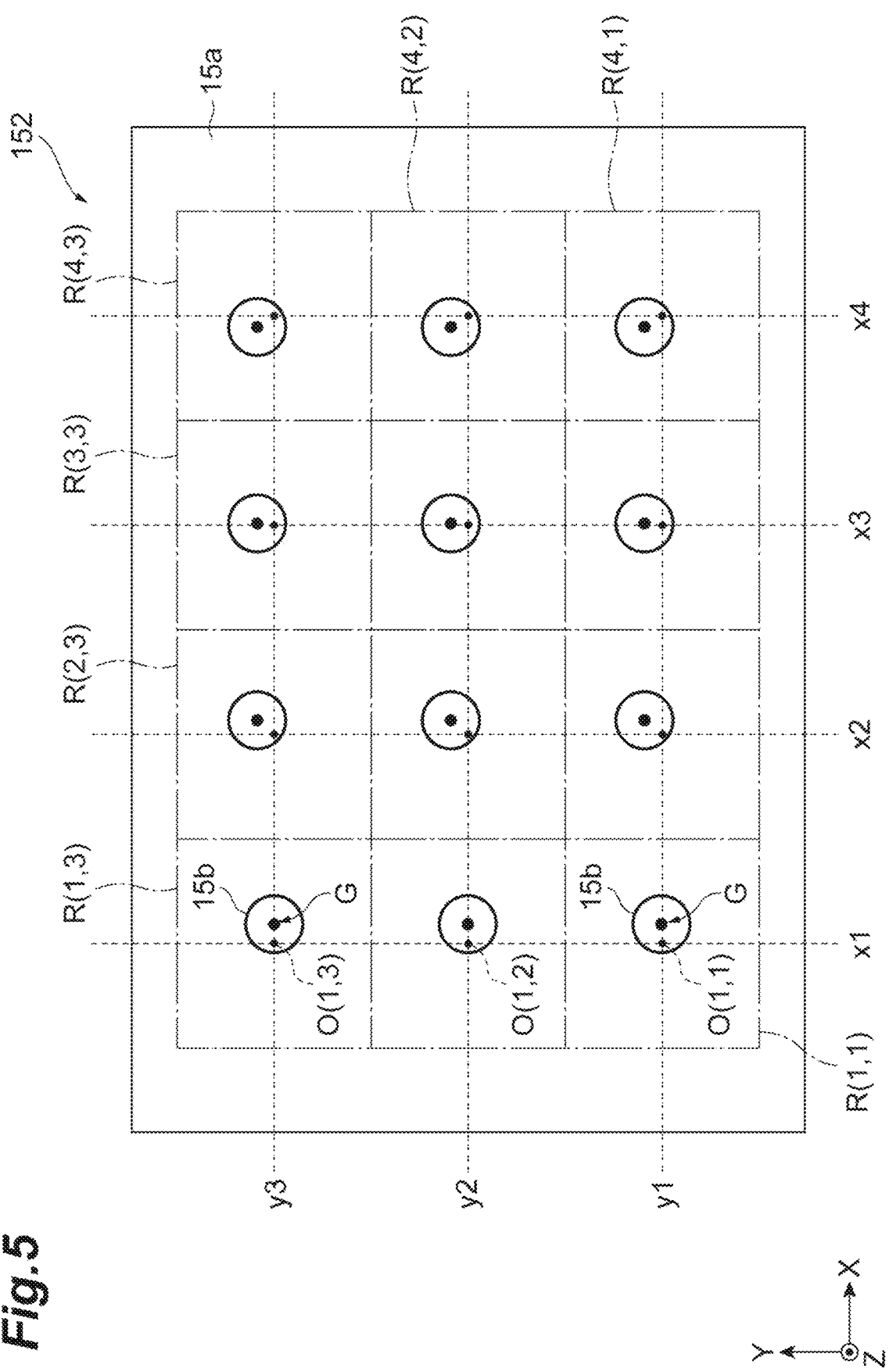
FIG. 5 is a plan view showing a configuration of a part of a second region of the phase modulation layer, and is a diagram illustrating an example of an arrangement pattern (rotation method) of modified refractive index regions in the second region.

FIG. 5 is a plan view showing a configuration of a part of the second region 152 of the phase modulation layer 15A, and is a diagram illustrating an example of an arrangement pattern (rotation method) of the modified refractive index regions in the second region 152. The second region 152 includes the basic layer 15a made of a first refractive index medium and the modified refractive index region 15b made of a second refractive index medium having a refractive index different from the refractive index of the first refractive index medium. Here, a virtual square lattice is set on the design surface of the phase modulation layer 15A matched with the X-Y plane. One side of the square lattice is parallel to the X axis, and the other side is parallel to the Y axis. At this time, a square unit constituent region R centering on a lattice point O of the square lattice can be set two-dimensionally over a plurality of columns along the X axis and a plurality of rows along the Y axis. The plurality of modified refractive index regions 15b are provided one by one in each unit constituent region R. The planar shape of the modified refractive index region 15b is, for example, a circular shape. In each unit constituent region R, a gravity center G of the modified refractive index region 15b is arranged away from the lattice point (center of the unit constituent region R) O closest thereto.

Specifically, in FIG. 5, each of broken lines indicated by x1 to x4 indicates a center position in the X-axis direction in the unit constituent region R, and each of broken lines indicated by y1 to y3 indicates a center position in the Y-axis direction in the unit constituent region R. Therefore, intersections of the broken lines x1 to x4 and the broken lines y1 to y3 are respectively centers O (1,1) to O (4,3) of the unit constituent regions R (1,1) to R (4,3), that is, lattice points. The virtual square lattice has a lattice constant of a. The lattice constant a is adjusted according to the emission wavelength.

Figure 6:
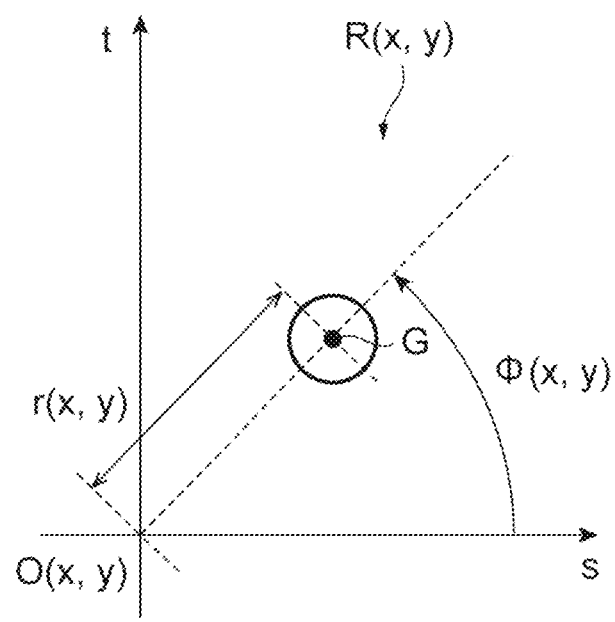
FIG. 6 is a diagram illustrating a position relation between a gravity center of a modified refractive index region and a lattice point in a virtual square lattice, as an example of an arrangement pattern determined by a rotation method.

The arrangement pattern of the modified refractive index regions 15b is determined by a method described in Patent Literature 1, according to a target beam projection region and a target output beam pattern. That is, on the design surface of the phase modulation layer 15A defined on the X-Y plane, a direction in which the gravity center G of each modified refractive index region 15b is shifted from each of the lattice points (intersections of the broken lines x1 to x4 and the broken lines y1 to y3) in the virtual square lattice in the basic layer 15a is determined according to a phase obtained by performing inverse Fourier transform on an original pattern corresponding to the target beam projection region and the target output beam pattern, so that the arrangement pattern is determined. A distance r (refer to FIG. 6) shifted from each lattice point is preferably in a range of $0 < r \leq 0.3a$ when the lattice constant of the square lattice is set as a, as described in Patent Literature 1. The distance r shifted from each lattice point is generally the same over all phase modulation regions and all modified refractive index regions. However, the distance r of a part of the phase modulation regions may be a value different from the distance r of the other phase modulation regions, and the distance r of a part of the modified refractive index regions may be a value different from the distance r of the other modified refractive index regions. FIG. 6 is a diagram illustrating an example of the arrangement pattern (rotation method) determined by the rotation method. In FIG. 6, a configuration of the unit constituent region R(x, y) is shown, and the distance r from the lattice point to the modified refractive index region 15b is indicated by r(x, y).

As shown in FIG. 6, the unit constituent region R(x, y) configuring the square lattice is defined by an s axis and a t axis orthogonal to each other at the lattice point O(x, y). The s-axis is an axis parallel to the X axis and corresponds to the broken lines x1 to x4 shown in FIG. 5. The t-axis is an axis parallel to the Y axis and corresponds to the broken lines y1 to y3 shown in FIG. 5. As such, in an s-t plane that defines the unit constituent region R(x, y), an angle formed between the direction from the lattice point O(x, y) toward the gravity center G and the s axis is given by φ(x, y). When the rotation angle φ(x, y) is 0°, a direction of a vector connecting the lattice point O(x, y) and the gravity center G is matched with a positive direction of the s axis. Further, a length of the vector (corresponding to the distance r) connecting the lattice point O(x, y) and the gravity center G is given by r(x, y).

As shown in FIG. 5, in the phase modulation layer 15A, the rotation angle φ(x, y) around the lattice point O(x, y) of the gravity center G of the modified refractive index region 15b is the target and It is set independently for each unit constituent region R according to the target output beam pattern (optical image). The rotation angle φ(x, y) has a specific value in the unit constituent region R(x, y), but is not necessarily represented by a specific function. That is, the rotation angle φ(x, y) is determined from a phase term of a complex amplitude obtained by converting the output beam pattern into the wave number space and performing two-dimensional inverse Fourier transform on a certain wave number range of the wave number space. When a complex amplitude distribution (complex amplitude of each unit constituent region R) is calculated from the target output beam pattern, an iterative algorithm such as a Gerchberg-Saxton (GS) method generally used at the time of calculation of hologram generation is applied, so that reproducibility of the target output beam pattern is improved.

Figure 7:
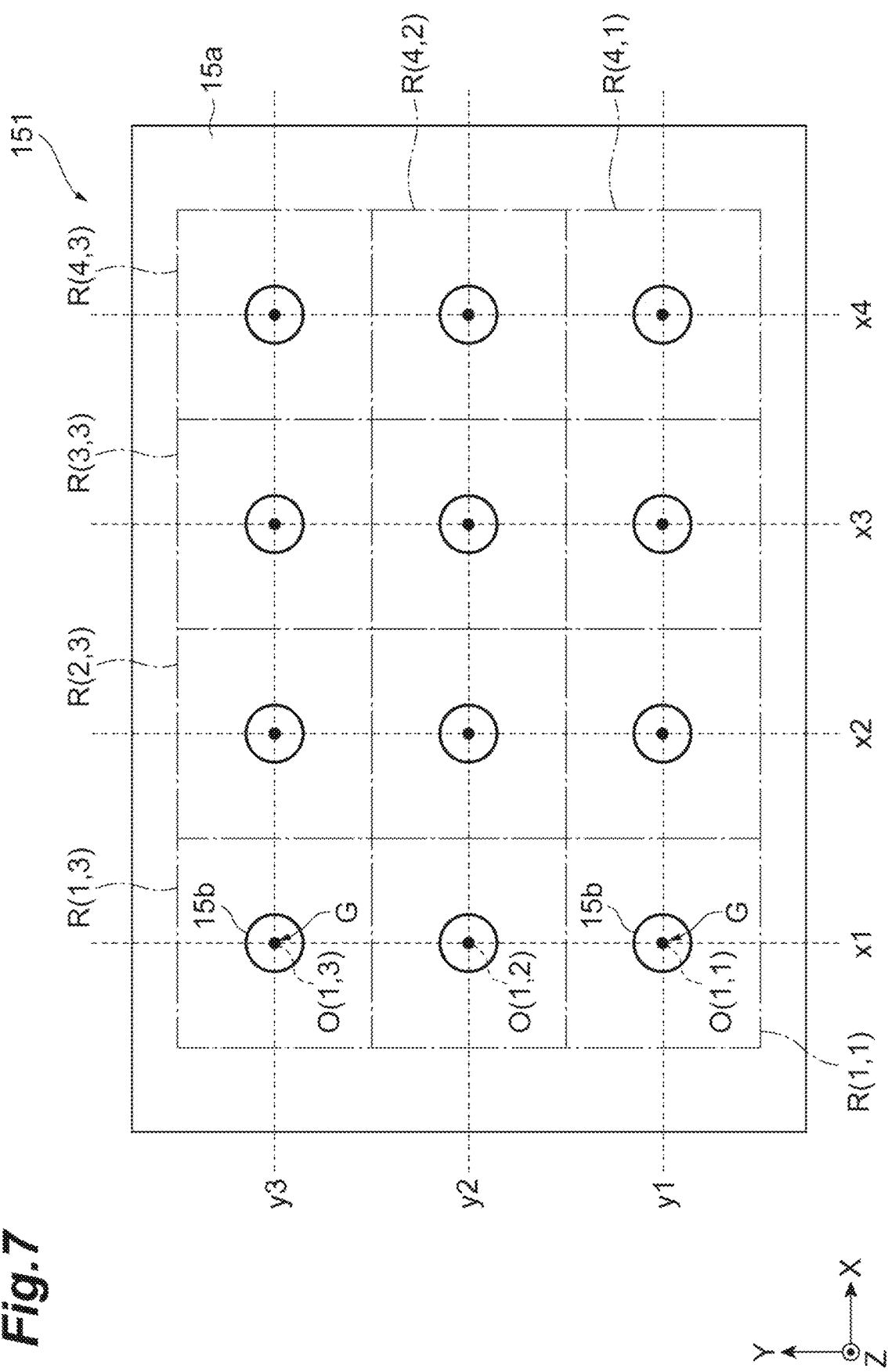
FIG. 7 is a plan view showing an example of an arrangement pattern of modified refractive index regions in a part of a first region of the phase modulation layer.

FIG. 7 is a plan view showing an example of an arrangement pattern of the modified refractive index regions 15b in a part of the first region 151 of the phase modulation layer 15A. Similarly to the second region 152, the first region 151 includes the basic layer 15a made of a first refractive index medium and the modified refractive index region 15b made of a second refractive index medium having a refractive index different from the refractive index of the first refractive index medium. The plurality of modified refractive index regions 15b are provided one by one in each unit constituent region R. The planar shape of the modified refractive index region 15b is, for example, a circular shape. In the first region 151, unlike the second region 152, in each unit constituent region R, the gravity center G of the modified refractive index region 15b is arranged on the lattice point O in each unit constituent region R. In other words, the gravity center G of each modified refractive index region 15b is matched with each lattice point O. As such, since the first region 151 has a configuration as a normal photonic crystal laser, it contributes to only the output of the zero-order light and does not contribute to the signal light forming the optical image. In the present embodiment, a desired optical image having no missing information is completed by only a light component outputted from the second region 152 in the phase modulation layer 15A.

Figure 8:
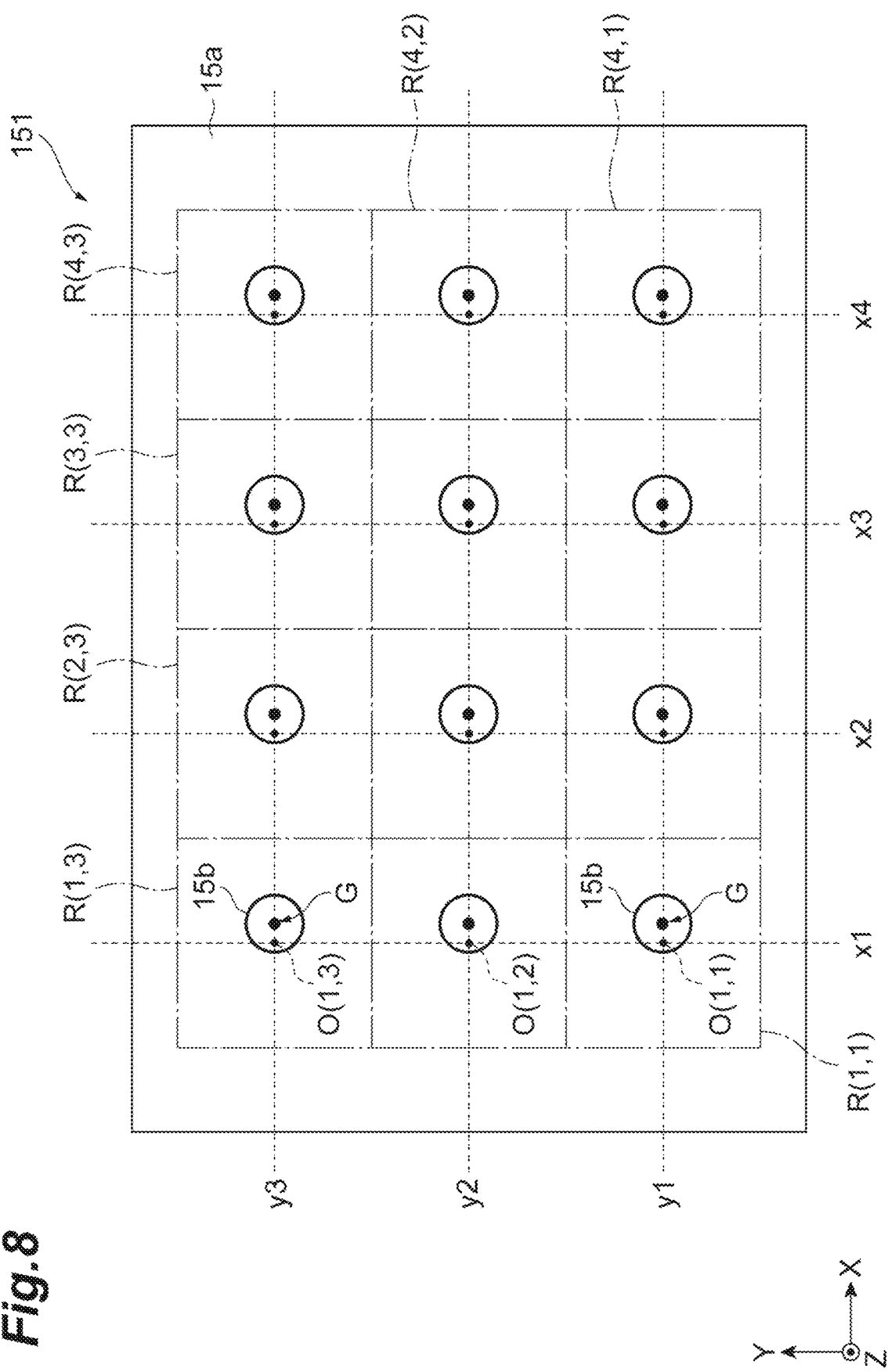
FIG. 8 is a diagram illustrating another example of the arrangement pattern of the modified refractive index regions in a part of the first region of the phase modulation layer.

FIG. 8 is a plan view showing another example of an arrangement pattern of the modified refractive index regions 15b in a part of the first region 151 of the phase modulation layer 15A. As shown in FIG. 8, in the first region 151, the gravity center G of the modified refractive index region 15b may be arranged away from the closest lattice point O in each unit constituent region R. In this case, r(x, y) and the rotation angle φ(x, y) around the lattice point O shown in FIG. 6 are constant regardless of the position of the unit constituent region R (over the entire first region 151) or are set irrespective of the optical image. Even in this case, a desired optical image having no missing information is completed by only the light component outputted from the second region 152.

In the second region of the phase modulation layer 15A, the rotation angle distribution φ(x, y) is designed so that all phases of 0 to 2π (rad) are included to the same extent In other words, for each of the modified refractive index regions 15b, a vector OG from the lattice point O of the square lattice toward the gravity center G of the modified refractive index region 15b is taken, and if the vectors OG are added over the entire phase modulation layer 15A, it approaches zero. That is, on average, the modified refractive index region 15b can be considered to be on the lattice point O of the square lattice, and as a whole, the same two-dimensional distribution Bragg diffraction effect as that when the modified refractive index region 15b is disposed on the lattice point O is obtained. Therefore, it is easy to form the standing wave, and a reduction in the threshold current for oscillation can be expected. Here, as the first region of the phase modulation layer 15A, when the gravity center G of each modified refractive index region 15b is arranged so as to be matched with the lattice point O in each unit constituent region R as shown in FIG. 7, by combining the first region with the second region described above, the same two-dimensional Bragg diffraction effect as that when the modified refractive index region 15b is disposed on the lattice point O in the entire phase modulation layer 15A is obtained. Therefore, it is easy to form the standing wave, and a further reduction in the threshold current for oscillation can be expected.

Figure 9:
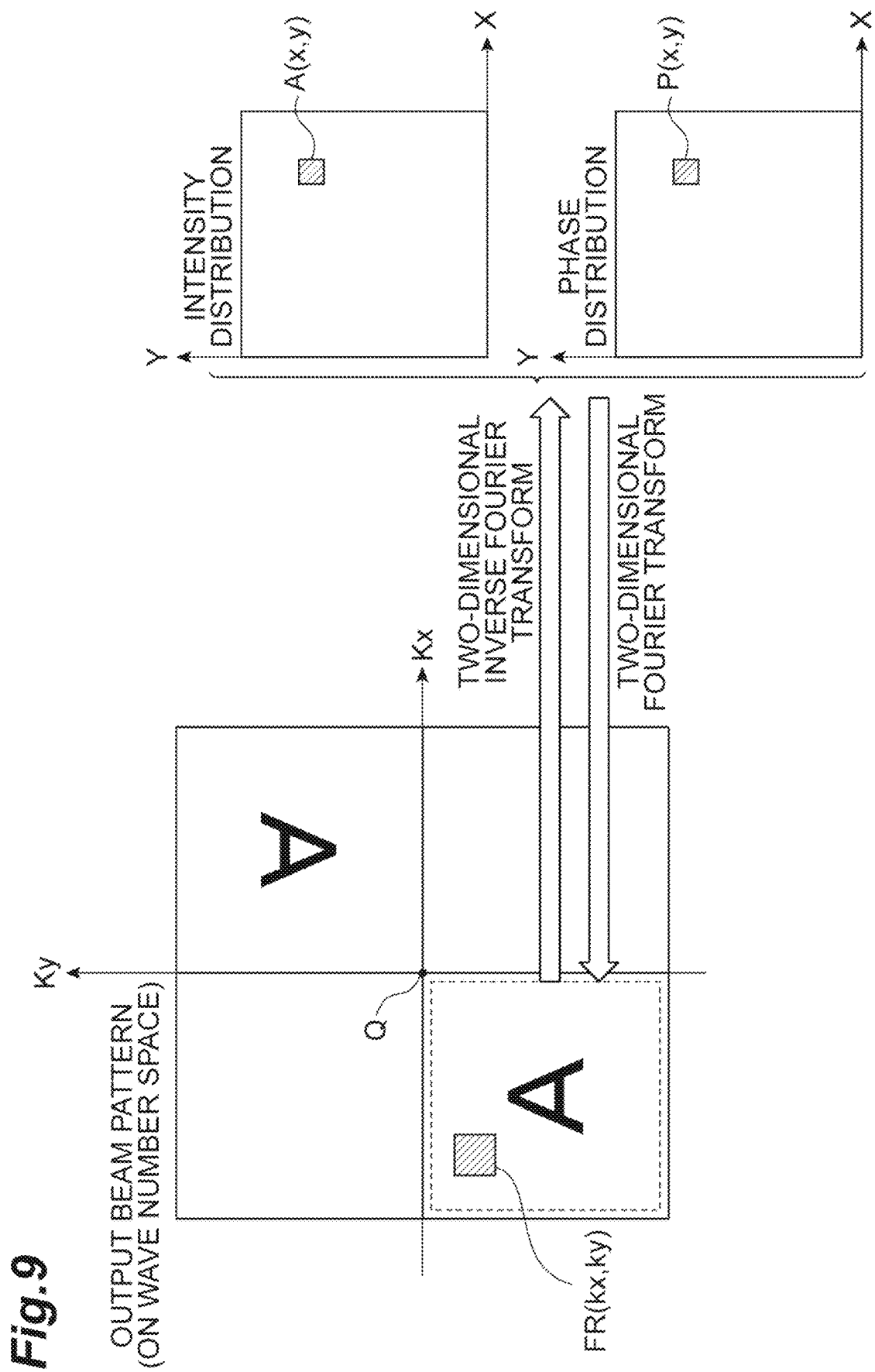
FIG. 9 is a diagram illustrating a relation between an output beam pattern (optical image) of the laser element and a rotation angle distribution in the second region.

FIG. 9 is a diagram illustrating a relation between the target output beam pattern (optical image) outputted from the laser element 1A and the distribution of the rotation angle φ(x, y) in the phase modulation layer 15A. Specifically, the Kx-Ky plane obtained by converting the beam projection region to be the projection range of the target output beam pattern (an installation surface of a design optical image expressed by the coordinates (x,y,z) in the XYZ orthogonal coordinate system) into the wave number space is considered. The Kx axis and the Ky axis that define the Kx-Ky plane are orthogonal to each other, and each of the Kx axis and the Ky axis is associated with an angle of the output direction of the target output beam pattern with respect to the normal direction when the output direction is swung from the normal direction (Z-axis direction) of the light output surface to the light output surface, by the above formulas (1) to (5). On the Kx-Ky plane, the specific region including the target output beam pattern is assumed to include M2 (an integer of 1 or more)×N2 (an integer of 1 or more) image regions FR each having a square shape. Further, a virtual square lattice set on the X-Y plane matched with the design surface of the phase modulation layer 15A is assumed to include M1 (an integer of 1 or more)×N1 (an integer of 1 or more) unit constituent regions R. The integer M2 does not need to be matched with the integer M1. Similarly, the integer N2 does not need to be matched with the integer N1. At this time, a complex amplitude F(x, y) in the unit constituent region R(x, y) obtained by performing two-dimensional inverse Fourier transform of each of the image regions FR ($k_x$, $k_y$) on the Kx-Ky plane to be specified by a coordinate component $k_x$ (an integer of from 0 to M2−1) in the Kx-axis direction and a coordinate component $k_y$ (an integer of from 0 to N2−1) in the Ky-axis direction into the unit constituent region R(x, y) specified by a coordinate component x (an integer of from 1 to M1) in the X-axis direction and a coordinate component y (an integer of from 1 to N1) in the Y-axis direction is given by the following formula (8) with j as an imaginary unit.

$$F(x, y) = \sum_{k_x=0}^{M2-1} \sum_{k_y=0}^{N2-1} FR(k_x, k_y) \exp\left[j2\pi\left(\frac{k_x}{M2}x + \frac{k_y}{N2}y\right)\right] \quad (8)$$

Further, in the unit constituent region R(x, y), when an amplitude term is set as A(x, y) and a phase term is set as P(x, y), the complex amplitude F(x, y) is defined by the following formula (9).

$$F(x,y) = A(x,y) \times \exp[jP(x,y)] \quad (9)$$

As shown in FIG. 9, in a range of the coordinate components x=1 to M1 and y=1 to N1, a distribution of the amplitude term A(x, y) in the complex amplitude F(x, y) of the unit constituent region R(x, y) corresponds to an intensity distribution on the X-Y plane. Further, in a range of x=1 to M1 and y=1 to N1, a distribution of the phase term P(x, y) in the complex amplitude F(x, y) of the unit constituent region R(x, y) corresponds to a phase distribution on the X-Y plane. As will be described later, the rotation angle φ(x, y) in the unit constituent region R(x, y) is obtained from P(x, y), and in the range of the coordinate components x=1 to M1 and y=1 to N1, a distribution of the rotation angle φ(x, y) of the unit constituent region R(x, y) corresponds to a rotation angle distribution on the X-Y plane.

A center Q of the output beam pattern on the Kx-Ky plane is located on an axis perpendicular to a first surface 100a, and four quadrants with the center Q as the origin are shown in FIG. 9. In FIG. 9, the case in which optical images are obtained in a first quadrant and a third quadrant is shown as an example. However, it is also possible to obtain images in a second quadrant and a fourth quadrant or all quadrants. In the present embodiment, as shown in FIG. 9, point-symmetric patterns with respect to the origin are obtained. In FIG. 9, the case where a character "A" is obtained in the third quadrant and a pattern obtained by rotating the character "A" by 180° is obtained in the first quadrant is shown as an example. In the case of rotationally symmetric optical images (for example, a cross, a circle, a double circle, or the like), they are overlapped and observed as one optical image.

The output beam pattern (optical image) from the laser element 1A is an optical image that corresponds to a design optical image (original image) expressed by at least one of a spot, a spot group consisting of three or more points, a straight line, a cross, a line drawing, a lattice pattern, a photograph, a stripe-like pattern, computer graphics (CG), and a character. Here, in order to obtain the target output beam pattern, the rotation angle φ(x, y) of the modified refractive index region 15b in the unit constituent region R(x, y) is determined by the following procedure.

In the unit constituent region R(x, y), as described above, the gravity center G of the modified refractive index region 15b is arranged away from the lattice point O(x, y) by the distance r (the value of r(x, y)). At this time, the modified refractive index region 15b is disposed in the unit constituent region R(x, y) so that the rotation angle 4p(x, y) satisfies the following relation.

$$\varphi(x,y) = C \times P(x,y) + B$$

C: proportional constant, for example, 180°/π
B: arbitrary constant, for example, 0

The proportional constant C and the arbitrary constant B have the same values for all the unit constituent regions R.

That is, when it is desired to obtain a desired optical image, by performing the optical image on the two-dimensional inverse Fourier transform, and a rotation angle distribution φ(x, y) according to a phase of a complex amplitude thereof may be given to the plurality of modified refractive index regions 15b. A far-field image after performing the Fourier transformation on the laser beam can take various shapes such as single or multiple spot shapes, annular shapes, linear shapes, character shapes, double annular shapes, or Laguerre-Gaussian beam shapes. Since the beam pattern is represented by angle information in a far field, in the case of a bitmap image or the like in which the target output beam pattern is represented by two-dimensional position information, the inverse Fourier transform may be performed on the beam pattern after the beam pattern is temporarily converted into the angle information.

As a method for obtaining the intensity distribution and the phase distribution from the complex amplitude distribution obtained by the inverse Fourier transform, for example, the intensity distribution (amplitude distribution A(x, y)) can be calculated by using an abs function of numerical analysis software "MATLAB" provided by MathWorks, and the phase distribution P(x, y) can be calculated by using an angle function of MATLAB.

Here, points of attention in the case where, when the rotation angle distribution φ(x, y) is obtained from the inverse Fourier transform result of the optical image and the arrangement of the modified refractive index regions 15b is determined, calculation is performed using general discrete Fourier transform (or fast Fourier transform) will be described. When an optical image before the Fourier transform is divided into four quadrants A1, A2, A3, and A4 as shown in FIG. 10A, an obtained beam pattern is as shown in FIG. 10B. That is, in the first quadrant of the beam pattern, a superimposed pattern of a pattern obtained by rotating a pattern of the first quadrant (FIG. 10A) by 180 degrees and a pattern of the third quadrant (FIG. 10A) appears. In the second quadrant of the beam pattern, a superimposed pattern of a pattern obtained by rotating a pattern of the second quadrant (FIG. 10A) by 180 degrees and a pattern of the fourth quadrant (FIG. 10A) appears. In the third quadrant of the beam pattern, a superimposed pattern of a pattern obtained by rotating a pattern of the third quadrant (FIG. 10A) by 180 degrees and a pattern of the first quadrant (FIG. 10A) appears. In the fourth quadrant of the beam pattern, a superimposed pattern of a pattern obtained by rotating a pattern of the fourth quadrant (FIG. 10A) by 180 degrees and a pattern of the second quadrant appears.

Therefore, when an optical image having a value in only the first quadrant is used as an optical image (original optical image) before the inverse Fourier transform, the first quadrant of the original optical image appears in the third quadrant of the obtained beam pattern, and a pattern obtained by rotating the first quadrant of the original optical image by 180 degrees appears in the first quadrant of the obtained beam pattern.

Figure 11:
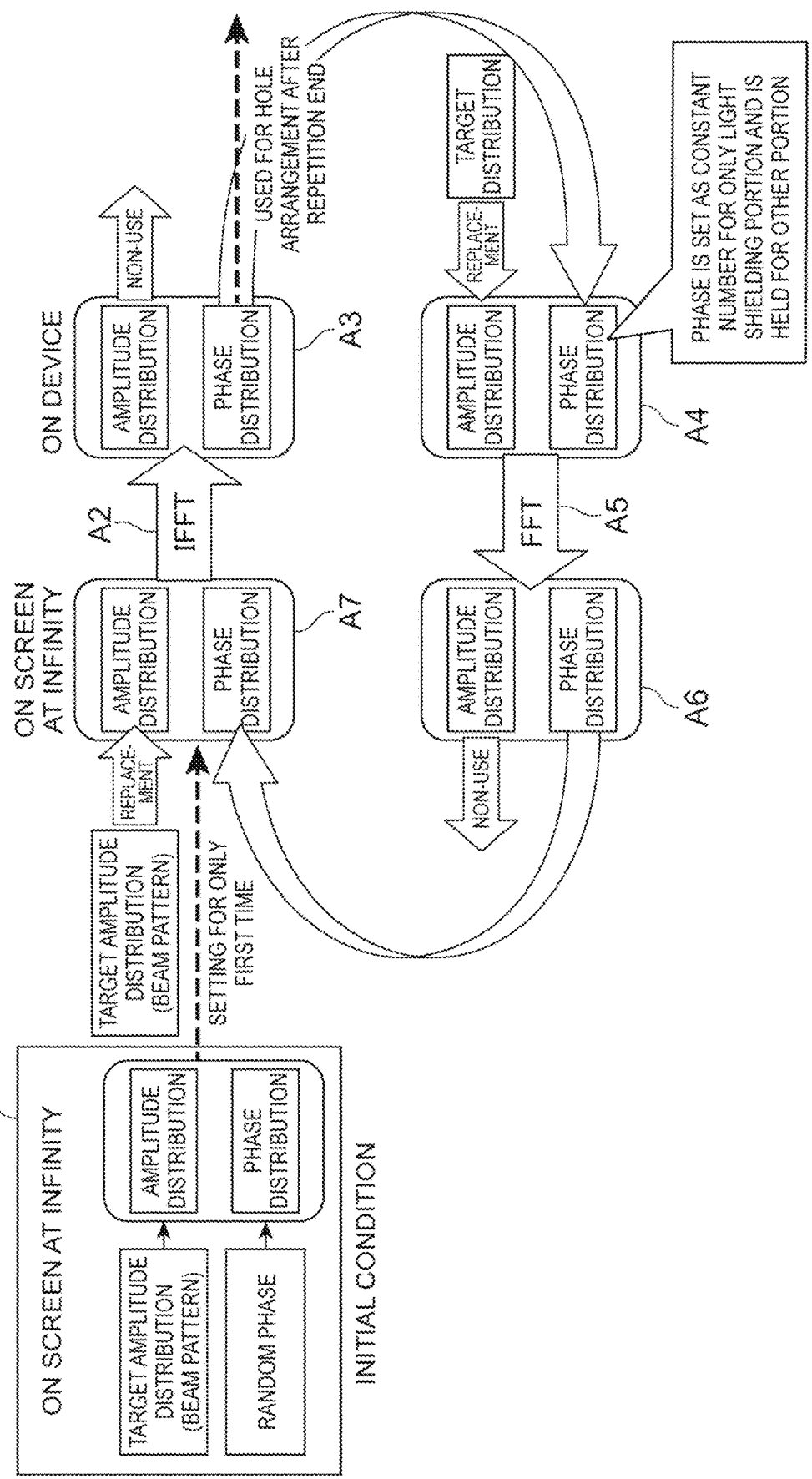
FIG. 11 is a conceptual diagram illustrating an iterative algorithm applied to a method for designing a phase modulation layer according to the present embodiment.

FIG. 11 is a conceptual diagram of an iterative algorithm applied to the method for designing a phase modulation layer according to the present embodiment. This iterative algorithm is based on a GS method. First, determination of the position of the gravity center G of the modified refractive index region by the above-described rotation method will be described. A target amplitude distribution is obtained from a square root of a target intensity distribution (beam pattern) on a screen at infinity (processing A1). At this time, the phase distribution is randomly set, and a complex amplitude distribution including the target amplitude distribution and the random phase distribution is set as an initial condition. Next, the inverse Fourier transform is performed on of the complex amplitude distribution (processing A2). As a result, the complex amplitude distribution in the phase modulation layer 15A is obtained (processing A3).

Subsequently, each of the amplitude distribution (that is, r(x, y)) and the phase distribution (that is, the rotation angle distribution φ(x, y)) of the complex amplitude distribution in the phase modulation layer 15A is replaced with the target distribution. For example, the amplitude distribution is replaced with the target distribution set as the constant value in the first region 151 and the second region 152, and the phase distribution is replaced with the target distribution set as the constant value in the first region 151 and holding the original value in the second region 152 (processing A4).

Subsequently, the Fourier transform is performed on the complex amplitude distribution including the amplitude distribution and the phase distribution after the replacement (processing A5). As a result, the complex amplitude distribution on the screen at infinity is obtained (processing A6). In the complex amplitude distribution, the amplitude distribution is replaced with the target amplitude distribution (beam pattern), and the phase distribution is maintained as it is (processing A7). By performing the inverse Fourier transform on the complex amplitude distribution including the amplitude distribution and the phase distribution (processing A2), the complex amplitude distribution in the phase modulation layer 15A is obtained again (processing A3). The above processing A2 to A7 are repeated a sufficient number of times. Further, in the finally obtained complex amplitude distribution in the phase modulation layer 15A, the phase distribution is used for the arrangement of the modified refractive index regions 15b in the phase modulation layer 15A. By such a method, the optical image is completed from the distribution of the modified refractive index region 15b of only the second region 152. At this time, the constant value is obtained for the phase distribution corresponding to the first region 151. However, since the modified refractive index region 15b of the first region 151 does not contribute to optical image formation, the position of the gravity center G of each of the plurality of modified refractive index regions 15b in the first region 151 may be arranged on the lattice point O of the virtual square lattice. Alternatively, the position of the gravity center G of each of the plurality of modified refractive index regions 15b in the first region 151 may be arranged to be away from the lattice point O of the virtual square lattice and have a constant rotation angle φ around the lattice point O, so as not to contribute to optical image formation. In the determination of the position of the gravity center G of the modified refractive index region by an on-axis shift method, which will be described later, the amplitude distribution is set randomly as the initial condition, while the phase distribution is set as the target phase distribution. That is, in a repetitive operation of the on-axis shift method, the amplitude distribution replacement operation in the on-axis shift method corresponds to the phase distribution replacement operation in the rotation method described above, and the phase distribution replacement operation in the on-axis shift method corresponds to the amplitude distribution replacement operation in the rotation method described above.

Figure 12A:
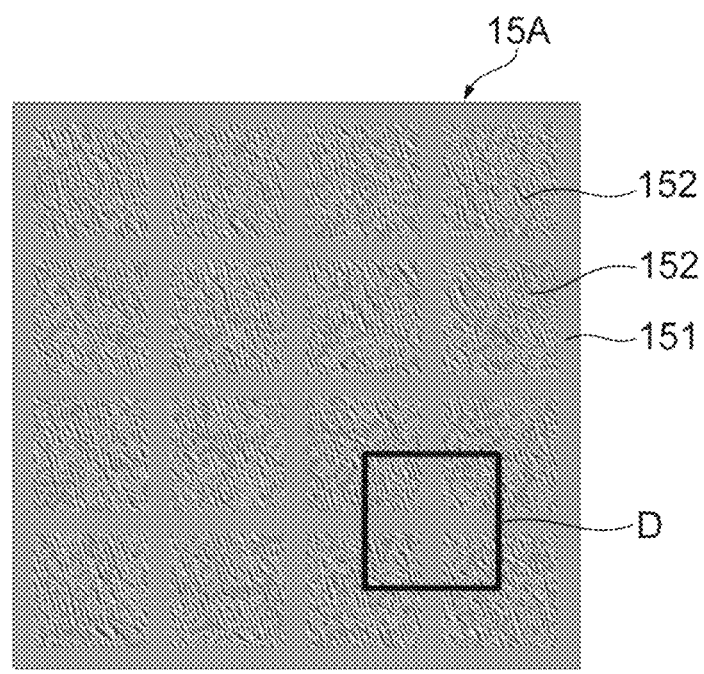
FIGS. 12A and 12B are diagrams showing a rotation angle distribution (that is, a phase distribution) in the entire phase modulation layer.
Figure 12B:
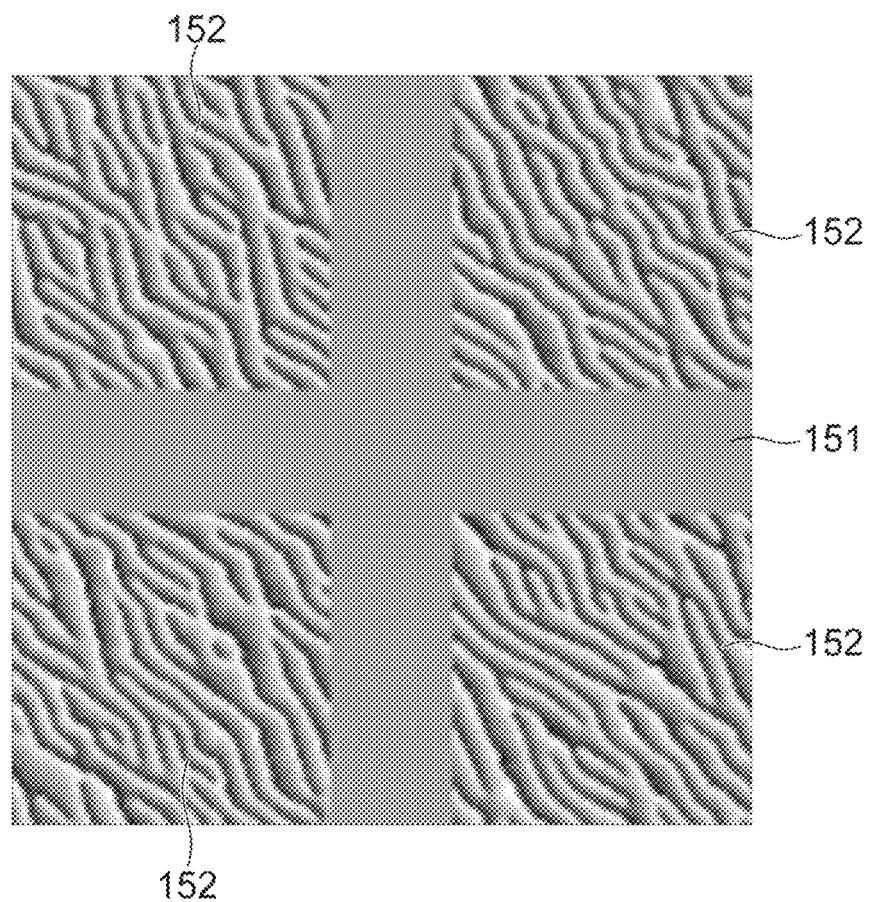

FIG. 12A is a diagram showing a distribution (that is, a phase distribution) of the rotation angle $\varphi$ in the entire phase modulation layer 15A generated by repeating the above-described repetitive operation 1000 times. Further, FIG. 12B is an enlarged view of a part D of FIG. 12A. In FIGS. 12A and 12B, the magnitude of the rotation angle $\varphi$ is shown by color shading. The rotation angle $\varphi$ changes in a range of 0 to $2\pi$. As shown in FIGS. 12A and 12B, in the first region 151, it can be seen that color shading is constant and the rotation angle $\varphi$ is constant. Further, in the second region 152, it can be seen that color shading configures a phase distribution corresponding to the Fourier transform of a desired beam pattern, and is set independently for each unit constituent region R according to a desired optical image.

Effects obtained by the laser element 1A and the method for designing the phase modulation layer 15A according to the present embodiment described above will be described. In the laser element 1A, the gravity center G of each of the plurality of modified refractive index regions 15b in the second region 152 of the phase modulation layer 15A is arranged so that a vector from the corresponding lattice point O of the virtual square lattice toward the gravity center G has a rotation angle according to the optical image around the corresponding lattice point O. Further, the optical image is completed by only the light component outputted from the second region 152 of the phase modulation layer 15A. As a result, without using the light component outputted from the first region 151 of the phase modulation layer 15A shielded by the electrode 16 and using only the light component from the second region 152 not to be shielded, the optical image is completed without missing information. Therefore, according to the laser element 1A, it is possible to suppress deterioration in the quality of the optical image caused by the part of the light outputted from the phase modulation layer 15A being blocked by the electrode 16.

In particular, when the optical image is outputted from the surface of the side of the upper cladding layer as in the laser element 1A according to the present embodiment, there is the case where a distance between the electrode of the side of the surface and the active layer cannot be sufficiently secured. In this case, in the conventional technology in which only one opening is provided in the electrode, the current concentrates in the peripheral portion of the active layer below the electrode, and it becomes difficult to diffuse the current to the vicinity of the center of the active layer. Therefore, an opening area of the electrode should be narrowed, and the number of modified refractive index regions in the opening, that is, in the light output surface is reduced (decrease in the resolution of the optical image). With respect to such a problem, according to the laser element 1A according to the present embodiment, the planar shape of the electrode 16 can be formed in a lattice shape while deterioration in the quality of the optical image is suppressed, so that the current can be easily diffused to the vicinity of the center of the active layer. Therefore, the resolution of the optical image can be improved by increasing the light output surface (increasing the number of modified refractive index regions in the light output surface).

Figure 13A:
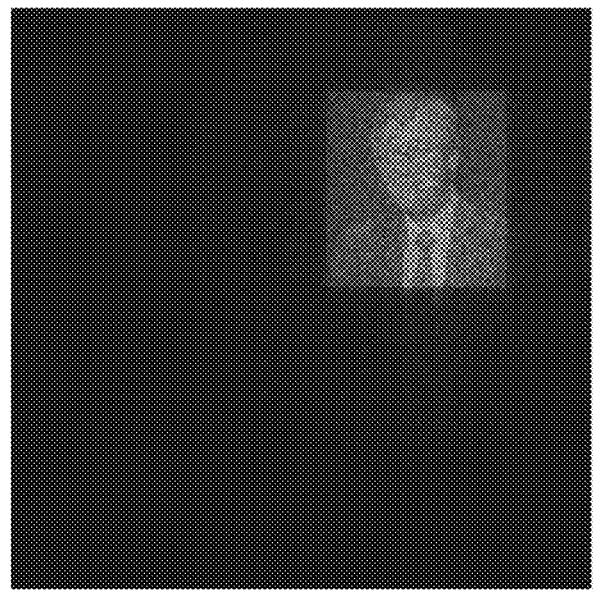
FIGS. 13A and 13B are diagrams showing an example of an optical image when the phase modulation layer has a phase distribution according to the optical image over the entire first region and second region, and an example of an optical image obtained by the phase modulation layer of the first embodiment.
Figure 13B:
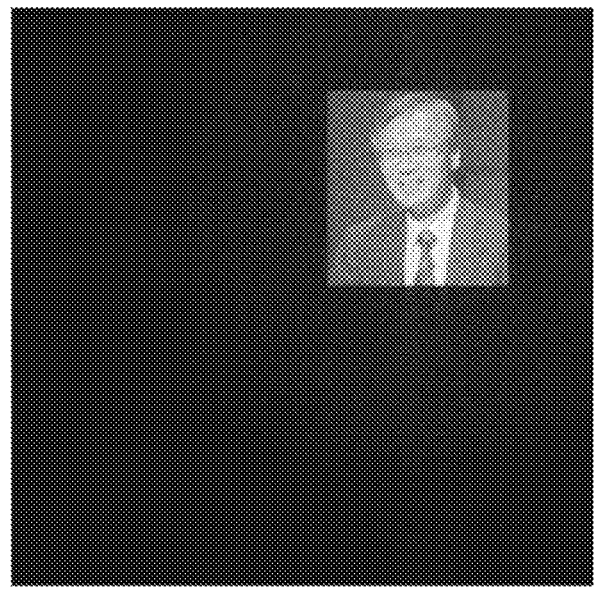

FIG. 13A shows an example of an optical image when the phase modulation layer 15A has a phase distribution according to the optical image over the entire first region 151 and second region 152 as a comparative example. This example is the optical image on the screen at infinity, which has been obtained by performing the Fourier transform on the case where the intensity of the portion overlapping the electrode 16 is set as 0 and the intensity of the other portion is set as 1, in the complex amplitude distribution calculated by maintaining the phase distribution in the processing A4 of FIG. 11 as it is. Further, FIG. 13B shows an example of an optical image obtained by the phase modulation layer 15A according to the present embodiment. This example is the optical image on the screen at infinity, which has been obtained by performing the Fourier transform on the case where the intensity of the portion overlapping the electrode 16 is set as 0 and the intensity of the other portion is set as 1, in the complex amplitude distribution obtained in the processing A4 shown in FIG. 11. Referring to FIG. 13A, it can be seen that the quality of the optical image is significantly deteriorated due to missing of information caused by shielding by the electrode 16. On the other hand, referring to FIG. 13B, it can be seen that a high-quality optical image having no missing of information is obtained.

Further, as in the laser element 1A according to the present embodiment, the optical image is outputted from the surface of the side of the upper cladding layer 13, so that light absorption in the semiconductor substrate 10 is reduced. As a result, light output efficiency of the laser element 1A can be increased. Such a configuration is particularly effective for the case of outputting an optical image of an infrared region.

As in the present embodiment, the gravity center G of each of the plurality of modified refractive index regions 15b included in the first region 151 is arranged on the lattice point O of the virtual square lattice. Alternatively, the gravity center G of each of the plurality of modified refractive index regions 15b in the first region 151 may be arranged away from the lattice point O of the virtual square lattice, and a vector from the corresponding lattice point O toward the gravity center G may have a rotation angle unrelated to the optical image around the corresponding lattice point O. The light component outputted from the first region 151 is shielded by the electrode 16. Therefore, the gravity center G of each of the plurality of modified refractive index regions 15b in the first region 151 may be arranged in an arbitrary manner. However, according to such an arrangement, the phase modulation layer 15A can be easily formed. The gravity center G of each of the plurality of modified refractive index regions 15b in the first region 151 does not contribute to the formation of the optical image. Therefore, in the first region 151, for example, a random rotation angle $\varphi$ may be set while the distance r from the lattice point O of the virtual square lattice is constantly maintained. Alternatively, r may be set as 0 to match the modified refractive index region 15b with the lattice point O of the virtual square lattice.

As in the present embodiment, the planar shape of the electrode 16 may be a lattice shape. When the electrode 16 has such a shape, a part of the electrode 16 can be disposed in the vicinity of the center portion of the light output surface. Thereby, the can be sufficiently supplied also to the vicinity of the center portion of the active layer 12, and the area of the light output surface can be increased. Further, the current can be sufficiently supplied to the vicinity of the center portion of the active layer 12 without increasing the thickness of the upper cladding layer 13.

The width W1 of the first region 151 may be larger than the width W2 of the electrode 16. By the width W1 of the first region 151 larger than the width W2 of the electrode 16, it is possible to avoid the electrode 16 from shielding the second region 152 even when the formation position of the electrode 16 is slightly shifted from the design position. Therefore, it is possible to suppress deterioration in the quality of the optical image due to the electrode 16 shielding the second region 152.

According to the method for designing the phase modulation layer 15A according to the present embodiment, it is possible to easily calculate the arrangement of the gravity center G of each of the modified refractive index regions 15b that can complete the optical image by only the second region 152, by performing the repetitive operation. Further, in the present embodiment, in the processing A4, each of the amplitude distribution (that is, r(x, y)) and the phase distribution (that is, the rotation angle distribution φ(x, y)) of the complex amplitude distribution in the phase modulation layer 15A is replaced with the target distribution. For example, by the above processing, setting the position of the gravity center G of each of the plurality of modified refractive index regions 15b in the first region 151 on the lattice point O of the virtual square lattice can be used as a constraint condition. Further, even if setting is performed so that the position of the gravity center G of each of the plurality of modified refractive index regions 15b in the first region 151 is away from the lattice point O of the virtual square lattice and the vector from the corresponding lattice point O toward the gravity center G has a constant rotation angle φ around the corresponding lattice point O, the setting can be used as the constraint condition.

Figure 16A:
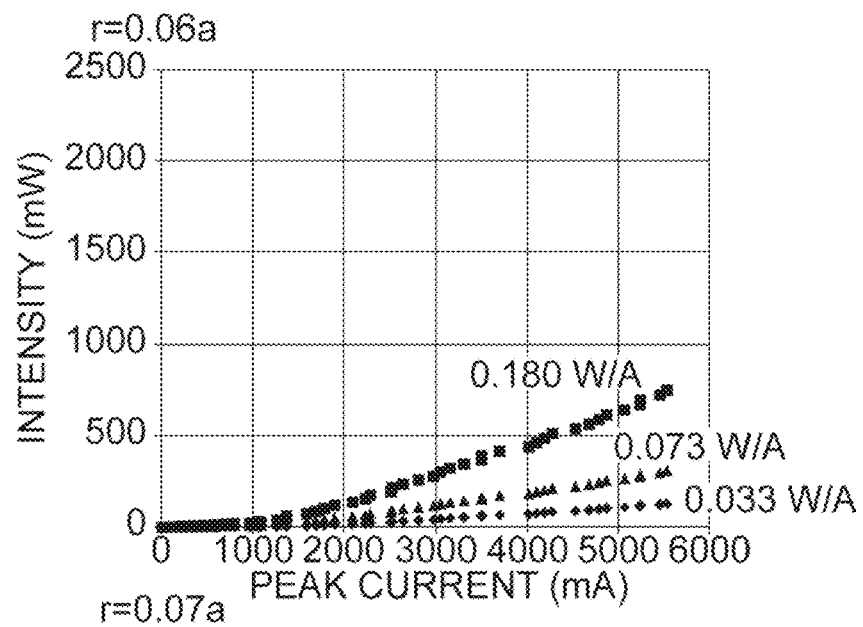
FIGS. 16A to 16C are graphs showing a result of examining a relation between a peak current and an output light intensity while changing a distance between the gravity center of the modified refractive index region and the lattice point.
Figure 16B:
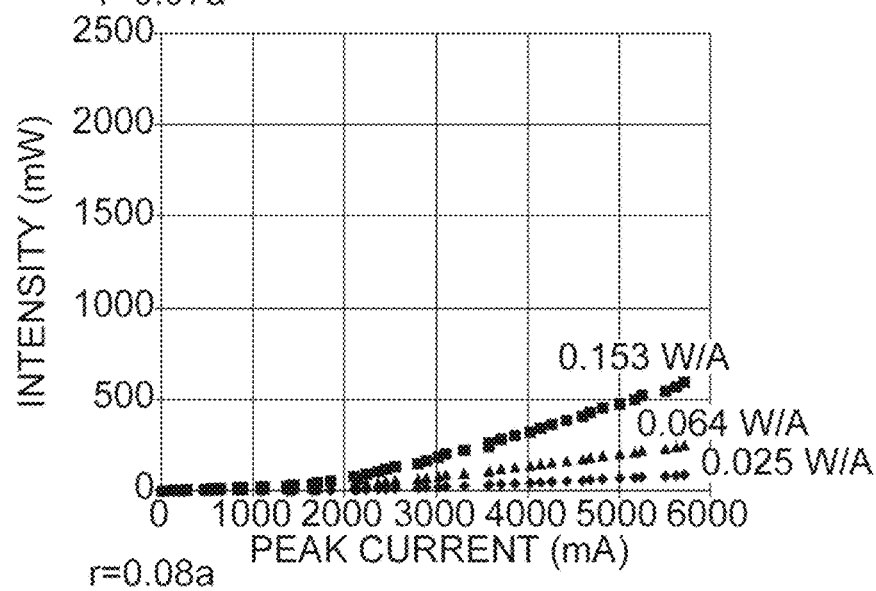
Figure 16C:
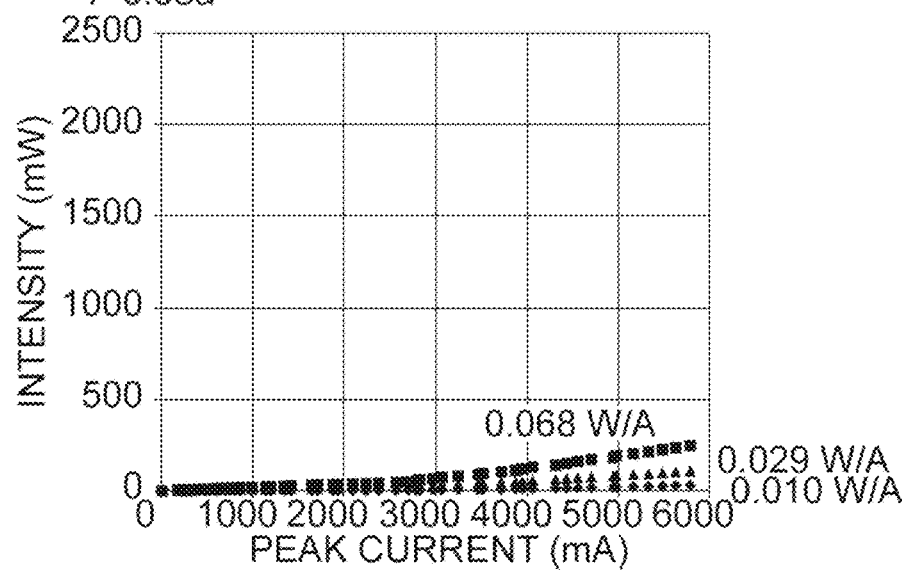
Figure 17:
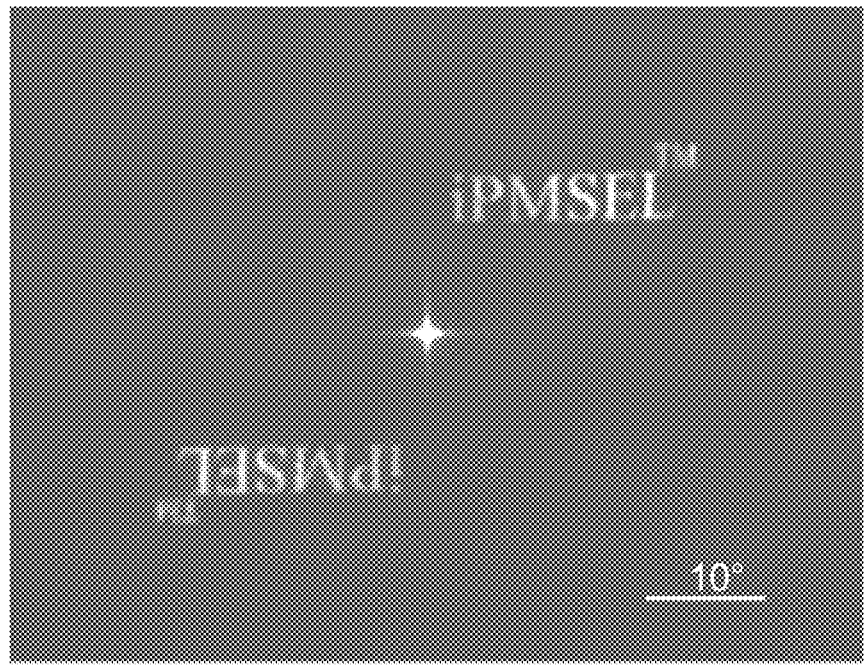
FIG. 17 shows an optical image used in calculating the graphs of FIGS. 14A to 14C, 15A to 15C and 16A to 16C.

Further, according to the knowledge of the present inventors, the current required for laser oscillation (oscillation threshold current) can be decreased when the gravity center G of the plurality of modified refractive index regions 15b is closer to the lattice point O of the virtual square lattice. FIGS. 14A to 14C, 15A to 15C, and 16A to 16C are graphs showing a result of examining a relation between a peak current and an output light intensity while changing a distance between the gravity center G of the modified refractive index region 15b and the lattice point O. In these drawings, a vertical axis represents the light intensity (unit: mW) and a horizontal axis represents the peak current (unit: mA). A rhombus plot shows the light intensity of the zero-order light, a triangle plot shows the light intensity of the (each) signal light, and a quadrangle plot shows the total light intensity. Further, FIGS. 14A to 14C show the case where the distance r between the gravity center G and the lattice point O is 0 (that is, when the gravity center G and the lattice point O are matched with each other), the case where the distance r is 0.01a, and the case where the distance r is 0.02a, respectively. FIGS. 15A to 15C show the case where the distance r is 0.03a, the case where the distance r is 0.04a, and the case where the distance r is 0.05a, respectively. FIGS. 16A to 16C show the case where the distance r is 0.06a, the case where the distance r is 0.07a, and the case where the distance r is 0.08a, respectively. Note that a is a lattice constant of the virtual square lattice. FIG. 17 shows an optical image used for calculating the graphs of FIGS. 14A to 14C, 15A to 15C, and 16A to 16C.

Referring to FIGS. 14A to 14C, 15A to 15C, and 16A to 16C, it can be seen that a ratio (In1/In0) between the light intensity In0 of the zero-order light and the light intensity In1 of the signal light increases when the distance r increases. That is, when the distance r increases, it is possible to increase the light intensity of the signal light with respect to the zero-order light. On the other hand, when the distance r decreases, the larger light intensity is obtained with the smaller current. That is, when the distance r decreases, light output efficiency increases and the current required for laser oscillation (oscillation threshold current) can be reduced. Further, when the distance r is 0, the oscillation threshold current is minimized. In the second region 152, the certain distance r is required to form the optical image. However, since the first region 151 does not contribute to the formation of the optical image, the distance r can be arbitrarily selected. Therefore, if the gravity center G of the plurality of modified refractive index regions 15b in the first region 151 is arranged on the lattice point O of the virtual square lattice, the oscillation threshold current can be effectively reduced.

In the phase modulation layer 15A, the distance r between each lattice point O of the virtual square lattice and the gravity center G of the corresponding modified refractive index region 15b is preferably a constant value over the entire phase modulation layer 15A. Thereby, when the phase distribution in the entire phase modulation layer 15A is equally distributed from 0 to 2π (rad), the gravity center G of the modified refractive index region 15b is matched with the lattice point O of the square lattice on average. Therefore, since the two-dimensional distribution Bragg diffraction effect in the phase modulation layer 15A approaches the two-dimensional distribution Bragg diffraction effect when the modified refractive index region is disposed on each lattice point O of the square lattice, a standing wave can be easily formed, and a reduction in the threshold current for oscillation can be expected.

Further, FIGS. 5, 7, and 8 show examples in which the planar shape of the modified refractive index region 15b on the design surface of the phase modulation layer 15A matched with the X-Y plane is a circular shape. However, the modified refractive index region 15b may have the planar shape other than the circular shape. For example, the planar shape of the modified refractive index region 15b on the X-Y plane may have mirror-image symmetry (line symmetry). Here, the mirror-image symmetry (line symmetry) means that the planar shape of the modified refractive index region 15b located on one side of an arbitrary straight line along the X-Y plane and the planar shape of the modified refractive index region 15b located on the other side of the straight line can be mirror-image symmetric (line symmetric) with each other. Examples of a shape having the mirror-image symmetry (line symmetry) include a perfect circle shown in FIG. 18A, a square shown in FIG. 18B, a regular hexagon shown in FIG. 18C, a regular octagon shown in FIG. 18D, a regular hexadecagon shown in FIG. 18E, a rectangle shown in FIG. 18F, an ellipse shown in FIG. 18G, and the like. As described above, the planar shape of the modified refractive index region 15b on the X-Y plane has the mirror-image symmetry (line symmetry). As a result, in the phase modulation layer 15A, the angle φ formed by the X axis and the direction from each lattice point of the virtual square lattice toward the gravity center of each corresponding modified refractive index region 15b can be determined with high accuracy (patterning with high accuracy is possible).

Further, the planar shape of the modified refractive index region 15b on the X-Y plane may be a shape having no rotation symmetry of 180°. Examples of the planar shape include a regular triangle shown in FIG. 19A, an isosceles right triangle shown in FIG. 19B, a shape shown in FIG. 19C in which a part of two circles or ellipses overlap, an oval shape shown in FIG. 19D, a teardrop shape shown in FIG. 19E, an isosceles triangle shown in FIG. 19F, an arrow shape shown in FIG. 19G, a trapezoid shown in FIG. 19H, a pentagon shown in FIG. 19I, a shape shown in FIG. 19J in which two rectangles partially overlap, a shape shown in FIG. 19K in which two rectangles partially overlap and do not have mirror-image symmetry, and the like. The oval shape is a shape deformed so that a dimension in a minor-axis direction near one end along a major axis of an ellipse becomes smaller than a dimension in the minor-axis direction near the other end. The teardrop shape is a shape in which one end along the major axis of the ellipse is deformed into a sharp end protruding along a major-axis direction. Further, the arrow shape is a shape in which one side of a rectangle is recessed in a triangular shape and the opposite side is pointed in a triangular shape. As described above, since the planar shape of the modified refractive index region 15b on the X-Y plane does not have the rotation symmetry of 180°, a stronger light output can be obtained.

First Modification

Figure 20:
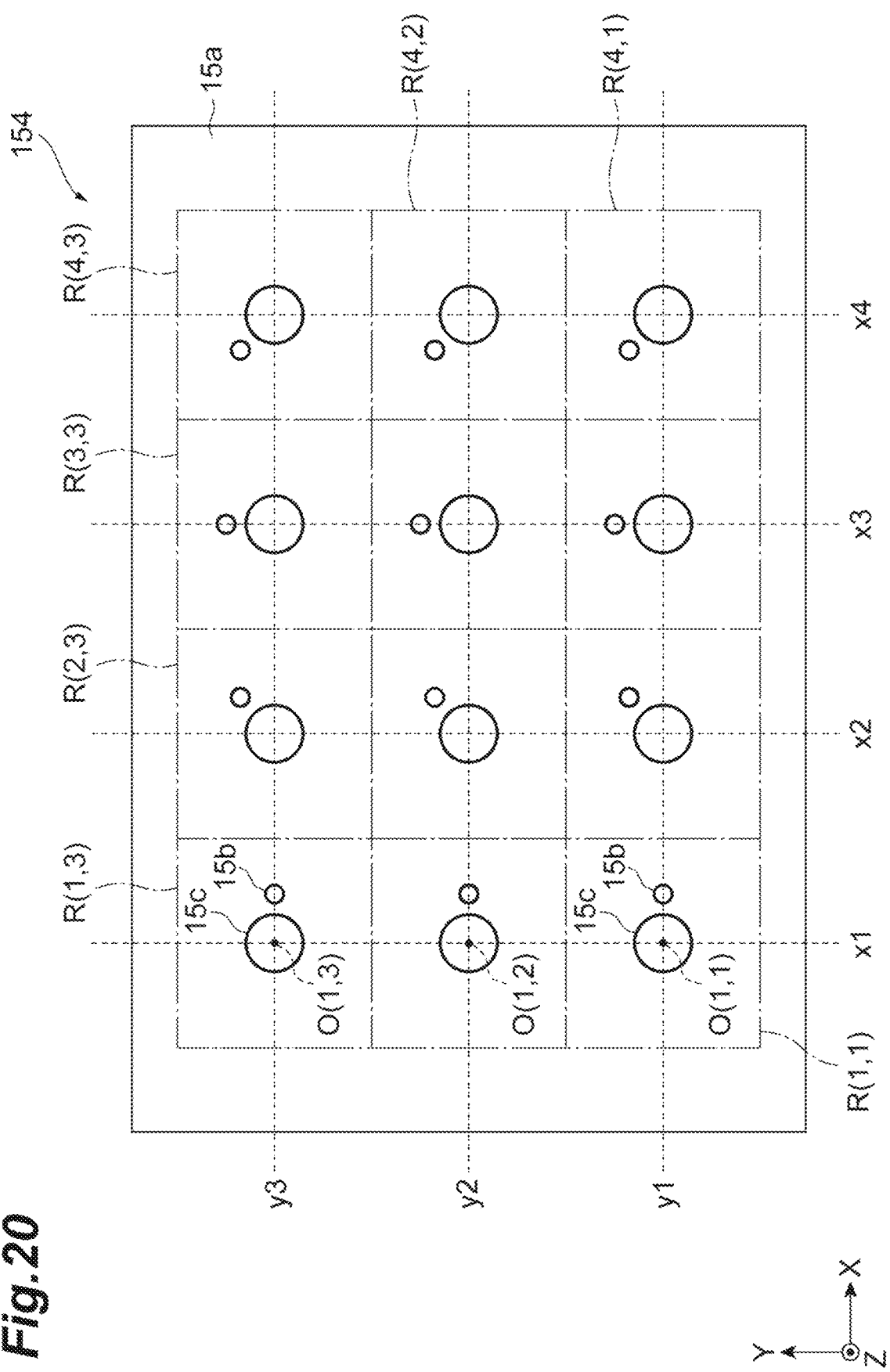
FIG. 20 is a plan view of a second region according to a first modification, and is a diagram illustrating another example of an arrangement pattern (rotation method) of modified refractive index regions in a part of the second region.
Figure 21:
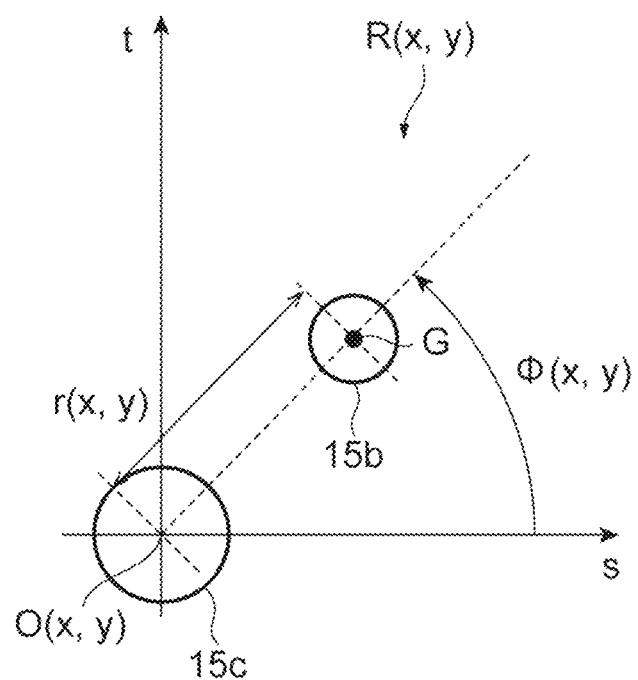
FIG. 21 is a diagram illustrating a position relation between a gravity center of a modified refractive index region and a lattice point in a virtual square lattice, as another example of an arrangement pattern determined by a rotation method.

FIG. 20 is a plan view of a second region 154 according to a modification of the embodiment. The second region 152 of the above embodiment may be replaced with the second region 154 of the present modification. The second region 154 of the present modification further has a plurality of modified refractive index regions 15c different from the plurality of modified refractive index regions 15b, in addition to the configuration of the second region 152 of the above embodiment. Each of the modified refractive index regions 15c includes a periodic structure, and includes a second refractive index medium having a refractive index different from that of the first refractive index medium of the basic layer 15a. Similarly to the modified refractive index region 15b, the modified refractive index region 15c may be a hole or may be configured by embedding a compound semiconductor in the hole. Here, as shown in FIG. 21, even in the present modification, in the unit constituent region R(x, y) defined by the s axis parallel to the X axis and the t axis parallel to the Y axis, the angle formed by the vector from the lattice point O toward the gravity center G and the s axis is $\varphi(x, y)$. The coordinate component x indicates a position of the x-th lattice point on the X axis, and the coordinate component y indicates a position of the y-th lattice point on the Y axis. When the rotation angle $\varphi$ is 00°, a direction of a vector connecting the lattice point O and the gravity center G is matched with a positive direction of the X axis. Further, the length of the vector from the lattice point O toward the gravity center G is set as r(x, y). In one example, r(x, y) is constant (over the entire second region 154) regardless of the coordinate component x and the coordinate component y, that is, regardless of the position of the unit constituent region R.

Each modified refractive index region 15c is provided in a one-to-one correspondence relation with each modified refractive index region 15b. Further, each modified refractive index region 15c is located on the lattice point O of the virtual square lattice, and in one example, the gravity center of each modified refractive index region 15c is matched with the lattice point O of the virtual square lattice. The planar shape of the modified refractive index region 15c is, for example, a circular shape, but may have various planar shapes similarly to the modified refractive index region 15b. FIGS. 22A to 22K are diagrams showing examples of a planar shape and a relative relation of the modified refractive index regions 15b and 15c on the X-Y plane. FIGS. 22A and 22B show a form in which the modified refractive index regions 15b and 15c have figures of the same shapes and have the gravity centers separated from each other. FIGS. 22C and 22D show a form in which the modified refractive index regions 15b and 15c have figures of the same shapes, have the gravity centers separated from each other, and partially overlap. FIG. 22E shows a form in which the modified refractive index regions 15b and 15c have figures of the same shapes and have the gravity centers separated from each other, and relative angles of the modified refractive index regions 15b and 15c are arbitrarily set for each lattice point (the modified refractive index regions 15b and 15c are rotated by arbitrary angles). FIG. 22F shows a form in which the modified refractive index regions 15b and 15c have figures of different shapes and have the gravity centers separated from each other. FIG. 22G shows a form in which the modified refractive index regions 15b and 15c have figures of different shapes and have the gravity centers separated from each other, and relative angles of the modified refractive index regions 15b and 15c are arbitrarily set for each lattice point (the modified refractive index regions 15b and 15c are rotated by arbitrary angles). Among them, in FIGS. 22E and 22G, the two modified refractive index regions 15b and 15c rotate so as not to overlap each other.

Further, as shown in FIGS. 22H to 22K, the modified refractive index region 15b may be configured to include two regions 15b1 and 15b2 separated from each other. Further, a combined gravity center of the regions 15b and 15b2 and the gravity center of the modified refractive index region 15c are separated from each other, and an angle with respect to the s axis of a line segment connecting the regions 15b1 and 15b2 may be arbitrarily set for each unit constituent region R. In this case, as shown in FIG. 22H, the regions 15b and 15b2 and the modified refractive index region 15c may have figures of the same shapes. Alternatively, as shown in FIG. 22I, the two figures of the regions 15b1 and 15b2 and the modified refractive index region 15c may be different from the other. Further, as shown in FIG. 22J, in addition to the angle with respect to the X axis of the straight line connecting the regions 15b1 and 15b2, the angle with respect to the X axis of the modified refractive index region 15c may be arbitrarily set for each unit constituent region R. Further, as shown in FIG. 22K, while the regions 15b1 and 15b2 and the modified refractive index region 15c maintain the same relative angle, the angle with respect to the s axis of the straight line connecting the regions 15b1 and 15b2 may be set for each unit constituent region R. Among them, in FIGS. 22J and 22K, the regions 15b1 and 15b2 may rotate so as not to overlap the modified refractive index region 15c.

Figure 23:
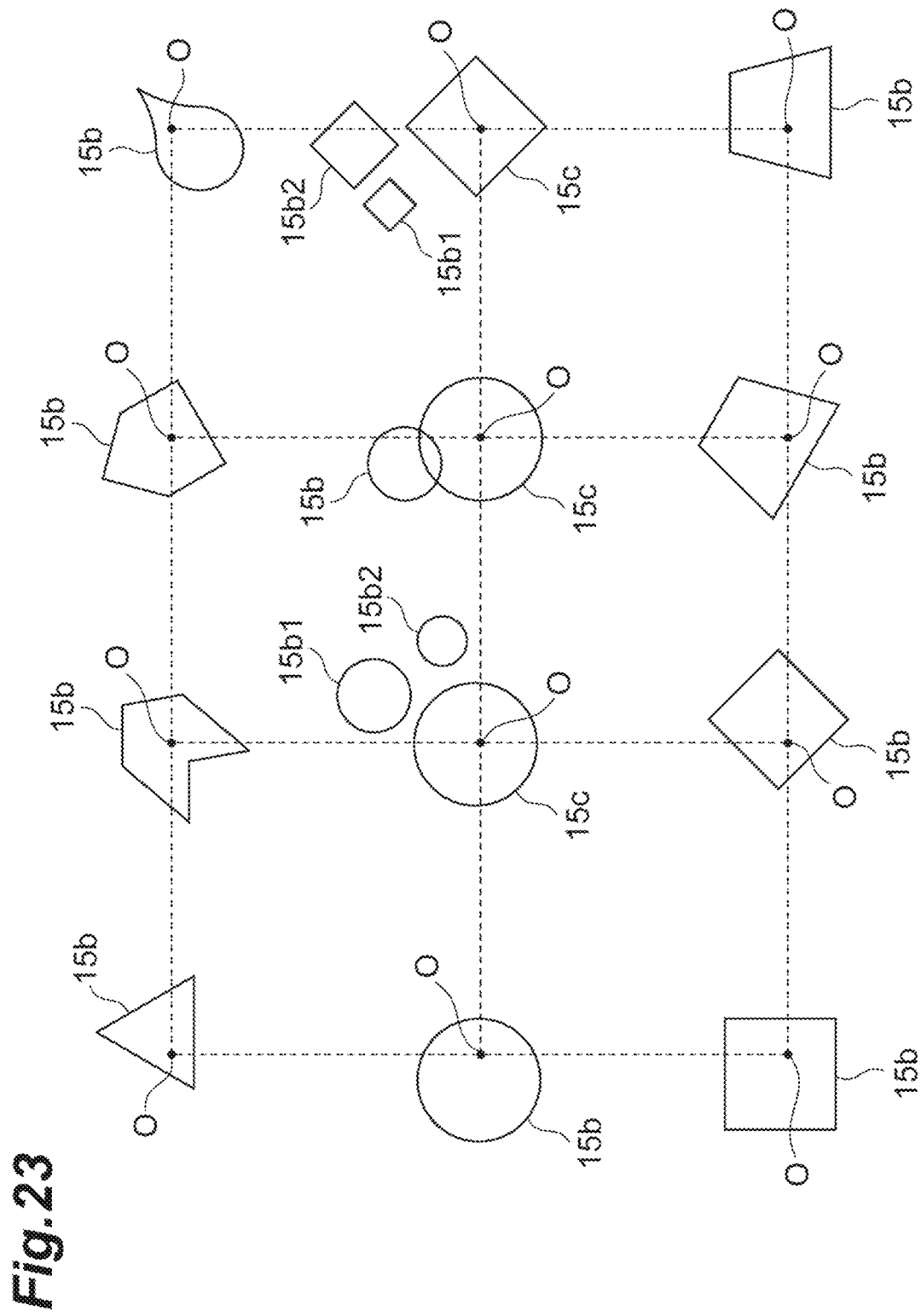
FIG. 23 is a diagram showing an application example (rotation method) of the planar shape of the modified refractive index region.

The planar shapes of the modified refractive index regions on the X-Y plane may be the same between the lattice points. That is, the modified refractive index regions may have the same figures at all lattice points, and may be superimposed on each other between the lattice points by a translation operation or the translation operation and a rotation operation. In that case, generation of noise light and zero-order light becoming noise in the beam pattern can be reduced. Alternatively, the shapes of the modified refractive index regions in the X-Y plane are not necessarily the same between the lattice points. For example, as shown in FIG. 23, the shapes may be different between adjacent lattice points.

Figure 24:
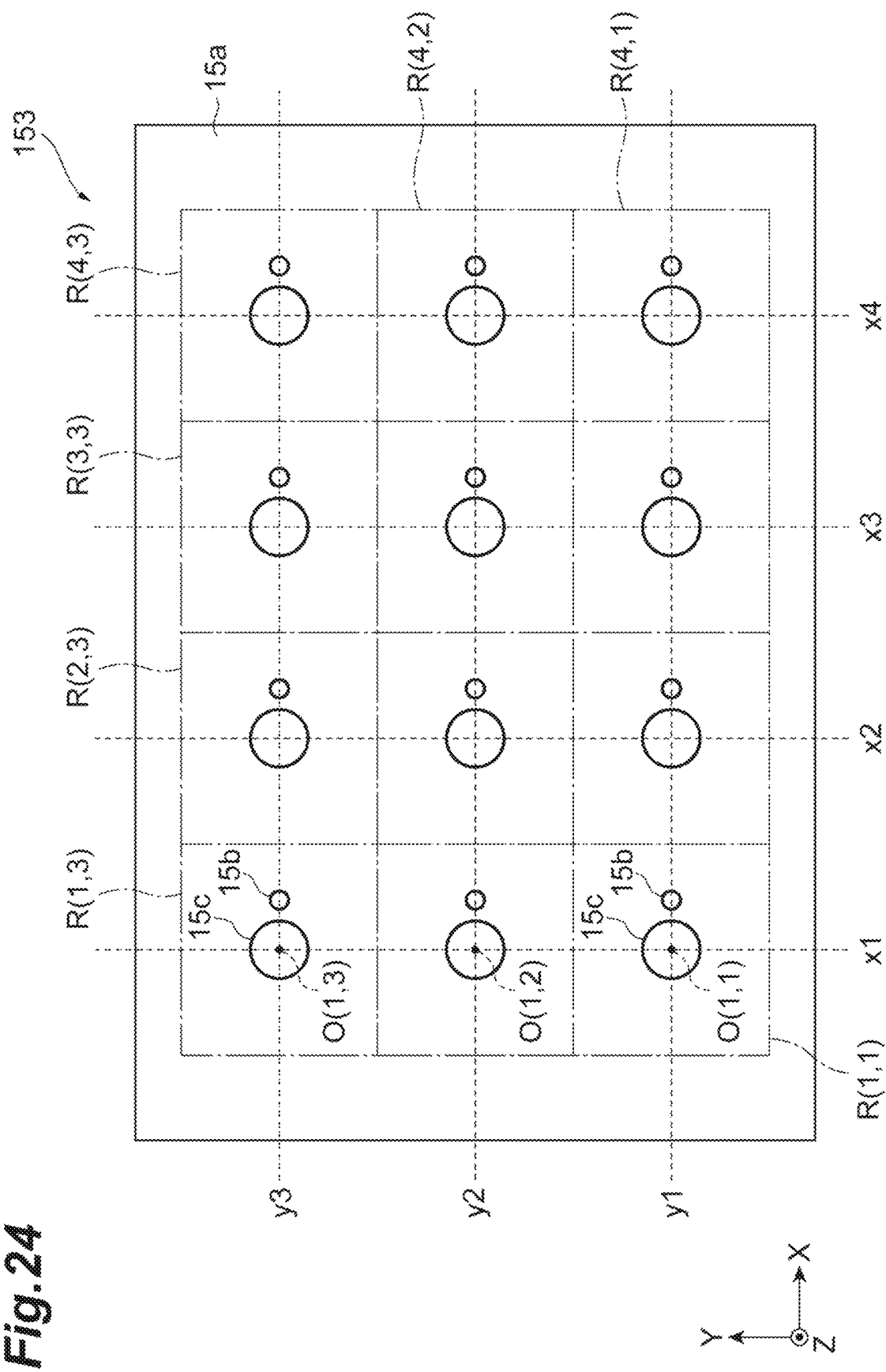
FIG. 24 is a plan view of a part of the first region in the first modification.

FIG. 24 is a plan view of a part of a first region 153 in the present modification. The first region 151 of the above embodiment may be replaced with the first region 153 of the present modification. The first region 153 of the present modification further has a plurality of modified refractive index regions 15c different from the plurality of modified refractive index regions 15b, in addition to the configuration (refer to FIG. 8) of the first region 151 of the above embodiment. Each modified refractive index region 15c is located on the lattice point O of the virtual square lattice, and in one example, the gravity center of each modified refractive index region 15c is matched with the lattice point O of the virtual square lattice. The modified refractive index regions 15b and 15c may partially overlap each other or may be separated from each other. Further, FIG. 24 shows an example in which the planar shapes of the modified refractive index regions 15b and 15c are circular shapes. However, as the planar shapes of the modified refractive index regions 15b and 15c, for example, various planar shapes as shown in FIGS. 18A to 18G are applicable.

For example, even in the configuration of the phase modulation layer as in the present modification, the effects of the above embodiment can be suitably achieved.

Second Modification

Next, the case of determining an arrangement pattern of the modified refractive index regions 15b in the phase modulation layer 15A by an on-axis shift method will be described. As a method for determining the arrangement pattern of the modified refractive index regions 15b in the phase modulation layer 15A, even when the on-axis shift method is applied instead of the rotation method described above, the obtained phase modulation layer is applied to the semiconductor light-emitting module according to the various embodiments described above.

Figure 25:
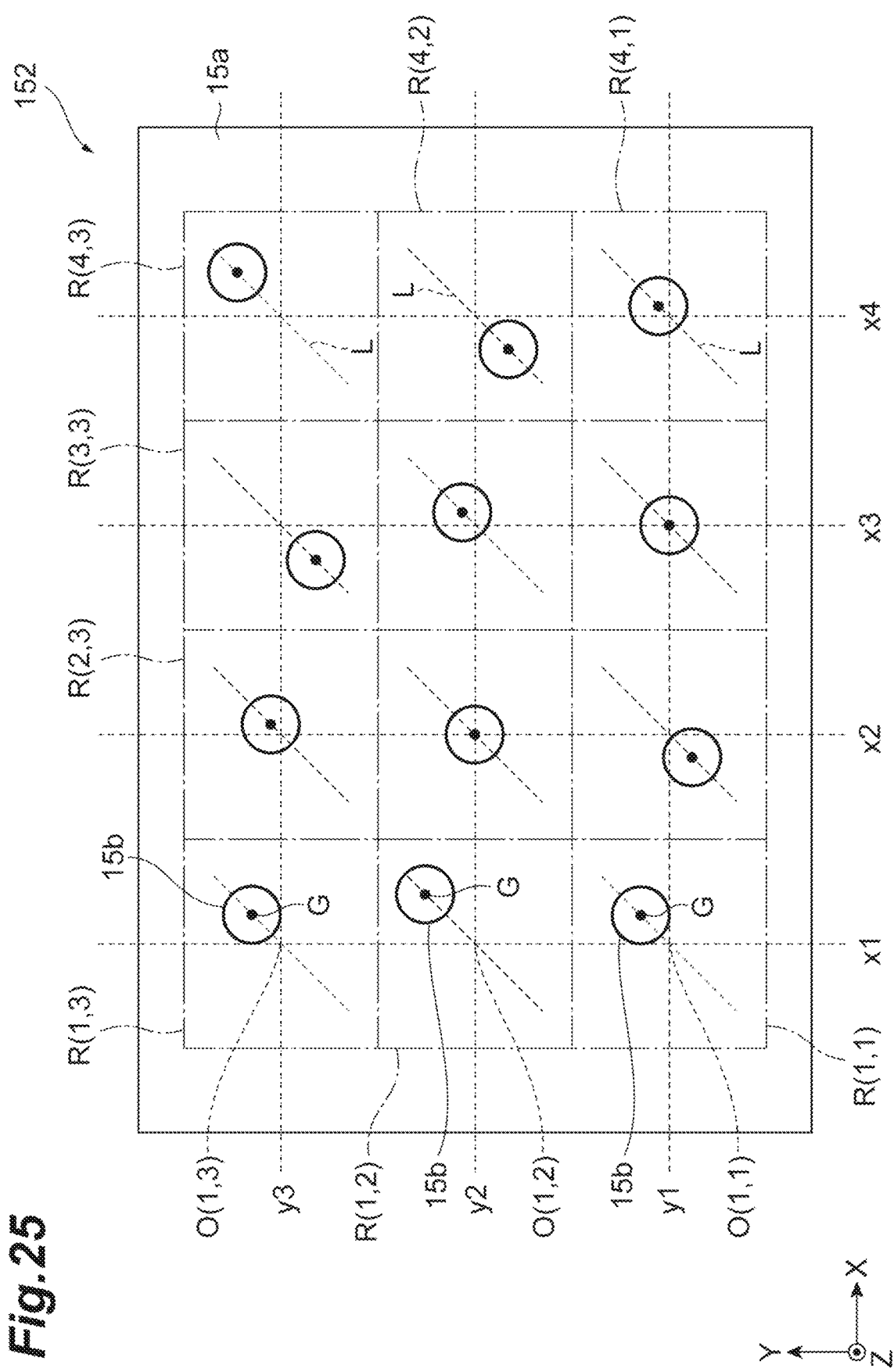
FIG. 25 is a diagram illustrating an example of an arrangement pattern (on-axis shift method) of the modified refractive index regions in the second region of the phase modulation layer.

FIG. 25 is a diagram illustrating the arrangement pattern (on-axis shift method) of the modified refractive index regions 15b in a part of the second region 152 of the phase modulation layer 15A. The phase modulation layer 15A includes a basic layer 15a and modified refractive index regions 15b having refractive indexes different from the refractive index of the basic layer 15a. Here, similarly to the example of FIG. 5, in the phase modulation layer 15A, a virtual square lattice defined on the X-Y plane is set. One side of the square lattice is parallel to the X axis, and the other side is parallel to the Y axis. At this time, square unit constituent regions R centering on the lattice point O of the square lattice are set two-dimensionally over a plurality of columns (x1 to x4) along the X axis and a plurality of rows (y1 to y3) along the Y axis. If the coordinates of each unit constituent region R are given by the position of the gravity center G of each unit constituent region R, the position of the gravity center is matched with the lattice point O of the virtual square lattice. The plurality of modified refractive index regions 15b are provided one by one in each unit constituent region R. The planar shape of the modified refractive index region 15b is, for example, a circular shape. The lattice point O may be located outside the modified refractive index region 15b or may be included inside the modified refractive index region 15b.

A ratio of an area S of the modified refractive index region 15b in one unit constituent region R is called a filling factor (FF). When the lattice interval of the square lattice is set as a, the filling factor FF of the modified refractive index region 15b is given as $S/a^2$. S indicates an area of the modified refractive index region 15b in the X-Y plane. When the modified refractive index region 15b has a shape of a perfect circle, for example, S is given as $S=\pi(d/2)^2$ using a diameter d of the perfect circle. Further, when the modified refractive index region 15b has a shape of a square, S is given as $S=LA^2$ using a length LA of one side of the square.

Figure 26:
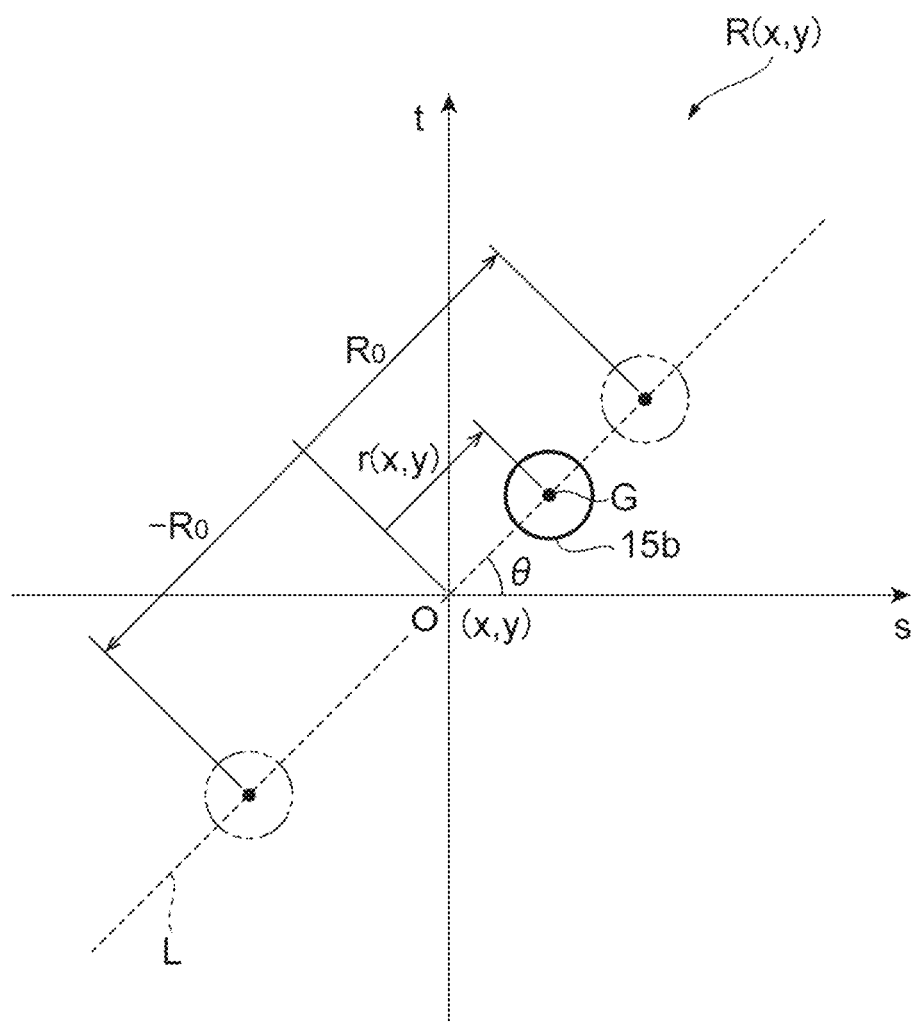
FIG. 26 is a diagram illustrating a position relation between the gravity center of the modified refractive index region and the lattice point in the virtual square lattice, as an example of an arrangement pattern determined by an axis shift method.

FIG. 26 is a diagram illustrating a position relation between a gravity center G of the modified refractive index region 15b and a lattice point O(x, y) in the virtual square lattice, as an example of an arrangement pattern determined by an axis shift method. As shown in FIG. 26, the gravity center G of each modified refractive index region 15b is arranged on a straight line L. The straight line L is a straight line that passes through the corresponding lattice point O(x, y) of the unit constituent region R(x, y) and is tilted with respect to each side of the square lattice. In other words, the straight line L is a straight line that is tilted with respect to both the s axis and the t axis that define the unit constituent region R(x, y). A tilt angle of the straight line L with respect to the s axis is θ. The tilt angle θ is constant in the phase modulation layer 15A. The tilt angle θ satisfies 0°<θ<90°, and in one example, the tilt angle θ is θ=45°. Alternatively, the tilt angle θ satisfies 180°<θ<270°, and in one example, the tilt angle θ is θ=225°. When the tilt angle θ satisfies 0°<θ<90° or 180°<θ<270°, the straight line L extends from a first quadrant to a third quadrant of a coordinate plane defined by the s axis and the t axis. Alternatively, the tilt angle θ satisfies 90°<θ<180°, and in one example, the tilt angle θ is θ=135°. Alternatively, the tilt angle θ satisfies 270°<θ<360°, and in one example, the tilt angle θ is θ=315°. When the tilt angle θ satisfies 90°<θ<180° or 270°<θ<360°, the straight line L extends from the second quadrant to the fourth quadrant of the coordinate plane defined by the s axis and the t axis. As such, the tilt angle θ is an angle other than 0°, 90°, 180°, and 270°. Here, the distance between the lattice point O(x, y) and the gravity center G is set as r(x, y). x represents a position of the x-th lattice point on the X axis, and y represents a position of the y-th lattice point on the Y axis. When the distance r(x, y) is a positive value, the gravity center G is located in the first quadrant (or the second quadrant). When the distance r(x, y) is a negative value, the gravity center G is located in the third quadrant (or the fourth quadrant). When the distance r(x, y) is 0, the lattice point O and the gravity center G are matched with each other.

The distance r(x, y) between the gravity center G of each modified refractive index region 15b and the corresponding lattice point O(x, y) of the unit constituent region R(x, y), which is shown in FIG. 25, is individually set for each modified refractive index region 15b in accordance with a target output beam pattern (optical image). The distribution of the distance r(x, y) has a specific value for each position determined by the values of x (in the example of FIG. 25, x1 to x4) and y (in the example of FIG. 25, y1 to y3), but is not necessarily represented by a specific function. The distribution of the distance r(x, y) is determined from extraction of the phase distribution in the complex amplitude distribution obtained by performing the inverse Fourier transform on the target output beam pattern. That is, when the phase P(x, y) in the unit constituent region R(x, y) shown in FIG. 26 is $P_0$, the distance r(x, y) is set to 0, when the phase P(x, y) is $\pi+P_0$, the distance r(x, y) is set to a maximum value $R_0$, and when the phase P(x, y) is $-\pi+P_0$, the distance r(x, y) is set to a minimum value $-R_0$. For an intermediate phase P(x, y), the distance r(x, y) is set to satisfy $r(x, y)=\{P(x, y)-P_0\}\times R_0/\pi$.

Here, an initial phase $P_0$ can be set arbitrarily. If the lattice interval of the square lattice is set as a, the maximum value $R_0$ of r(x, y) is, for example, in a range of the following formula (10).

$$0 \le R_0 \le \frac{a}{\sqrt{2}} \quad (10)$$

When the complex amplitude distribution is calculated from the target output beam pattern, an iterative algorithm such as a Gerchberg-Saxton (GS) method generally used at the time of calculation of hologram generation is applied, so that reproducibility of the beam pattern is improved.

A relation between the optical image obtained as the output beam pattern and the phase distribution P(x, y) in the phase modulation layer 15A is the same as that in the case of the rotation method described above (FIG. 6). Therefore, under a first precondition defining the square lattice, a second precondition defined by the formulas (1) to (3), a third precondition defined by the formulas (4) and (5), and a fourth precondition defined by the above formulas (6) and (7), the phase modulation layer 15A is configured to satisfy the following conditions. That is, the modified refractive index region 15b is disposed in the unit constituent region R(x, y) so that the distance r(x, y) from the lattice point O(x, y) to the gravity center G of the corresponding modified refractive index region 15b satisfies a relation of $$r(x,y)=C \times (P(x,y)-P_0)$$

C: proportional constant, for example, $R_0/\pi$ $P_0$: arbitrary constant, for example, 0. That is, when the phase P(x, y) in the unit constituent region R(x, y) is $P_0$, the distance r(x, y) is set to 0, when the phase P(x, y) is $\pi+P_0$, the distance r(x, y) is set to the maximum value $R_0$, and when the phase P(x, y) is $-\pi+P_0$, the distance r(x, y) is set to the minimum value $-R_0$. When it is desired to obtain the target output beam pattern, the inverse Fourier transform may be performed on the output beam pattern, and the distribution of the distance r(x, y) according to the phase P(x, y) of the complex amplitude may be given to the plurality of modified refractive index regions 15b. The phase P(x, y) and the distance r(x, y) may be proportional to each other.

A far-field image after performing the Fourier transformation on the laser beam can take various shapes such as single or multiple spot shapes, annular shapes, linear shapes, character shapes, double annular shapes, or Laguerre-Gaussian beam shapes. Since the output beam pattern is represented by angle information in a far field, in the case of a bitmap image or the like in which the target output beam pattern is represented by two-dimensional position information, the inverse Fourier transform may be performed on the output beam pattern after the output beam pattern is temporarily converted into the angle information and is converted into a wave number space.

As a method for obtaining the intensity distribution and the phase distribution from the complex amplitude distribution obtained by the inverse Fourier transform, for example, the intensity distribution A(x, y) can be calculated by using an abs function of numerical analysis software "MATLAB" provided by MathWorks, and the phase distribution P(x, y) can be calculated by using an angle function of MATLAB.

Figure 27A:
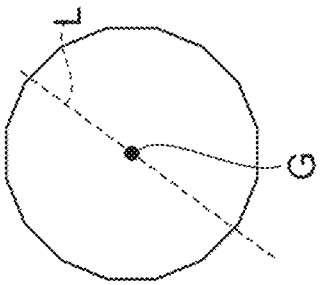
FIGS. 27A to 27G are diagrams showing an example (on-axis shift method) of the planar shape of the modified refractive index region.
Figure 27B:
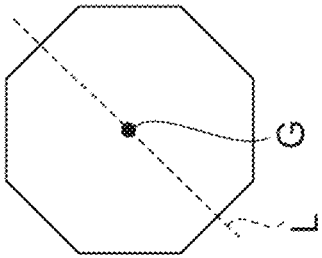
Figure 27C:
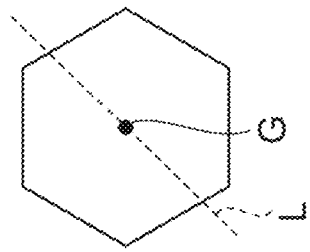
Figure 27D:
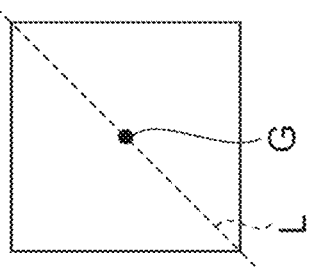
Figure 27E:
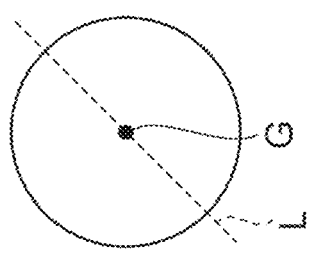
Figure 27F:
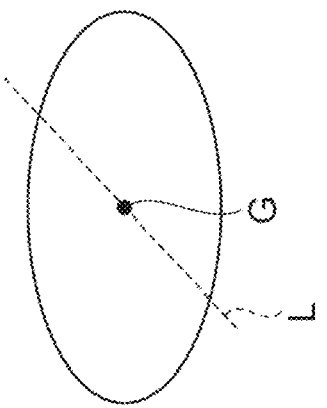
Figure 27G:
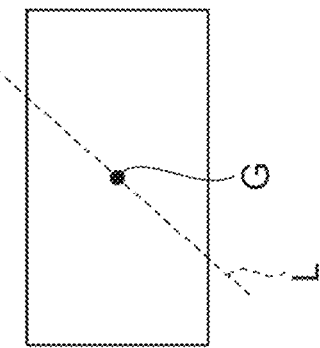

FIGS. 27A to 27G and FIGS. 28A to 28K are diagrams showing various examples (on-axis shift method) of the planar shape of the modified refractive index region. In the above-described example, the shape of the modified refractive index region 15b on the X-Y plane is a circular shape. However, the modified refractive index region 15b may have a shape other than the circular shape. For example, the shape of the modified refractive index region 15b may have mirror-image symmetry (line symmetry). Here, the mirror-image symmetry (line symmetry) means that the planar shape of the modified refractive index region 15b located on one side of a straight line along the X-Y plane and the planar shape of the modified refractive index region 15b located on the other side of the straight line can be mirror-image symmetric (line symmetric) with each other. Examples of a shape having the mirror-image symmetry (line symmetry) include a perfect circle shown in FIG. 27A, a square shown in FIG. 27B, a regular hexagon shown in FIG. 27C, a regular octagon shown in FIG. 27D, a regular hexadecagon shown in FIG. 27E, a rectangle shown in FIG. 27F, an ellipse shown in FIG. 27G, and the like. As described above, when the shape of the modified refractive index region 15b on the X-Y plane has the mirror-image symmetry (line symmetry), each of the unit constituent regions R of the virtual square lattice of the phase modulation layer 15A has a simple shape. As a result, it is possible to determine the direction and the position of the gravity center G of the corresponding modified refractive index region 15b from the lattice point O with high accuracy. That is, patterning with high accuracy is possible.

Further, the shape of the modified refractive index region 15b on the X-Y plane may be a shape having no rotation symmetry of 180°. Examples of the shape include a regular triangle shown in FIG. 28A, an isosceles right triangle shown in FIG. 28B, a shape shown in FIG. 28C in which two circles or ellipses partially overlap, an oval shape shown in FIG. 28D, a teardrop shape shown in FIG. 28E, an isosceles triangle shown in FIG. 28F, an arrow shape shown in FIG. 28G, a trapezoid shown in FIG. 28H, a pentagon shown in FIG. 28I, a shape shown in FIG. 28J in which two rectangles partially overlap, a shape shown in FIG. 28K in which two rectangles partially overlap and do not have mirror-image symmetry, and the like. The oval shape is a shape deformed so that a dimension in a minor-axis direction near one end along a major axis of an ellipse becomes smaller than a dimension in the minor-axis direction near the other end. The teardrop shape is a shape in which one end along the major axis of the ellipse is deformed into a sharp end protruding along a major-axis direction. Further, the arrow shape is a shape in which one side of a rectangle is recessed in a triangular shape and the opposite side is pointed in a triangular shape. As described above, since the shape of the modified refractive index region 15b on the X-Y plane does not have the rotation symmetry of 180°, a stronger light output can be obtained. The modified refractive index region 15b may be composed of a plurality of elements as shown in FIGS. 28J and 28K. In this case, the gravity center G of the modified refractive index region 15b is a combined gravity center of a plurality of components.

Figure 30:
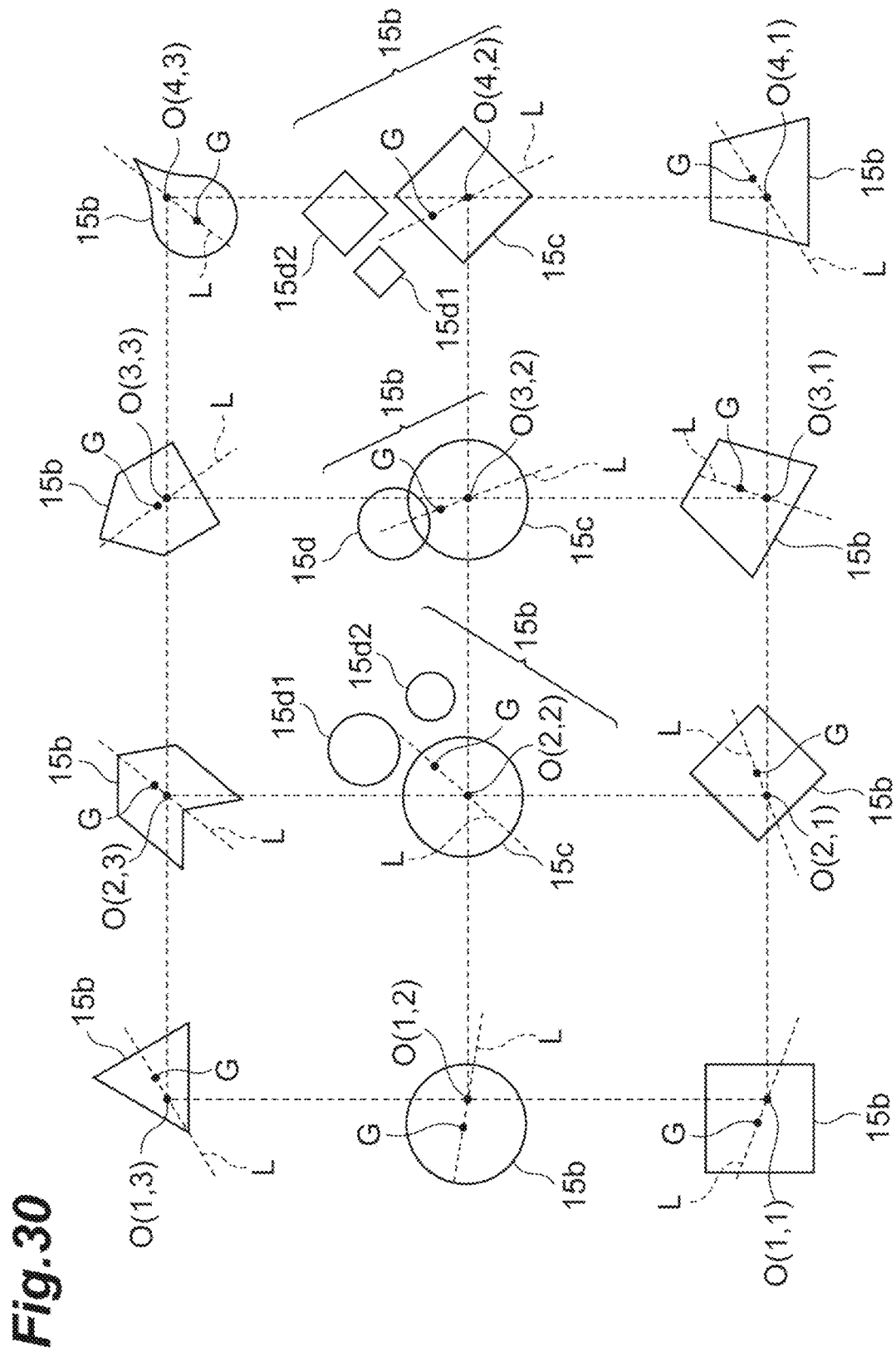
FIG. 30 is a diagram showing an application example (on-axis shift method) of the planar shape of the modified refractive index region.

FIGS. 29A to 29K are diagrams showing still another example (on-axis shift method) of the planar shape of the modified refractive index region. Further, FIG. 30 is a diagram showing the second modification of the phase modulation layer of FIG. 25.

In the examples shown in FIGS. 29A to 29K and 30, each modified refractive index region 15b includes a plurality of components 15c and 15d (each having a modified refractive index region). The gravity center G is the combined gravity center of all the components and is located on the straight line L. Both the components 15c and 15d have a refractive index different from the refractive index of the basic layer 15a. Both the components 15c and 15d may be holes, or may be configured by embedding a compound semiconductor in the holes. In each unit constituent region R, the component 15c is provided in a one-to-one correspondence relation with the component 15d. The total gravity center G of the components 15c and 15d is located on the straight line L that crosses the lattice point O of the unit constituent region R that configures the virtual square lattice. Each of the components 15c and 15d is included in the range of the unit constituent region R that configures the virtual square lattice. The unit constituent region R is a region surrounded by a straight line that bisects the lattice points of the virtual square lattice.

The planar shape of the component 15c is, for example, a circular shape. However, the component 15c can have various shapes as in various examples shown in FIGS. 27A to 27G and FIGS. 28A to 28K. FIGS. 29A to 29K show examples of shapes and relative relations of the components 15c and 15d on the X-Y plane. FIGS. 29A and 29B show a form in which both the components 15c and 15d have figures of the same shapes. FIGS. 29C and 29D show a form in which both the components 15c and 15d have figures of the same shapes and partially overlap. FIG. 29E shows a form in which both the components 15c and 15d have figures of the same shapes and the distance between the gravity centers of the components 15c and 15d is arbitrarily set for each lattice point. FIG. 29F shows a form in which both the components 15c and 15d have figures of different shapes. FIG. 29G shows a form in which both the components 15c and 15d have figures of different shapes and the distance between the gravity centers of the components 15c and 15d is arbitrarily set for each lattice point.

Further, as shown in FIGS. 29H to 29K, the component 15d constituting a part of the modified refractive index region 15b may include two regions 15d1 and 15d2 that are separated from each other. Further, the distance between the total gravity center of the regions 15d1 and 15d2 (corresponding to the gravity center of the single component 15d) and the gravity center of the component 15c may be arbitrarily set for each lattice point. In this case, as shown in FIG. 29H, the regions 15d1 and 15d2 and the component 15c may have figures of the same shapes. Alternatively, as shown in FIG. 29I, the two figures of the regions 15d1 and 15d2 and the component 15c may be different from the other. Further, as shown in FIG. 29J, in addition to the angle with respect to the s axis of the straight line connecting the regions 15d1 and 15d2, the angle with respect to the s axis of the component 15c may be arbitrarily set for each unit constituent region R. Further, as shown in FIG. 29K, while the regions 15d1 and 15d2 and the component 15c maintain the same relative angles, the angle with respect to the s axis of the straight line connecting the regions 15d1 and 15d2 may be arbitrarily set for each unit constituent region R.

The planar shape of the modified refractive index region 15b may be the same between the unit constituent regions R. That is, the modified refractive index regions 15b may have the same figures in all unit constituent regions R, and may be superimposed on each other between the lattice points by the translation operation or the translation operation and the rotation operation. In that case, generation of noise light and zero-order light becoming noise in the output beam pattern can be suppressed. Alternatively, the planar shape of the modified refractive index region 15b may not necessarily be the same between the unit constituent regions R. For example, as shown in FIG. 30, the shapes may be different between adjacent unit constituent regions R. In all cases of FIGS. 27A to 27G, FIGS. 28A to 28K, FIGS. 29A to 29K, and FIG. 30, the center of the straight line L passing through each lattice point O is preferably set so as to be matched with the lattice point O.

As described above, even in the configuration of the phase modulation layer in which the arrangement pattern of the modified refractive index regions is determined by the on-axis shift method, the same effects as those of the embodiment where the phase modulation layer in which the arrangement pattern of the modified refractive index regions is determined by the rotation method is applied can be suitably achieved.

Third Modification

Figure 31A:
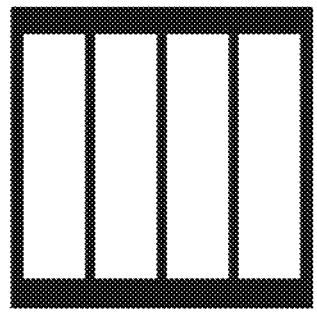
FIGS. 31A to 31F are diagrams each showing another example of a planar shape of an electrode.
Figure 31B:
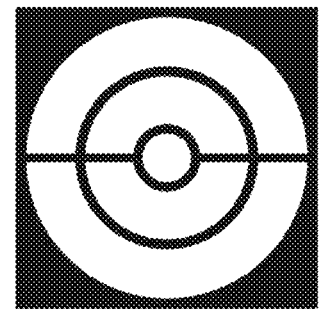
Figure 31C:
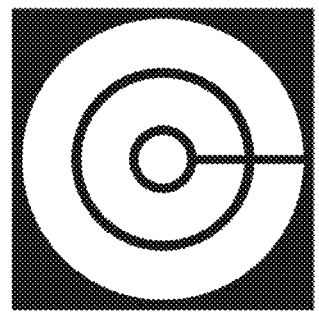

FIGS. 31A to 31F and FIGS. 32A to 32G are diagrams showing other examples of the planar shape of the electrode 16. FIG. 31A shows a stripe shape in which a plurality of linear electrode portions extending in the X-axis direction (or the Y-axis direction) are disposed in the Y-axis direction (or the X-axis direction). These electrode portions are connected to each other through another pair of electrode portions extending in the Y-axis direction (or the X-axis direction) at both ends. FIGS. 31B and 31C show a shape in which a plurality of annular electrode portions having different diameters are disposed as concentric circles (so as to have a common center). The plurality of electrode portions are connected to each other by linear electrode portions extending in a radial direction. A plurality of linear electrode portions may be provided as shown in FIG. 31B, or only one linear electrode portion may be provided as shown in FIG. 31C.

Figure 31D:
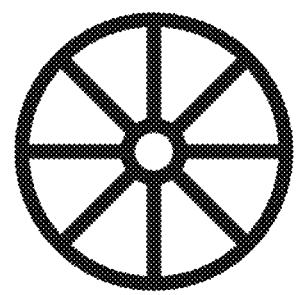
Figure 31E:
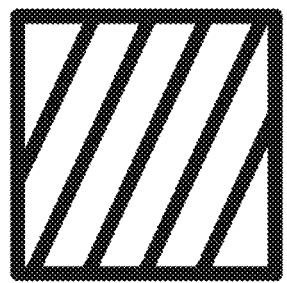
Figure 31F:
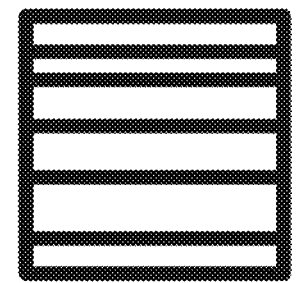

FIG. 31D shows a shape in which a plurality of linear electrode portions expand radially from a center point. These electrode portions are connected to each other through a pair of annular electrode portions with the center point as the center, at both ends. FIG. 31E shows the case where the plurality of linear electrode portions in FIG. 31A are tilted with respect to the X-axis direction (or the Y-axis direction). FIG. 31F shows the case where an interval between the plurality of linear electrode portions in FIG. 31A is not constant (non-periodic).

Figure 32A:
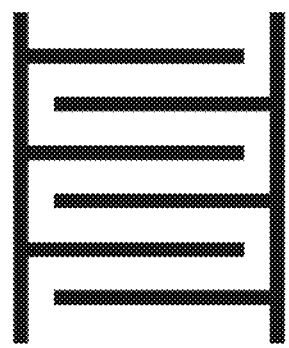
FIGS. 32A to 32G are diagrams each showing still another example of the planar shape of the electrode.
Figure 32B:

FIG. 32A shows a shape in which a plurality of linear electrode portions extending in the X-axis direction (or the Y-axis direction) are disposed in the Y-axis direction (or the X-axis direction), and two comb-like electrodes connected to each other through another electrode portion of which one end extends in the Y-axis direction (or the X-axis direction) face each other. A plurality of linear electrode portions of one comb-like electrode and a plurality of linear electrode portions of the other comb-like electrode are alternately disposed along the Y-axis direction (or the X-axis direction). FIG. 32B shows a shape including only one comb-like electrode shown in FIG. 32A.

Figure 32C:
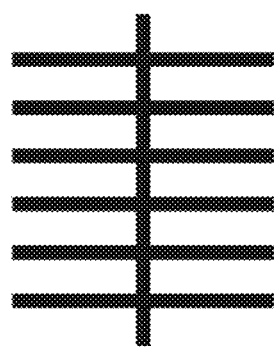
Figure 32D:
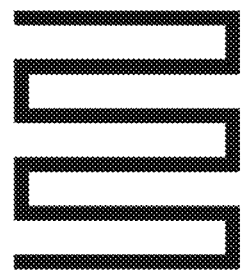
Figure 32E:
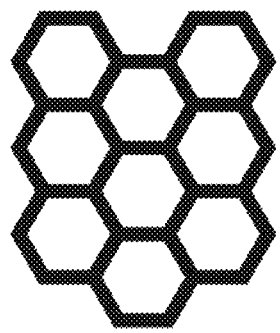
Figure 32F:
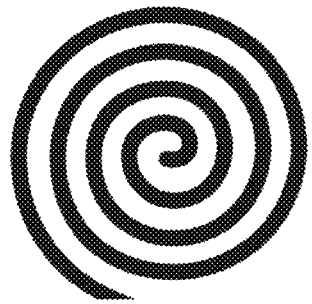
Figure 32G:
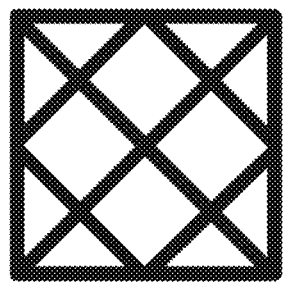

FIG. 32C shows a fishbone shape in which a plurality of linear electrode portions extending in the X-axis direction (or the Y-axis direction) are disposed in the Y-axis direction (or the X-axis direction), and center portions thereof are connected to each other through another electrode portion extending in the Y-axis direction (or the X-axis direction). FIG. 32D shows a square wave shape in which a plurality of linear electrode portions extending in the X-axis direction (or the Y-axis direction) are alternately connected at one end and the other end. FIG. 32E shows a honeycomb shape in which a plurality of hexagonal unit structures are two-dimensionally disposed. FIG. 32F shows a spiral shape. FIG. 32G shows an oblique mesh shape in which a square lattice frame is tilted with respect to the X-axis direction and the Y-axis direction.

Figure 33A:
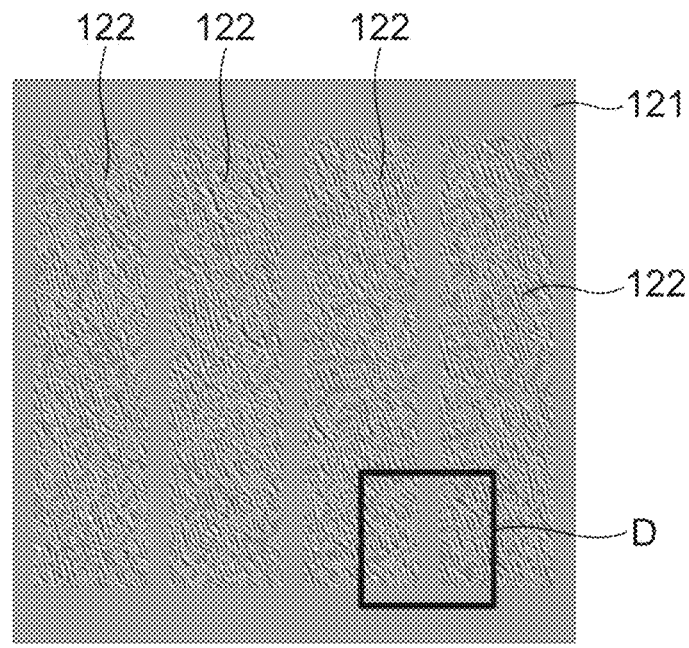
FIGS. 33A and 33B are diagrams showing a rotation angle distribution (that is, a phase distribution) in the entire phase modulation layer when the electrode has a stripe shape.
Figure 33B:
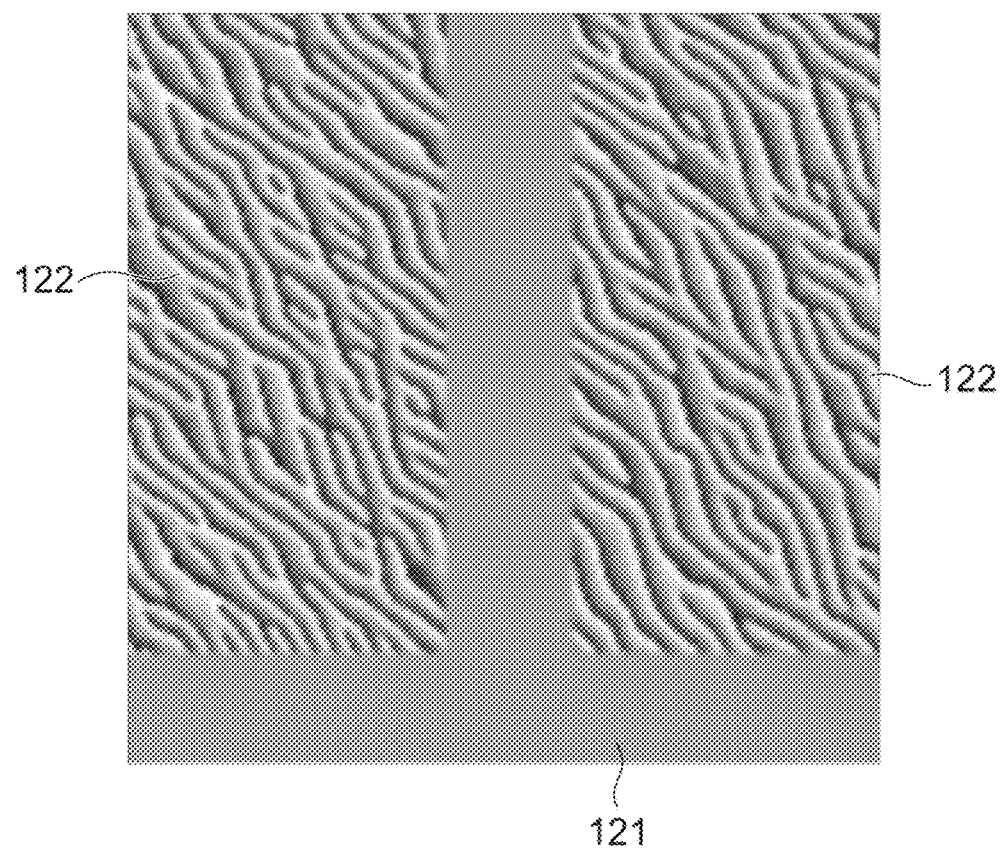
Figure 34A:
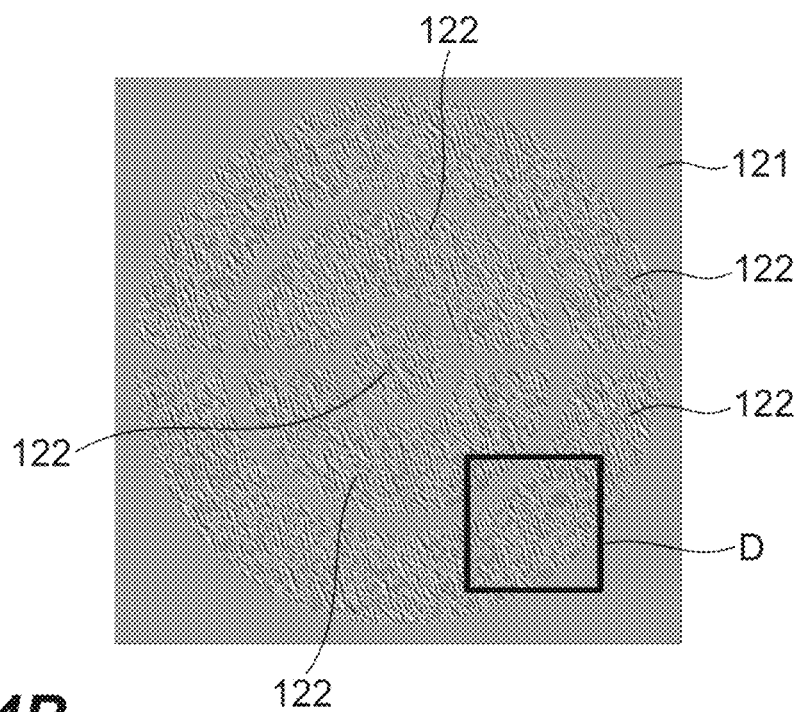
FIGS. 34A and 34B are diagrams showing a rotation angle distribution (that is, a phase distribution) in the entire phase modulation layer when the electrode has a concentric shape.
Figure 34B:
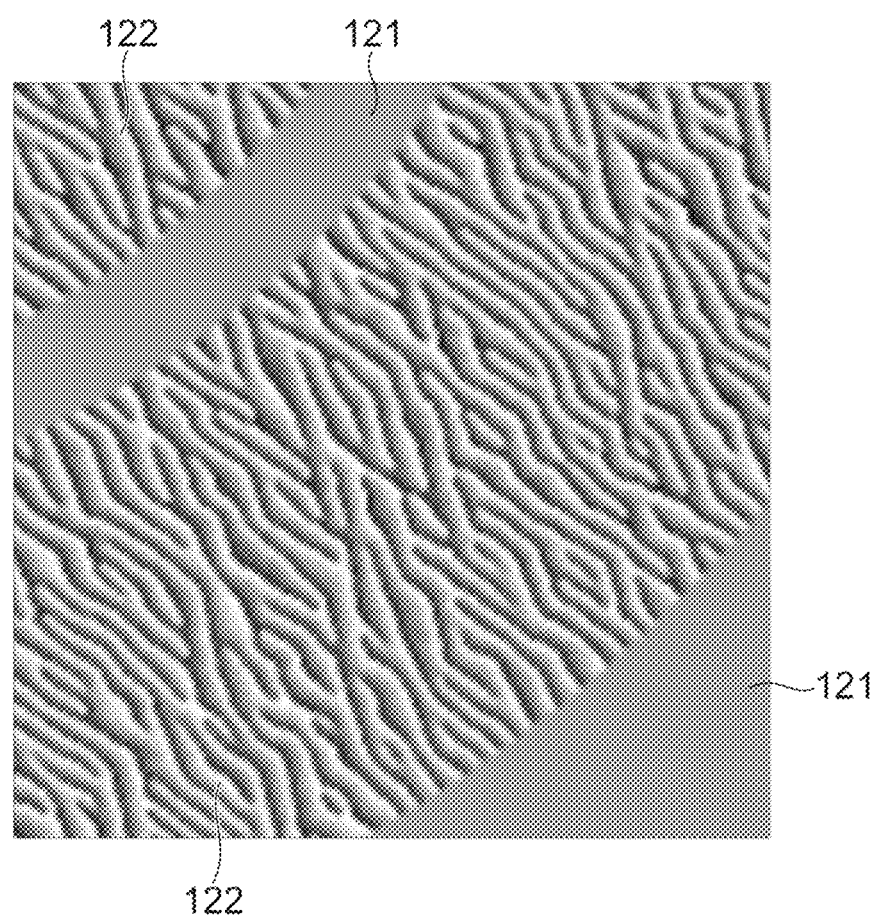

When various planar structures are adopted for the electrode 16 described above, the planar shape of the second region on the X-Y plane becomes a shape including continuous first and second portions disposed so as to sandwich a part of the first region (region overlapping the electrode 16), or a shape including a plurality of portions separated by the first region FIG. 33A is a diagram showing a distribution of a rotation angle φ (that is, a phase distribution) in the entire phase modulation layer 15A when the electrode 16 has a stripe shape shown in FIG. 32A. FIG. 33B is an enlarged view of a part D of FIG. 33A. FIG. 34A is a diagram showing a distribution of a rotation angle φ in the entire phase modulation layer 15A when the electrode 16 has a concentric shape shown in FIG. 32B. FIG. 34B is an enlarged view of a part D of FIG. 34A. In FIGS. 33A and 33B and FIGS. 34A and 34B, the magnitude of the rotation angle φ is shown by color shading.

The planar shape of the electrode 16 is not limited to the square lattice shape as in the first embodiment described above. For example, the various shapes shown in the present modification can be applied. Each of the planar shapes shown in the present modification includes a portion located on the vicinity of the center portion of the active layer 12, and can efficiently distribute the current in the center portion of the active layer 12. Further, in the case of the stripe shape shown in FIG. 31A, 31E, or 31F, even if the position shift between the electrode 16 and the phase modulation layer 15A in the direction along the longitudinal direction of the linear electrode portion increases, the overlap between the electrode 16 and the second region 152 can be suppressed. That is, it is possible to provide a margin for position accuracy of the electrode 16. Further, as for the current supply to the center portion of the active layer 12, since the same effect as that of the lattice shape can be achieved with a coverage smaller than that of the lattice shape (in other words, an aperture ratio larger than that of the lattice shape), the light extraction efficiency can be increased, and the resolution of the optical image can be increased. The same is applicable to the comb-like electrode shown in FIG. 32A or 32B or the fishbone shape shown in FIG. 32C. Further, in the case of the concentric shape shown in FIGS. 31B and 31C, window function noise can be reduced. Here, the window function noise is a diffraction pattern generated when the openings are periodically arranged. The diffraction pattern is generated along the periodic structure when the periodic structure is arranged one-dimensionally or two-dimensionally. On the other hand, when the periodic structure is arranged in a concentric shape, the diffraction pattern is dispersed in all directions perpendicular to the circumference, so that a peak value of the window function noise can be reduced.

Second Embodiment

Figure 35:
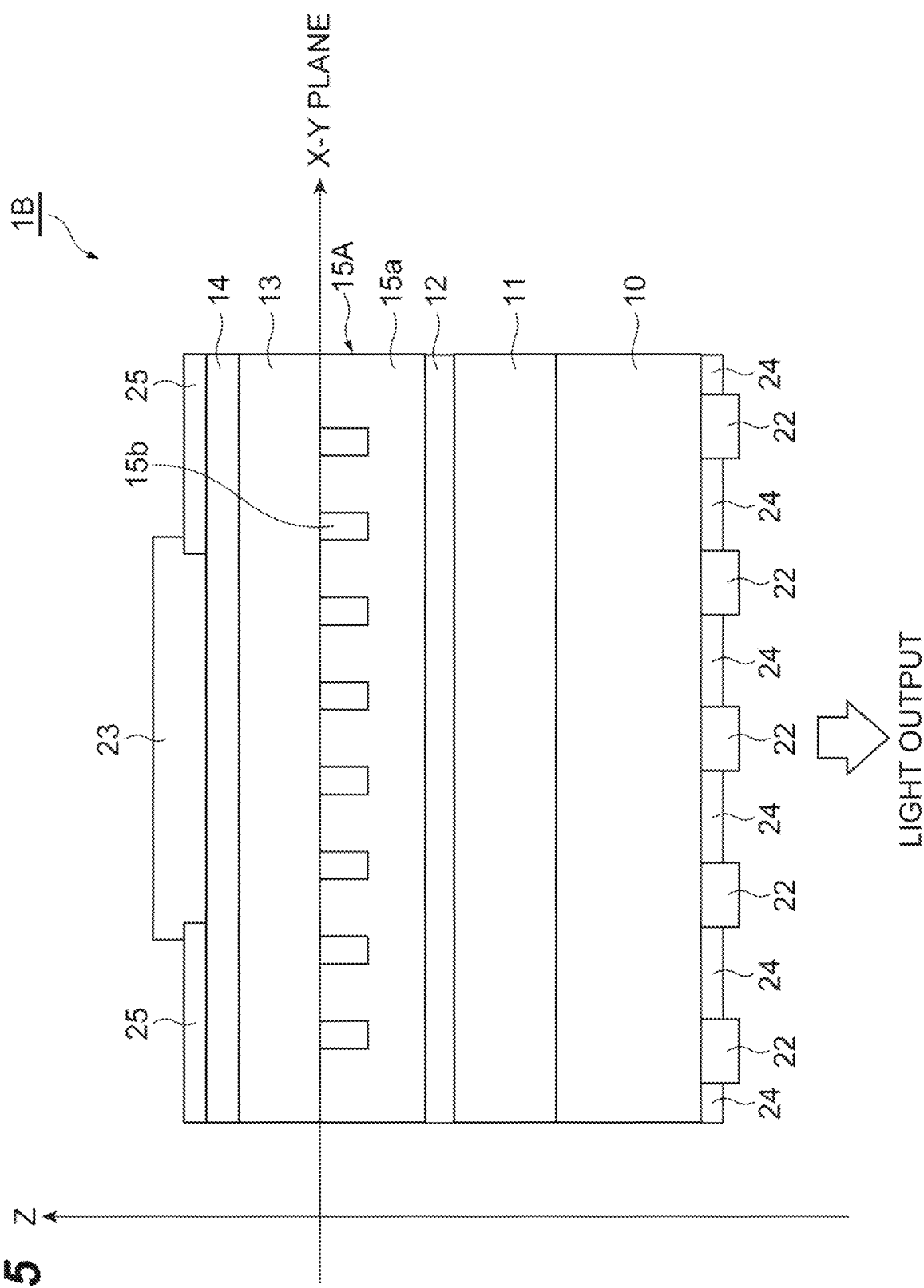
FIG. 35 is a diagram showing a configuration of a laser element as a semiconductor light-emitting element according to a second embodiment.

FIG. 35 is a diagram showing a configuration of a laser element 1B as a semiconductor light-emitting element according to a second embodiment. The laser element 1B is a laser light source that forms a standing wave along an X-Y plane and outputs a phase-controlled plane wave along a Z-axis direction. Similarly to the first embodiment, the laser element 1B outputs a two-dimensional optical image with an arbitrary shape including a direction perpendicular to a main surface 10a of a semiconductor substrate 10 (a normal direction of the main surface 10a) and a direction tilted with respect to the direction. However, although the laser element 1A according to the first embodiment outputs an optical image from a surface located on the side of an upper cladding layer 13 with respect to an active layer 12, the laser element 1B outputs the optical image transmitted through the semiconductor substrate 10 from a back surface.

The laser element 1B includes a lower cladding layer 11, an active layer 12, an upper cladding layer 13, a contact layer 14, and a phase modulation layer 15A. The lower cladding layer 11 is provided on the semiconductor substrate 10. The active layer 12 is provided on the lower cladding layer 11. The upper cladding layer 13 is provided on the active layer 12. The contact layer 14 is provided on the upper cladding layer 13. The phase modulation layer 15A is provided between the active layer 12 and the upper cladding layer 13. A configuration (a preferable material, a band gap, a refractive index, and the like) of each of the layers 11 to 14 and 15A is the same as that of the first embodiment.

Figure 36:
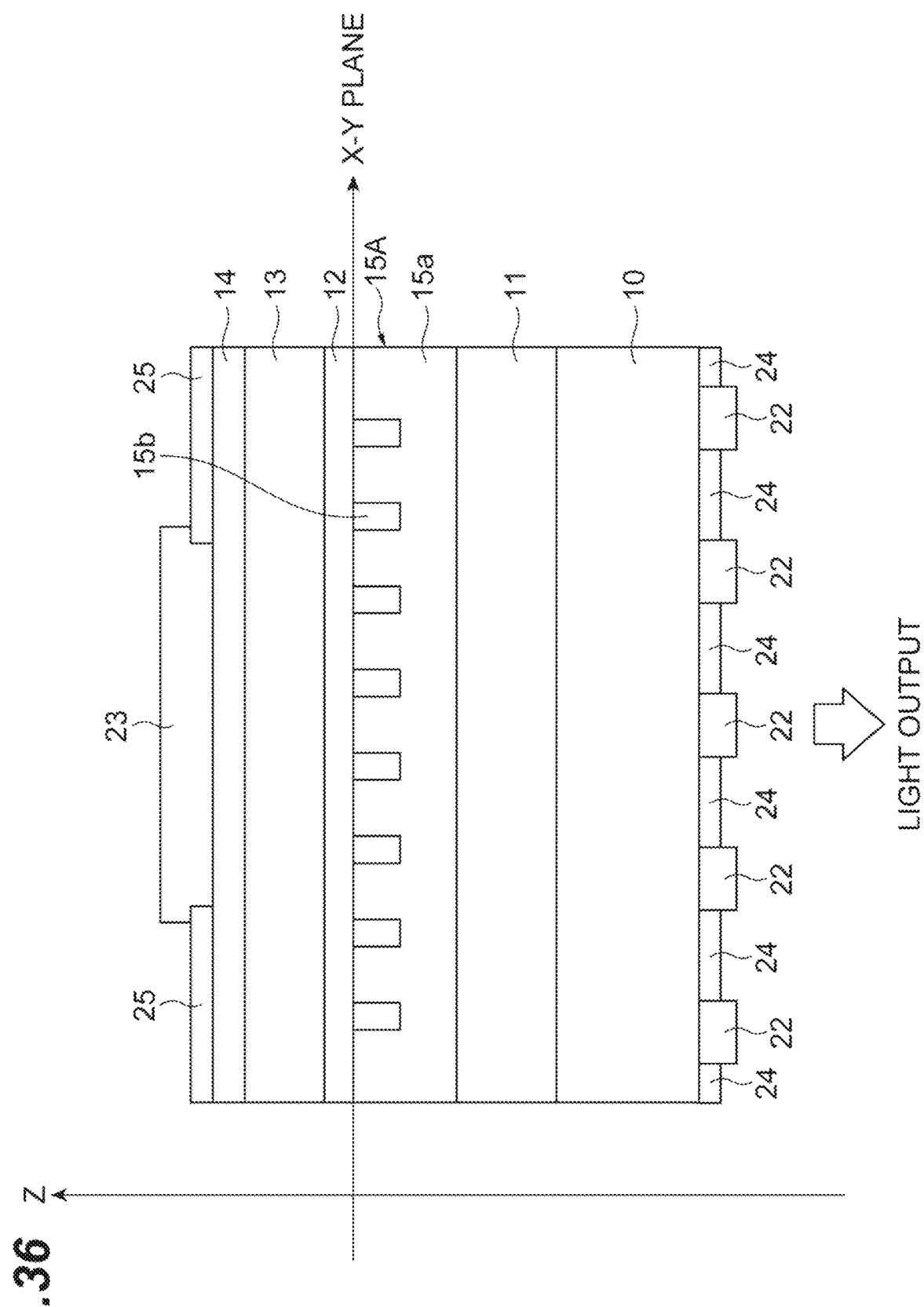
FIG. 36 is a diagram showing an example of a structure in which a phase modulation layer is provided between a lower cladding layer and an active layer.

The structure of the phase modulation layer 15A is the same as the structure of the phase modulation layer 15A described in the first embodiment or each modification. If necessary, a light guide layer may be provided between the active layer 12 and the upper cladding layer 13 and/or between the active layer 12 and the lower cladding layer 11. As shown in FIG. 36, the phase modulation layer 15A may be provided between the lower cladding layer 11 and the active layer 12.

The laser element 1B includes an electrode 23 provided on the contact layer 14 and an electrode 22 provided on a back surface 10b of the semiconductor substrate 10, instead of electrodes 16 and 17 according to the first embodiment. The electrode 23 is in ohmic contact with the contact layer 14, and the electrode 22 is in ohmic contact with the semiconductor substrate 10. The electrode 22 has the same planar shape (refer to FIG. 2, FIGS. 31A to 31F, and FIGS. 32A to 32G as that of the electrode 16 according to the first embodiment or the second modification. The contact layer 14 is provided on an entire surface of the upper cladding layer 13. The electrode 23 is provided in a region on the contact layer 14 including the vicinity of the center of the laser element 1B.

The back surface 10b of the semiconductor substrate 10 exposed from an opening of the electrode 22 is covered with an antireflection film 24. Further, a portion other than the electrode 23 on the contact layer 14 is covered with a protective film 25. A material of the antireflection film 24 is the same as that of an antireflection film 18 according to the first embodiment. A material of the protective film 25 is the same as that of a protective film 19 according to the first embodiment.

In the laser element 1B according to the present embodiment described above, the structure of the phase modulation layer 15A and the shape of the electrode 22 are the same as the structure and the shape described in the first embodiment or each modification. Therefore, according to the laser element 1B, it is possible to suppress deterioration in the quality of the optical image caused by a part of light outputted from the phase modulation layer 15A being blocked by the electrode 22.

The semiconductor light-emitting element according to the present invention is not limited to the above-described embodiments, and various other modifications can be made. For example, in the above embodiments and examples, the laser elements made of GaAs-based, InP-based, and nitride-based (particularly, GaN-based) compound semiconductors are exemplified. However, the present invention is applicable to semiconductor light-emitting elements made of various other semiconductor materials.

Further, the semiconductor light-emitting element according to the present invention has a degree of freedom in the material system, the film thickness, and the layer configuration. Here, the scaling law is applied to a so-called square lattice photonic crystal laser in which the perturbation of the modified refractive index region from the virtual square lattice is zero. That is, when the wavelength is multiplied by a constant a, the same standing wave state can be obtained by multiplying the entire square lattice structure by a. Similarly, in the present invention, the structure of the phase modulation layer can be determined by the scaling law even at the wavelengths other than those disclosed in the examples. Therefore, it is possible to realize a semiconductor light-emitting element that outputs visible light by applying the scaling rule according to the wavelengths, using the active layer emitting blue, green, and red light.

Figure 37:
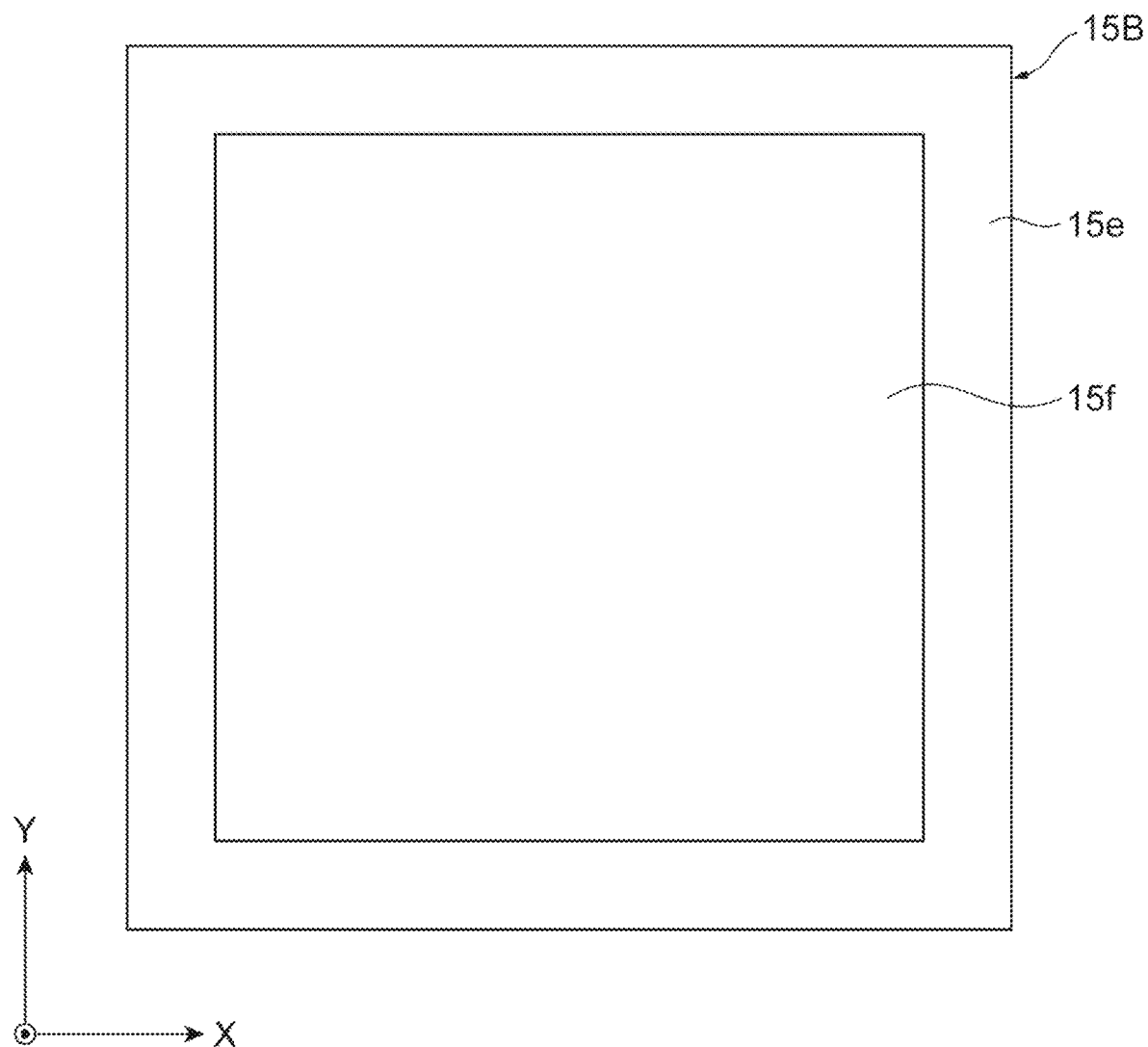
FIG. 37 is a diagram showing a modification of the phase modulation layer.

FIG. 37 is a diagram showing a modification of the phase modulation layer, and shows a form viewed from a layer thickness direction. A phase modulation layer 15B according to the present modification has a region 15e in which a modified refractive index region is provided on each lattice point of a square lattice, at an outer circumferential portion of a region 15f having the same configuration as that of the phase modulation layer 15A shown in FIG. 3. A shape and a size of the modified refractive index region of the region 15e are the same as those of the modified refractive index region 15b of the phase modulation layer 15A. Further, a lattice constant of the square lattice of the region 15e is equal to the lattice constant of the square lattice of the phase modulation layer 15A. As described above, the region 15f is surrounded with the region 15e in which the modified refractive index region is provided on each lattice point of the square lattice, so that light leakage in an in-plane direction can be suppressed, and a reduction in the threshold current can be expected.

REFERENCE SIGNS LIST 1A, 1B . . . laser element; 10 . . . semiconductor substrate; 10a . . . main surface; 10b . . . back surface; 11 . . . lower cladding layer, 12 . . . active layer; 13 . . . upper cladding layer, 14 . . . contact layer; 15A, 15B . . . phase modulation layer, 15a . . . basic layer, 15b, 15c, 15d . . . modified refractive index region; 16, 17, 22, 23 . . . electrode; 16a . . . opening; 18, 24 . . . antireflection film; 19, 25 . . . protective film; 151, 153 . . . first region; 152, 154 . . . second region; G . . . gravity center, O . . . lattice point; Q . . . center; and R . . . unit constituent region.

The invention claimed is:

1. A semiconductor light-emitting element including a semiconductor substrate and outputting an optical image in a direction tilted with respect to a normal direction of a main surface, the semiconductor substrate having the main surface and a back surface facing the main surface, the semiconductor light-emitting element comprising:
an active layer provided on the main surface of the semiconductor substrate;
a cladding layer provided on the active layer;
a contact layer provided on the cladding layer;
a phase modulation layer provided between the semiconductor substrate and the active layer or between the active layer and the cladding layer, and
an electrode provided on the contact layer, wherein
the optical image is outputted to an outside of the semiconductor light-emitting element from a side where the contact layer is located with respect to the active layer,
the phase modulation layer has a basic layer having a predetermined refractive index and a plurality of modified refractive index regions having refractive indexes different from the refractive index of the basic layer,
the phase modulation layer includes a first region and a second region different from the first region, the first region having at least a portion overlapping the electrode when the phase modulation layer is viewed from the side of the electrode along the normal direction,
in a state where a virtual square lattice is set on a design surface of the phase modulation layer perpendicular to the normal direction, each of one or more modified refractive index regions in the second region, among the plurality of modified refractive index regions, is disposed in the second region so that a gravity center thereof is separated from a corresponding lattice point of the virtual square lattice by a predetermined distance and a vector from the corresponding lattice point toward the gravity center has a rotation angle according to the optical image around the corresponding lattice point,
the optical image is completed as a single beam pattern constituted by only a light component having passed through the electrode from the second region, and the second region includes one or more regions for completing the optical image as the single beam pattern, and
a planar shape of the second region on the design surface includes continuous first and second portions disposed so as to sandwich a part of the first region, or, a plurality of portions separated by the first region.

2. The semiconductor light-emitting element according to claim 1, wherein each of one or more modified refractive index regions in the first region, among the plurality of modified refractive index regions, is disposed in the first region so that a gravity center thereof is located on a corresponding lattice point of the virtual square lattice or is separated from the corresponding lattice point by a predetermined distance and a vector from the corresponding lattice point toward the gravity center has a rotation angle unrelated to formation of the optical image around the corresponding lattice point.

3. The semiconductor light-emitting element according to claim 1, wherein a planar shape of the electrode is any one of a lattice shape, a stripe shape, a concentric shape, a radial shape, and a comb shape.

4. The semiconductor light-emitting element according to claim 1, wherein a width of the first region defined along a reference direction perpendicular to the normal direction is larger than a width of the electrode defined along the reference direction.

5. A method for designing the phase modulation layer constituting a part of the semiconductor light-emitting element according to claim 1, comprising:
  setting a constraint condition defined by the gravity center of each of one or more modified refractive index regions in the first region among the plurality of modified refractive index regions being arranged on the corresponding lattice point of the virtual square lattice or a location separated from the lattice point by the predetermined distance and the vector from the corresponding lattice point toward the gravity center having a constant rotation angle around the corresponding lattice point;
  setting, as an initial condition, a complex amplitude distribution on a screen at infinity of the optical image to be outputted; and
  determining, under the constraint condition and the initial condition, a position of the gravity center of each of one or more modified refractive index regions in the second region, by repeating an inverse Fourier transform step and a Fourier transform step, the inverse Fourier transform step replacing information of a complex amplitude distribution obtained by inverse Fourier transform from the screen at infinity to the design surface with information of a complex amplitude distribution for Fourier transform from the design surface to the screen at infinity, the Fourier transform step replacing the information of the complex amplitude distribution obtained by the Fourier transform with information of the complex amplitude distribution for the inverse Fourier transform.

6. The method for designing the phase modulation layer according to claim 5, wherein at least one of an amplitude distribution and a phase distribution constituting the complex amplitude distribution on the screen at infinity is randomly set as the initial condition.

7. A semiconductor light-emitting element including a semiconductor substrate and outputting an optical image in a direction tilted with respect to a normal direction of a main surface, the semiconductor substrate having the main surface and a back surface facing the main surface, the semiconductor light-emitting element comprising:
  an active layer provided on the main surface of the semiconductor substrate;
  a cladding layer provided on the active layer,
  a contact layer provided on the cladding layer;
  a phase modulation layer provided between the semiconductor substrate and the active layer or between the active layer and the cladding layer; and
  an electrode provided on the back surface of the semiconductor substrate, wherein
  the optical image is outputted to an outside of the semiconductor light-emitting element from a side where the back surface of the semiconductor substrate is located with respect to the active layer,
  the phase modulation layer has a basic layer having a predetermined refractive index and a plurality of modified refractive index regions having refractive indexes different from the refractive index of the basic layer,
  the phase modulation layer includes a first region and a second region different from the first region, the first region having at least a portion overlapping the electrode when the phase modulation layer is viewed from the side of the electrode along the normal direction,
  in a state where a virtual square lattice is set on a design surface of the phase modulation layer perpendicular to the normal direction, each of one or more modified refractive index regions in the second region, among the plurality of modified refractive index regions, is disposed in the second region so that a gravity center thereof is separated from a corresponding lattice point of the virtual square lattice by a predetermined distance and a vector from the corresponding lattice point toward the gravity center has a rotation angle according to the optical image around the corresponding lattice point,
  the optical image is completed as a single beam pattern constituted by only a light component having passed through the electrode from the second region, and the second region includes one or more regions for completing the optical image as the single beam pattern, and
  a planar shape of the second region on the design surface includes continuous first and second portions disposed so as to sandwich a part of the first region, or, a plurality of portions separated by the first region.

8. The semiconductor light-emitting element according to claim 7, wherein each of one or more modified refractive index regions in the first region, among the plurality of modified refractive index regions, is disposed in the first region so that a gravity center thereof is located on a corresponding lattice point of the virtual square lattice or is separated from the corresponding lattice point by a predetermined distance and a vector from the corresponding lattice point toward the gravity center has a rotation angle unrelated to formation of the optical image around the corresponding lattice point.

9. The semiconductor light-emitting element according to claim 7, wherein a planar shape of the electrode is any one of a lattice shape, a stripe shape, a concentric shape, a radial shape, and a comb shape.

10. The semiconductor light-emitting element according to claim 7, wherein a width of the first region defined along a reference direction perpendicular to the normal direction is larger than a width of the electrode defined along the reference direction.

11. A method for designing the phase modulation layer constituting a part of the semiconductor light-emitting element according to claim 7, comprising:
  setting a constraint condition defined by the gravity center of each of one or more modified refractive index regions in the first region among the plurality of modified refractive index regions being arranged on the corresponding lattice point of the virtual square lattice or a location separated from the lattice point by the predetermined distance and the vector from the corresponding lattice point toward the gravity center having a constant rotation angle around the corresponding lattice point;

setting, as an initial condition, a complex amplitude distribution on a screen at infinity of the optical image to be outputted; and determining, under the constraint condition and the initial condition, a position of the gravity center of each of one or more modified refractive index regions in the second region, by repeating an inverse Fourier transform step and a Fourier transform step, the inverse Fourier transform step replacing information of a complex amplitude distribution obtained by inverse Fourier transform from the screen at infinity to the design surface with information of a complex amplitude distribution for Fourier transform from the design surface to the screen at infinity, the Fourier transform step replacing the information of the complex amplitude distribution obtained by the Fourier transform with information of the complex amplitude distribution for the inverse Fourier transform.

12. The method for designing the phase modulation layer according to claim 11, wherein at least one of an amplitude distribution and a phase distribution constituting the complex amplitude distribution on the screen at infinity is randomly set as the initial condition.

\* \* \* \* \*